(12) United States Patent
Hashimoto et al.

(10) Patent No.: US 8,274,826 B2
(45) Date of Patent: Sep. 25, 2012

(54) NAND TYPE FLASH MEMORY

(75) Inventors: Toshifumi Hashimoto, Yokohama (JP); Noboru Shibata, Kawasaki (JP); Toshiki Hisada, Yokohama (JP); Tsuneo Inaba, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 200 days.

(21) Appl. No.: 12/838,867

(22) Filed: Jul. 19, 2010

(65) Prior Publication Data

US 2011/0019477 A1 Jan. 27, 2011

(30) Foreign Application Priority Data

Jul. 22, 2009 (JP) ................................. 2009-171372
May 28, 2010 (JP) ................................. 2010-123222

(51) Int. Cl.
*G11C 16/04* (2006.01)
(52) U.S. Cl. .......... 365/185.11; 365/185.03; 365/185.25
(58) Field of Classification Search ............. 365/185.11, 365/185.03, 185.25
See application file for complete search history.

(56) References Cited

U.S. PATENT DOCUMENTS

| | | | | |
|---|---|---|---|---|
| 5,661,682 A | * | 8/1997 | Lim et al. ................. | 365/185.17 |
| 6,798,683 B2 | * | 9/2004 | Hosono et al. ................. | 365/63 |
| 7,313,009 B2 | * | 12/2007 | Futatsuyama .................... | 365/63 |
| 7,952,930 B2 | * | 5/2011 | Sakurai et al. ........... | 365/185.17 |
| 2010/0124140 A1 | | 5/2010 | Otsuka et al. | |

FOREIGN PATENT DOCUMENTS

| | | |
|---|---|---|
| JP | 2000-76880 | 3/2000 |
| JP | 2004-280867 | 10/2004 |

* cited by examiner

*Primary Examiner* — Anh Phung
*Assistant Examiner* — Hai Pham
(74) *Attorney, Agent, or Firm* — Oblon, Spivak, McClelland, Maier & Neustadt, L.L.P.

(57) ABSTRACT

According to one embodiment, a NAND type flash memory includes a first transfer transistor disposed between first and second memory planes, the first potential transfer terminal of the first transfer transistor being commonly connected to a first word line in the first NAND block and a second word line in the third NAND block, a second transfer transistor disposed at a first end of the first memory plane, the first potential transfer terminal of the second transfer transistor being connected to a third word line in the second NAND block, and a third transfer transistor disposed at a second end of the second memory plane, the first potential transfer terminal of the third transfer transistor being connected to a fourth word line in the fourth NAND block.

25 Claims, 48 Drawing Sheets

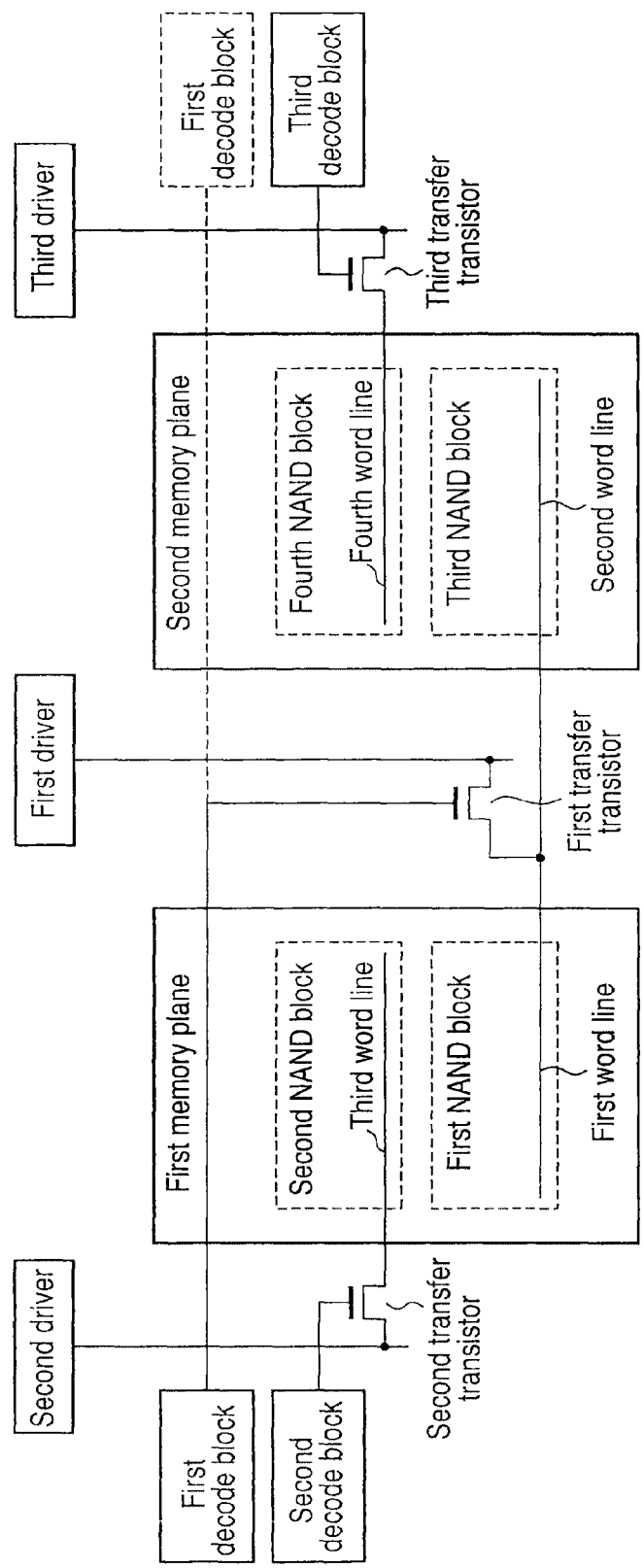
F I G. 1

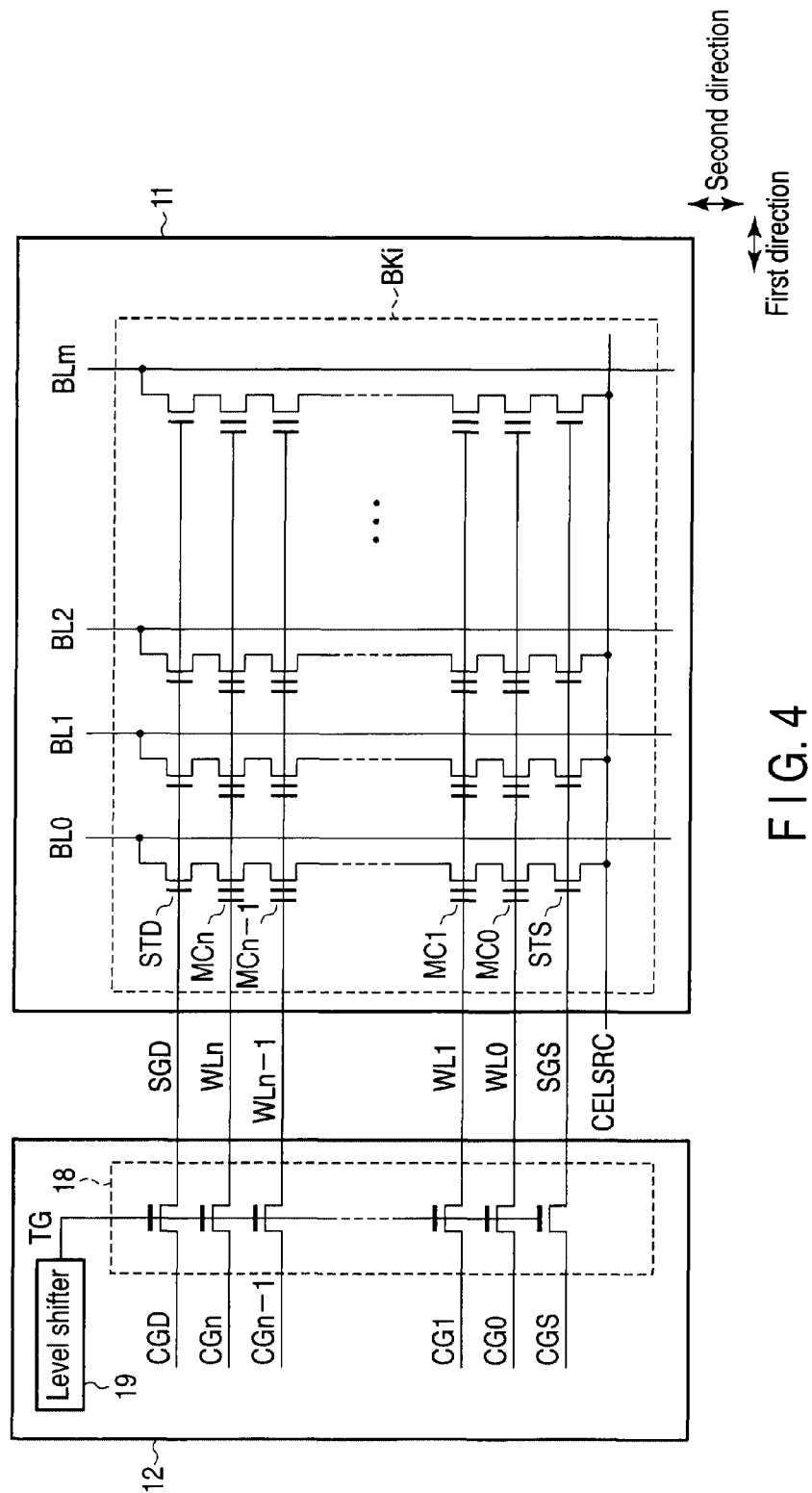
F I G. 4

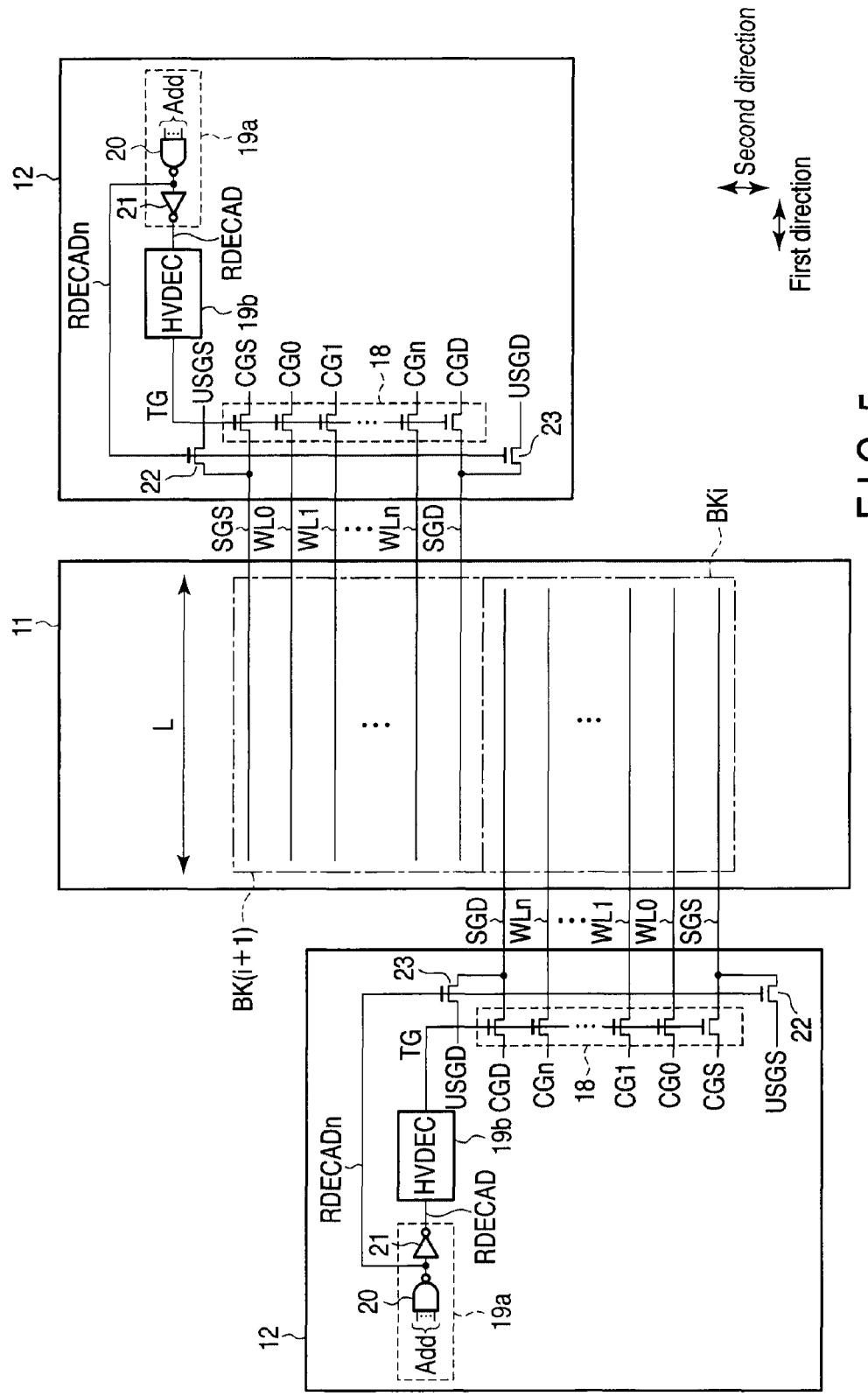
F I G. 5

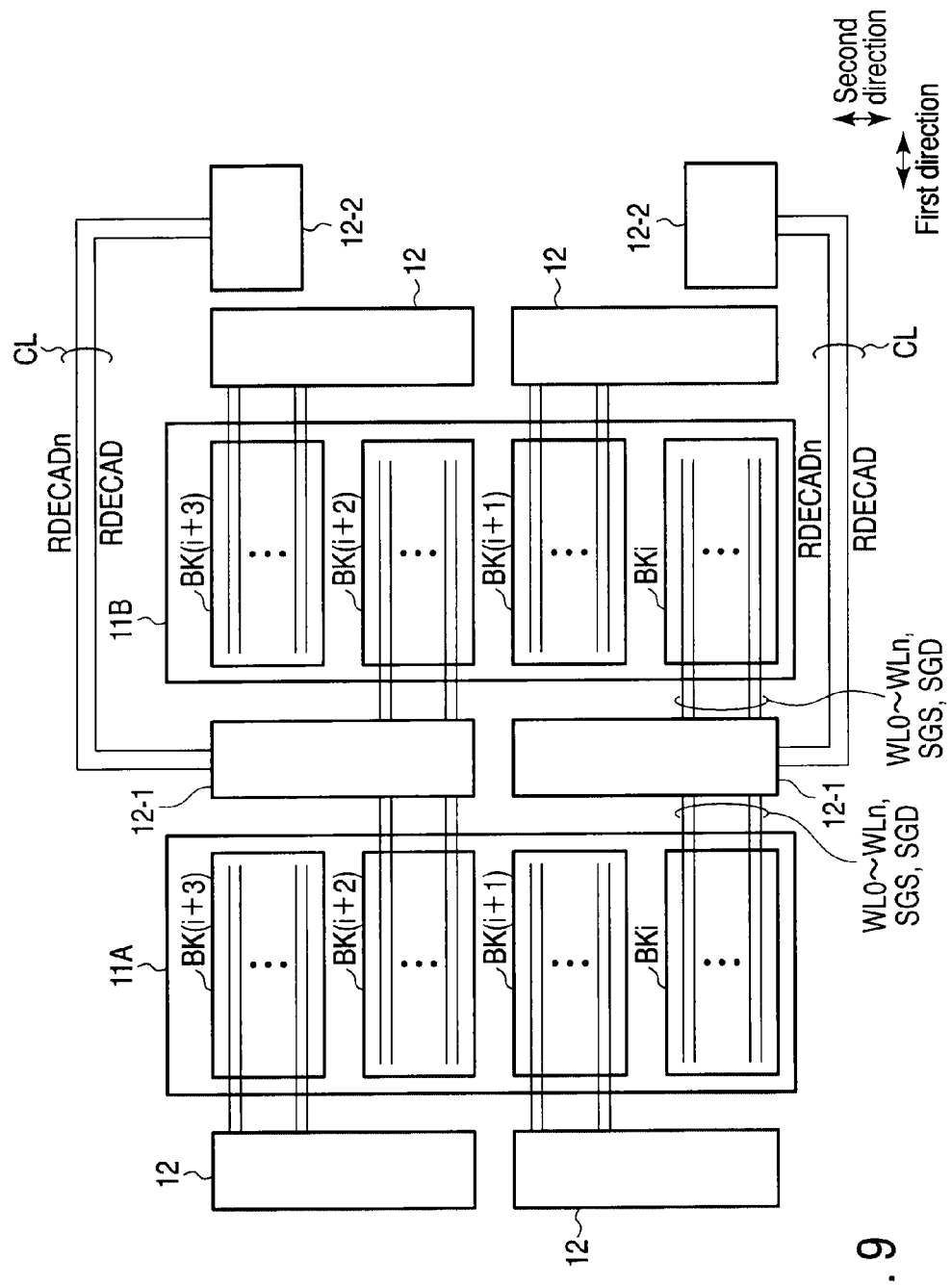
F I G. 9

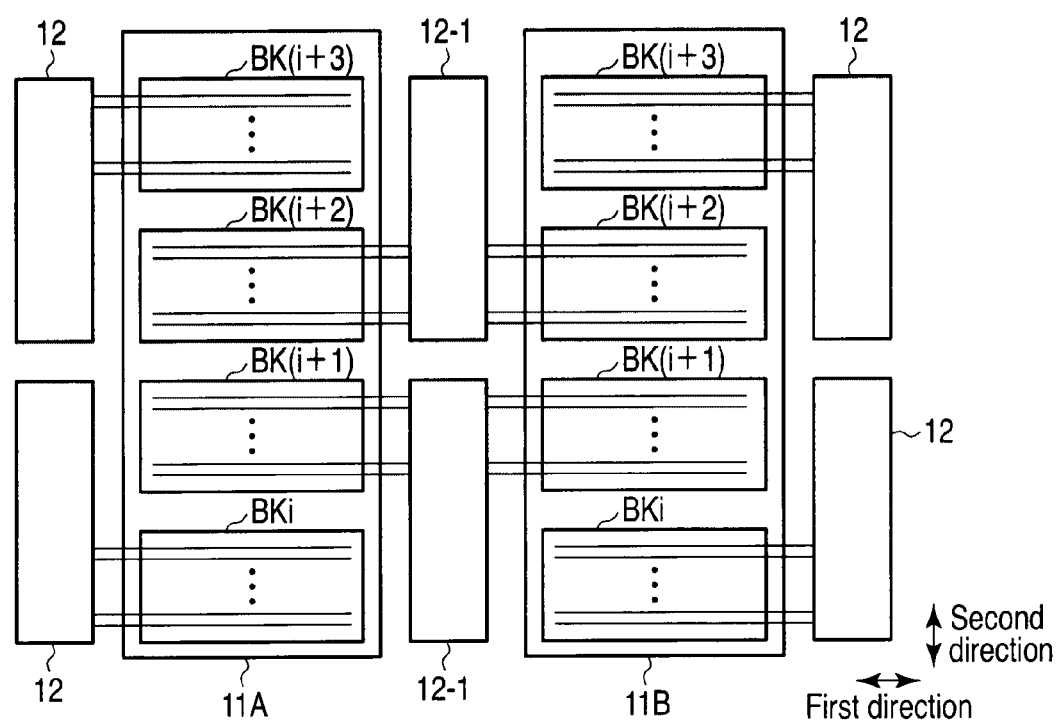
F I G. 13

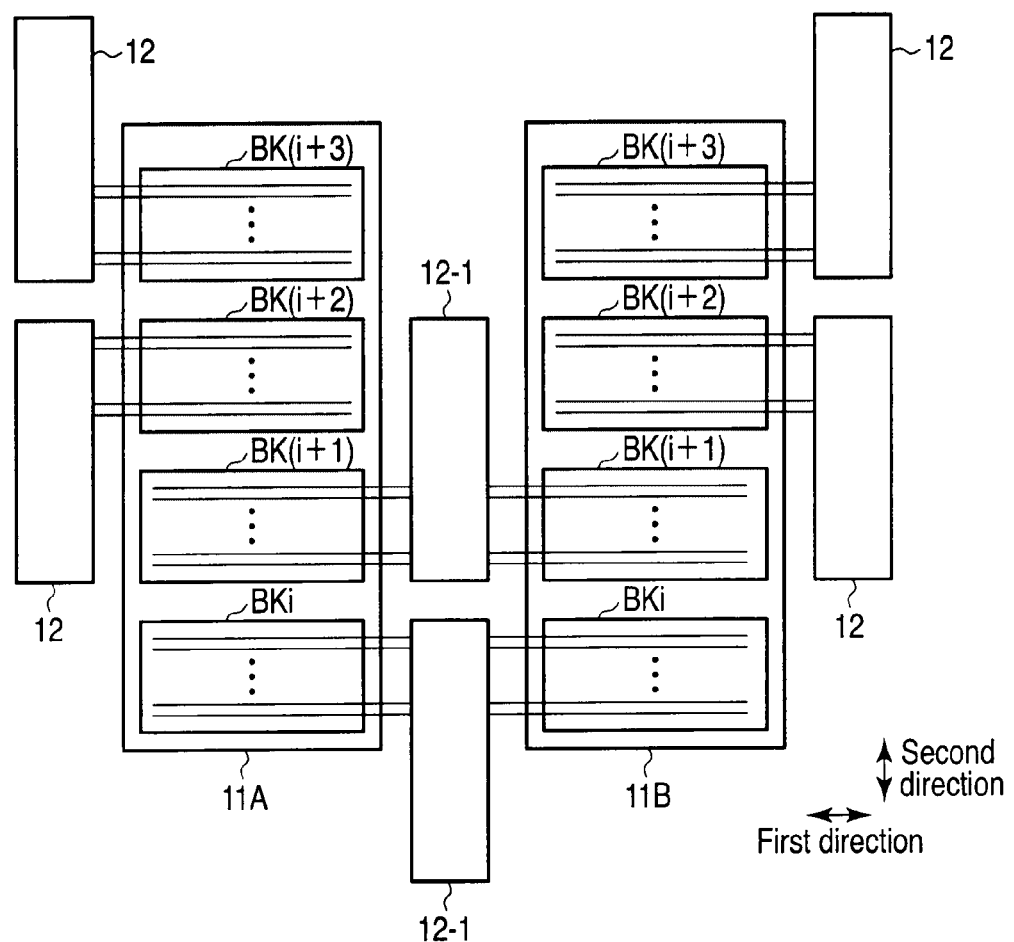
F I G. 14

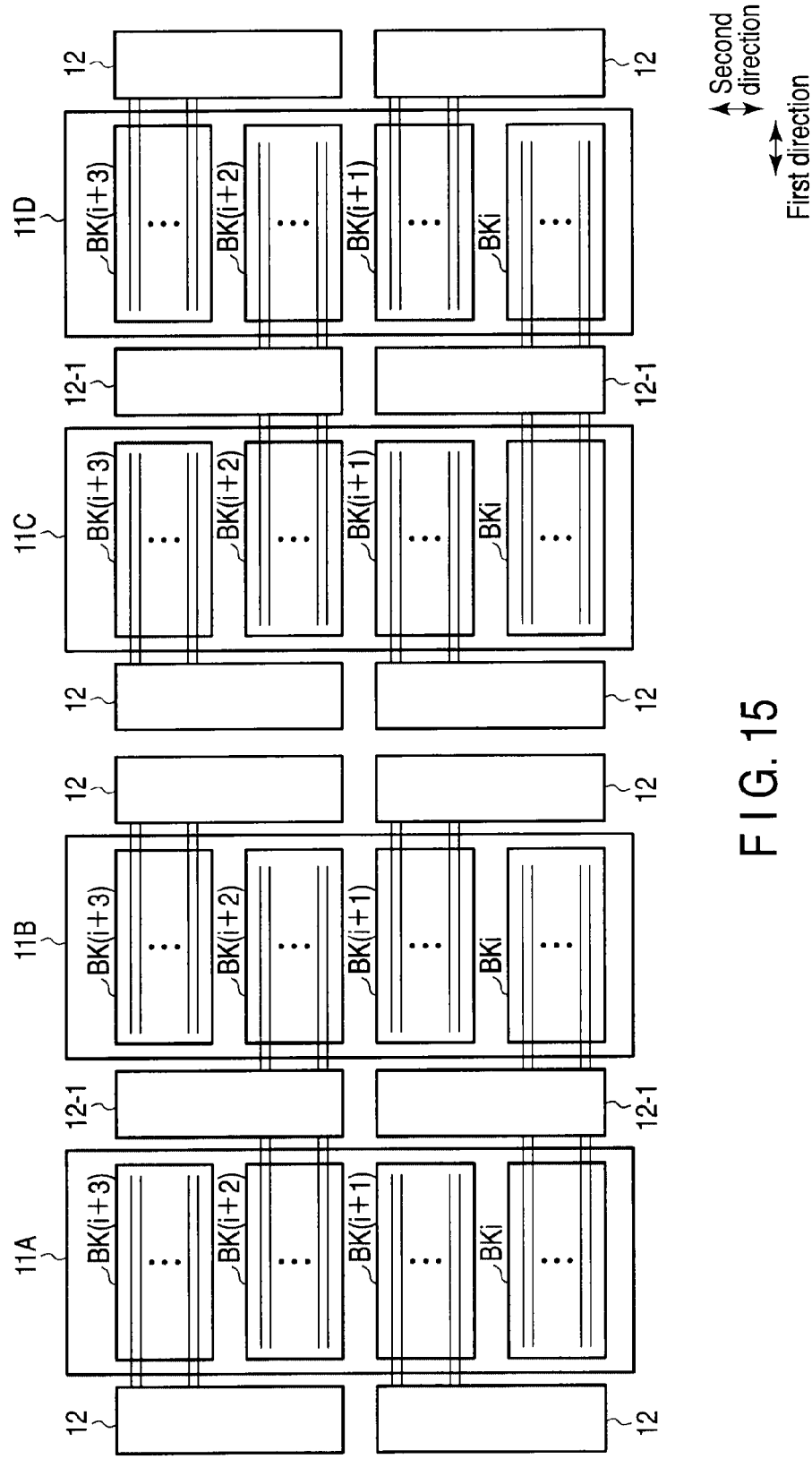
F I G. 15

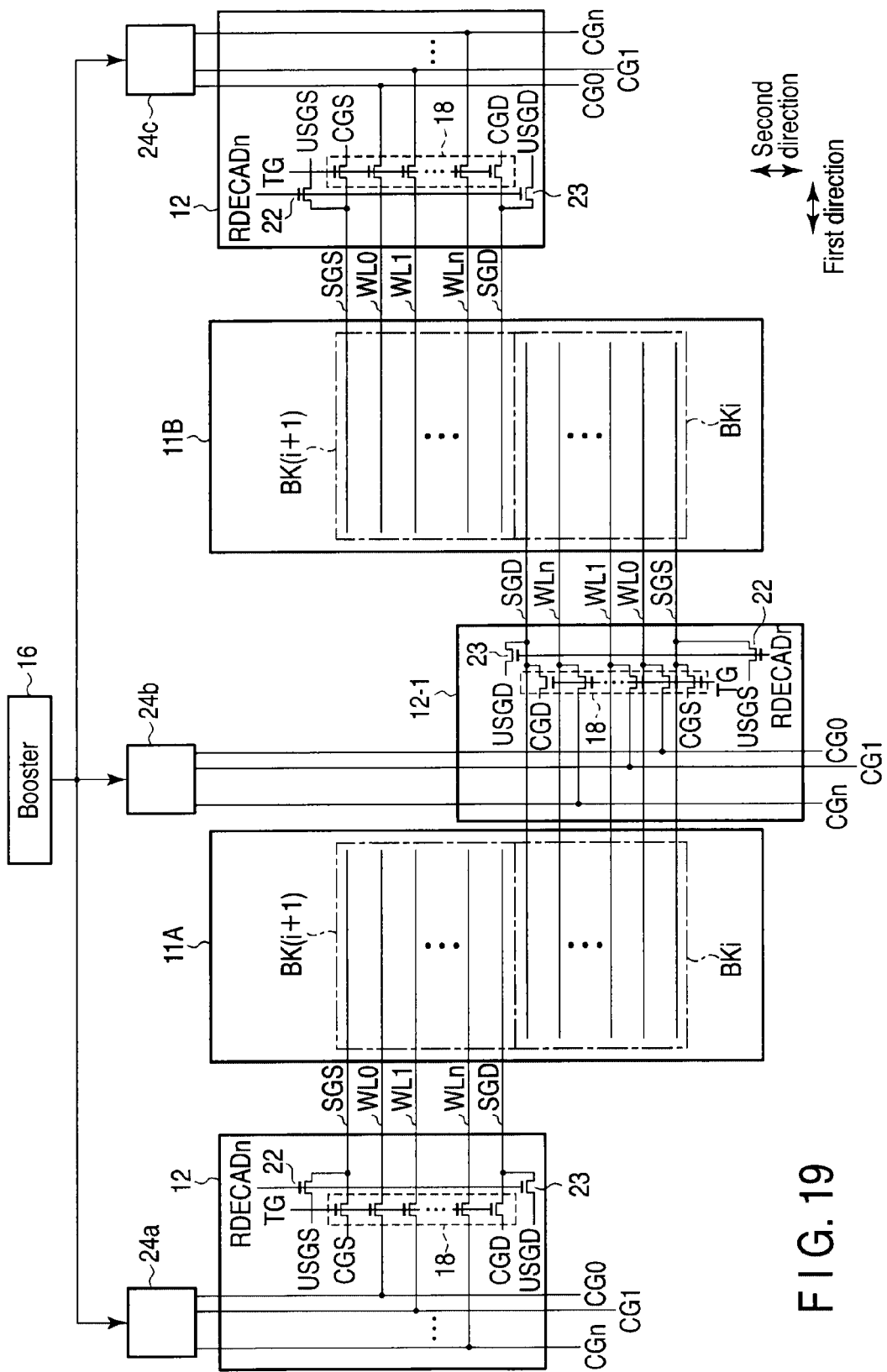
F I G. 19

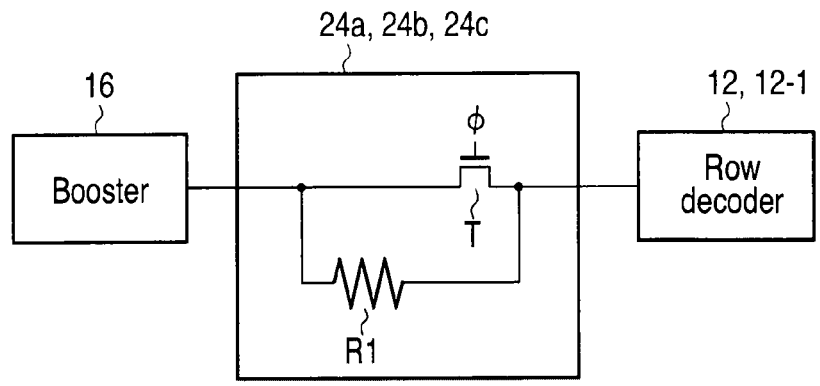
F I G. 20
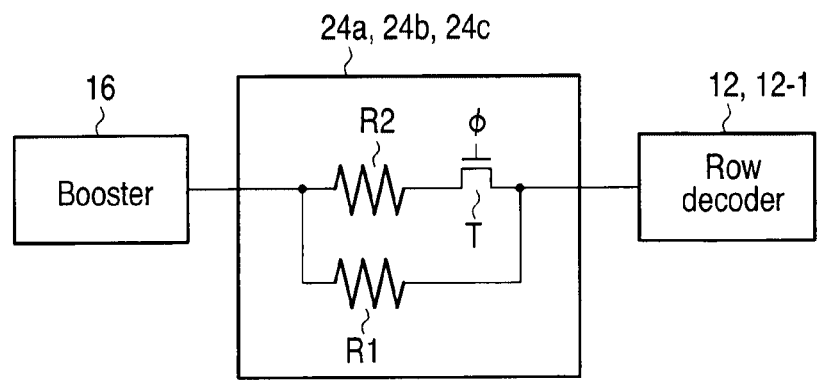
F I G. 21
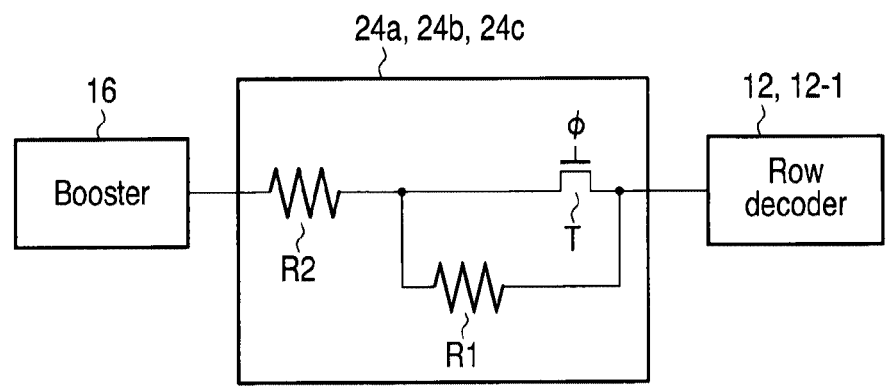
F I G. 22

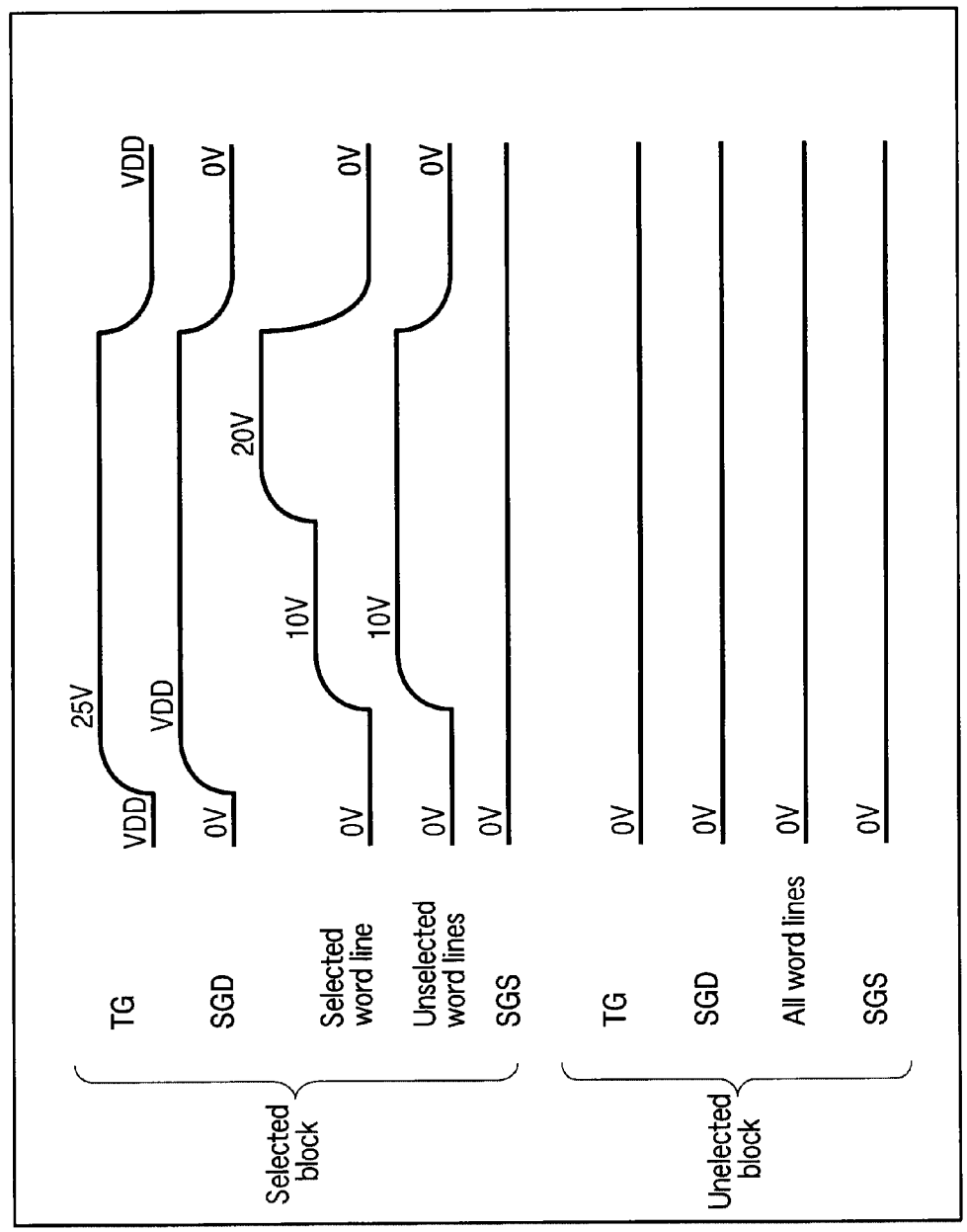
F I G. 23

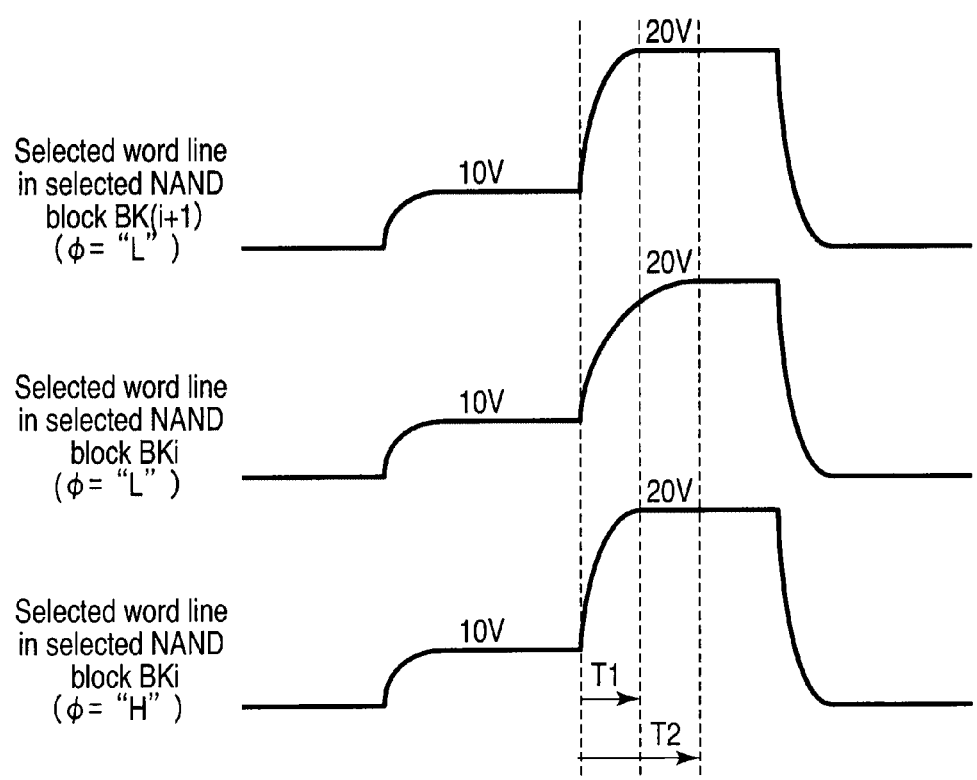
F I G. 24

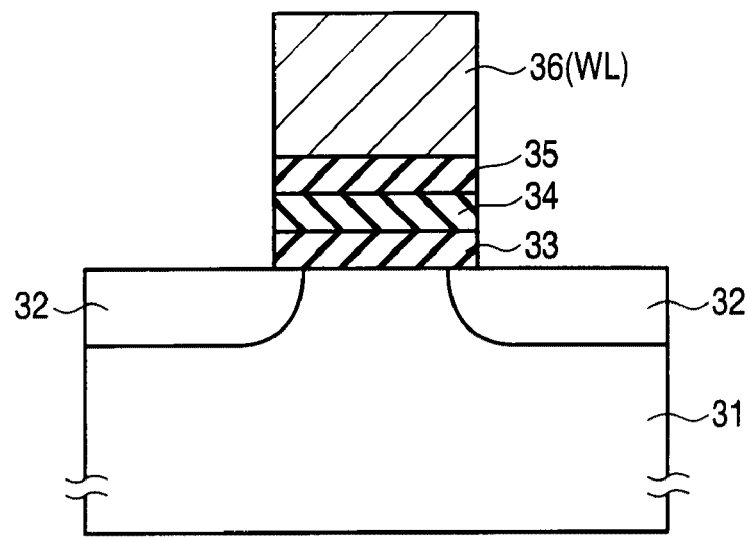
F I G. 29
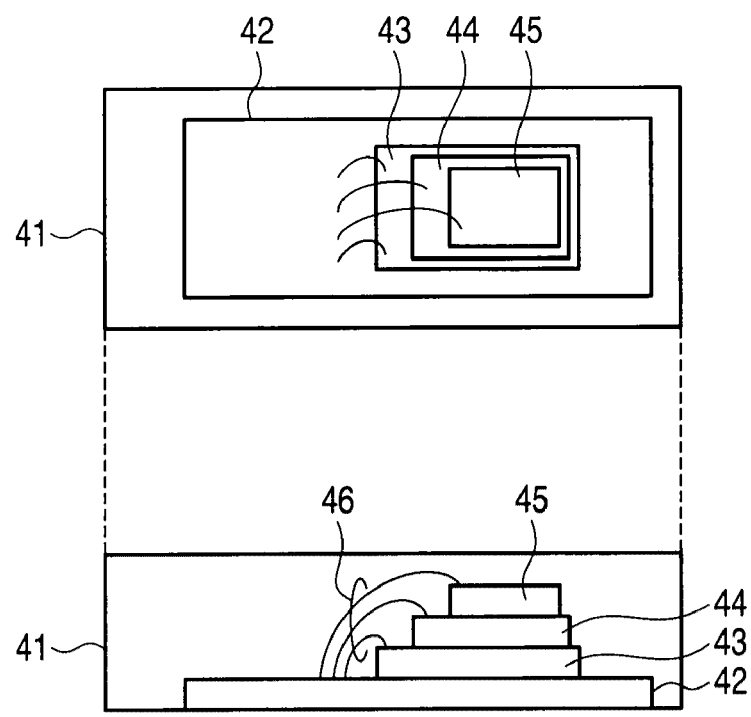
F I G. 30

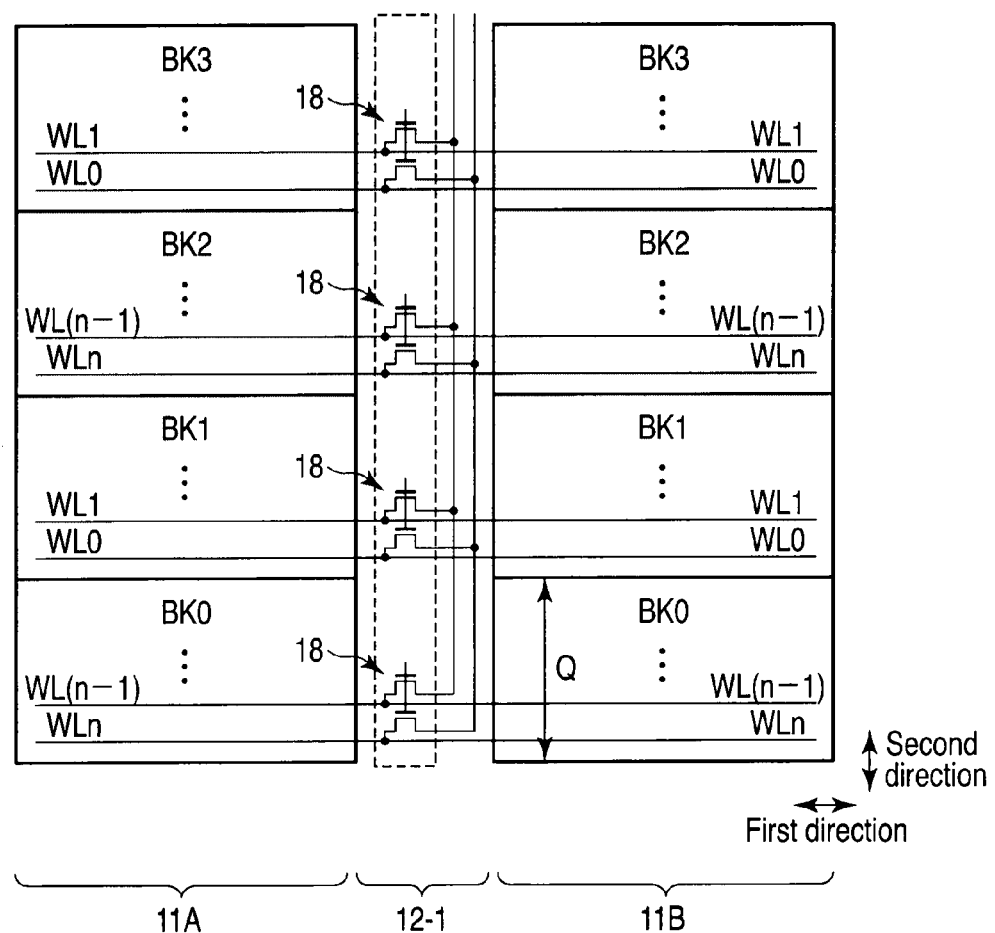
F I G. 31

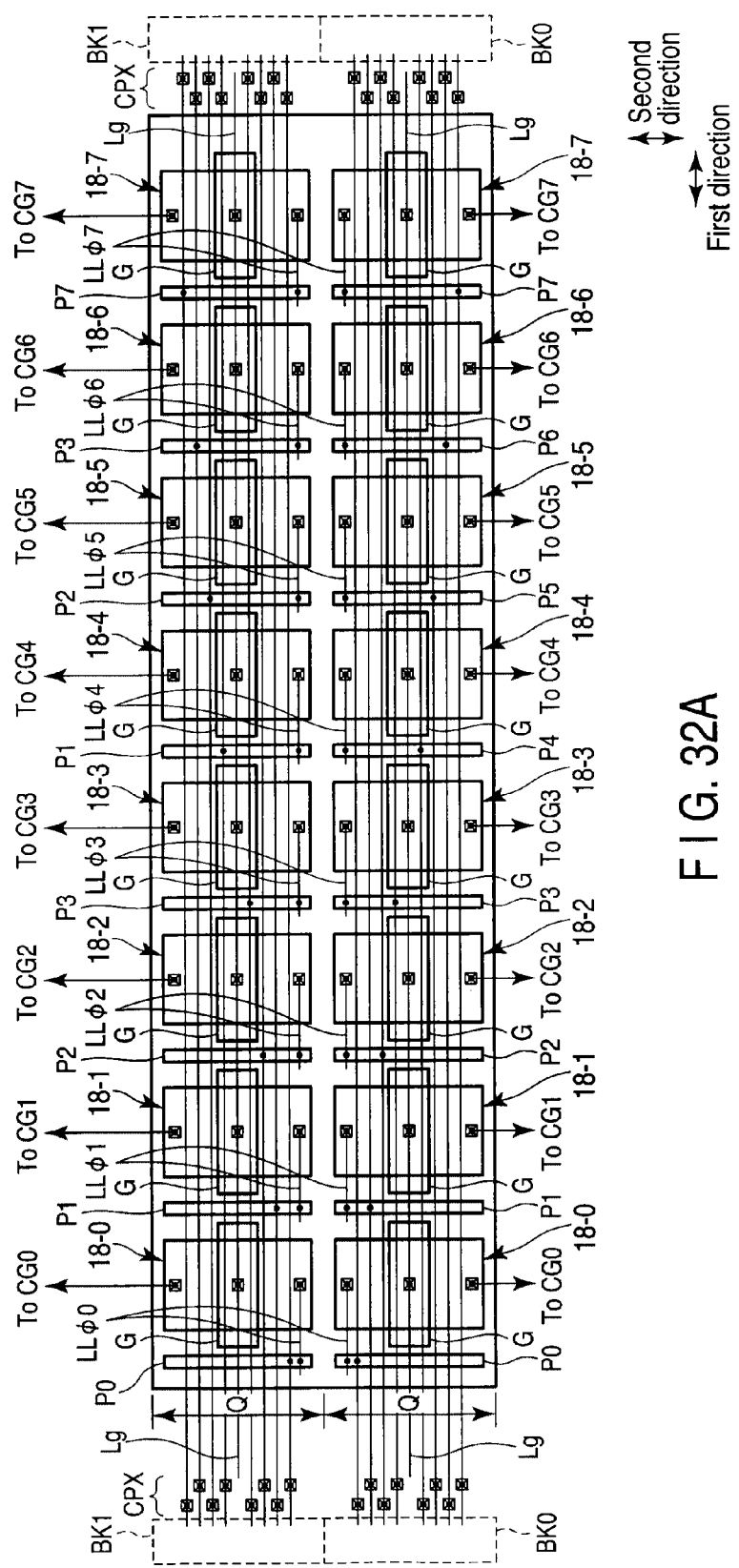
F I G. 32A

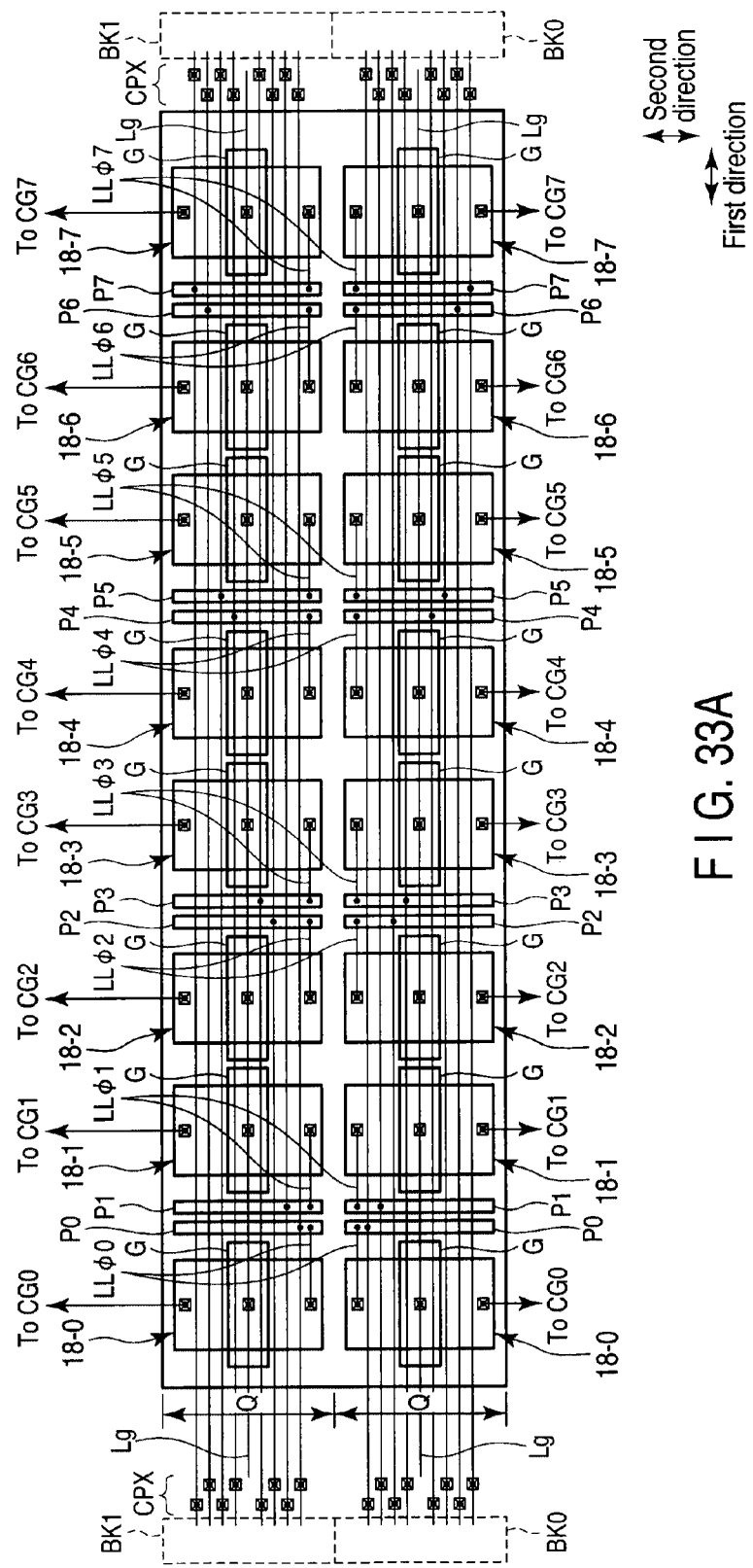
F I G. 33A

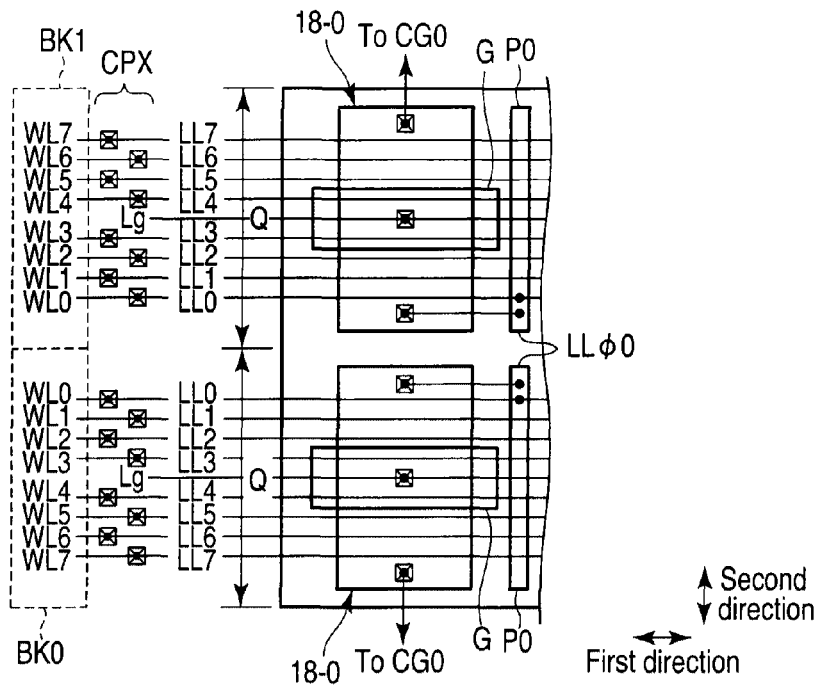
F I G. 33B
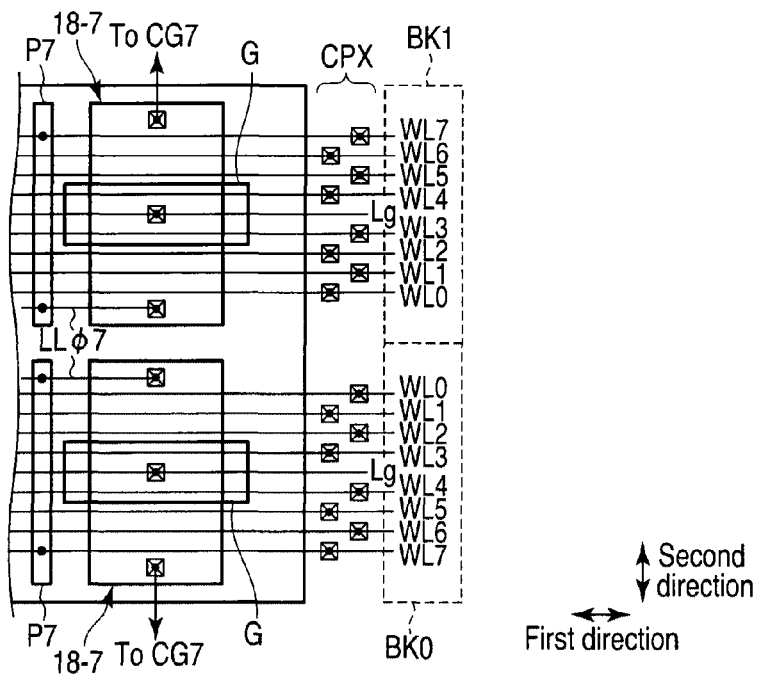
F I G. 33C

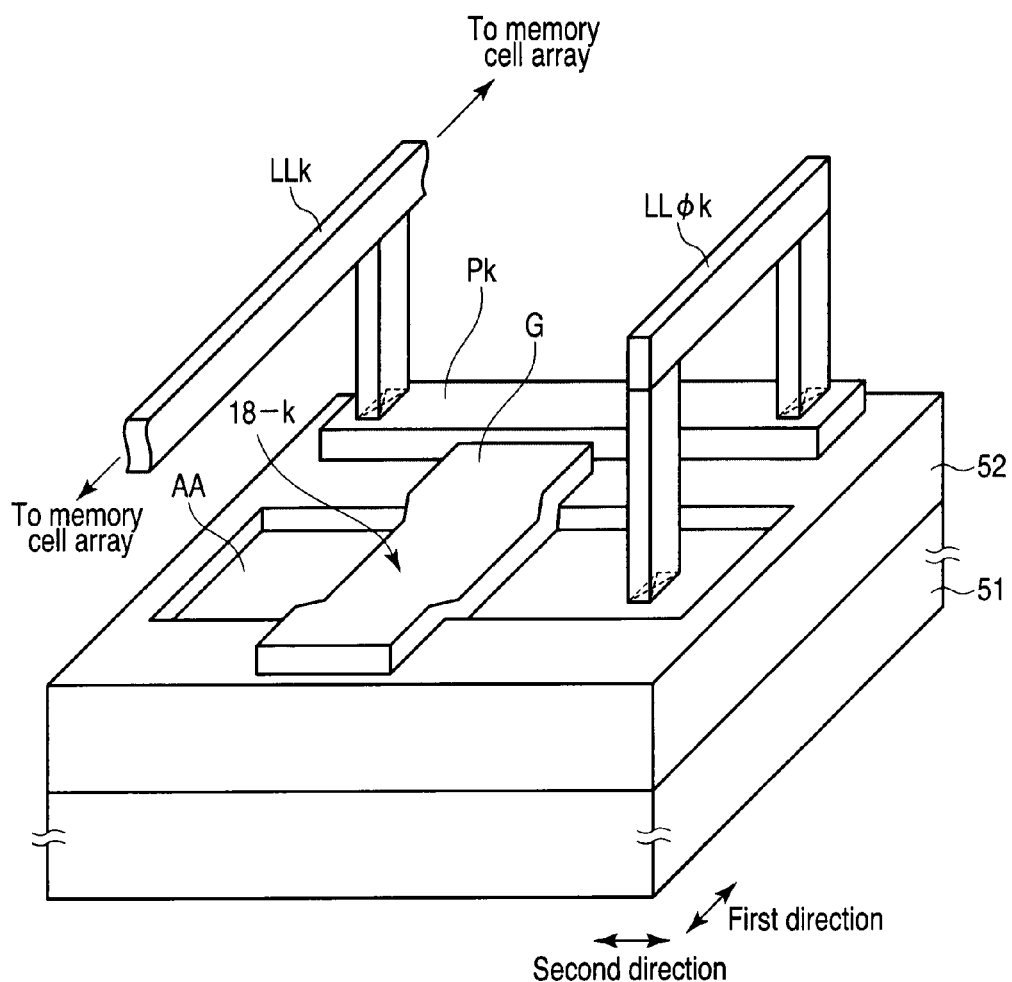
F I G. 34

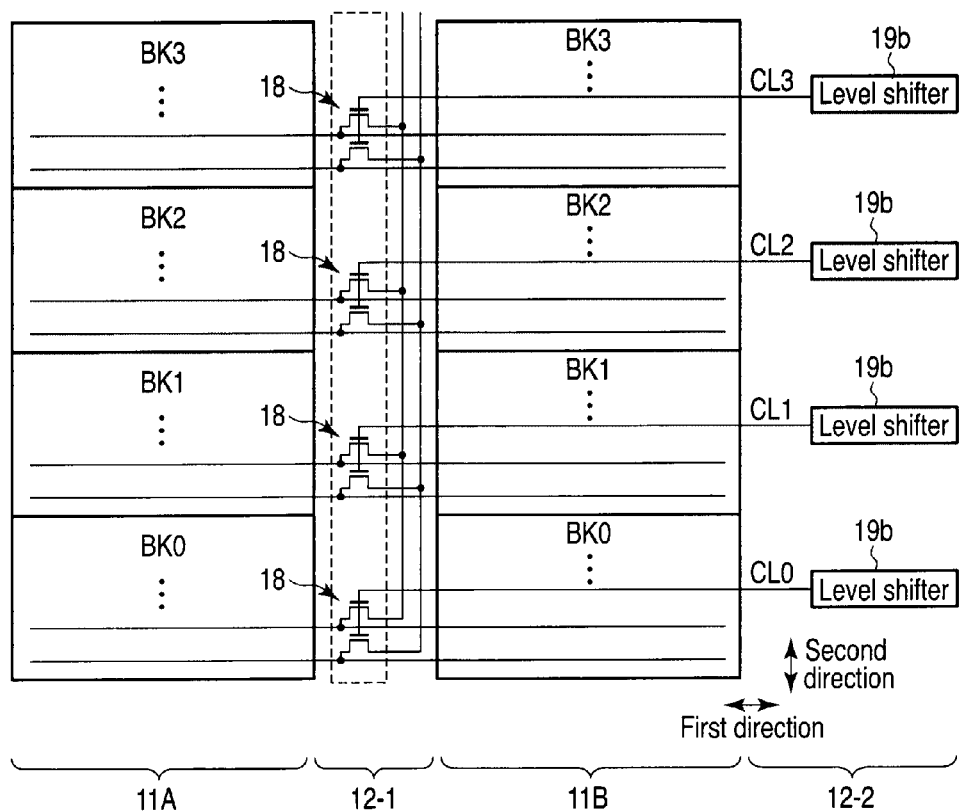
F I G. 35

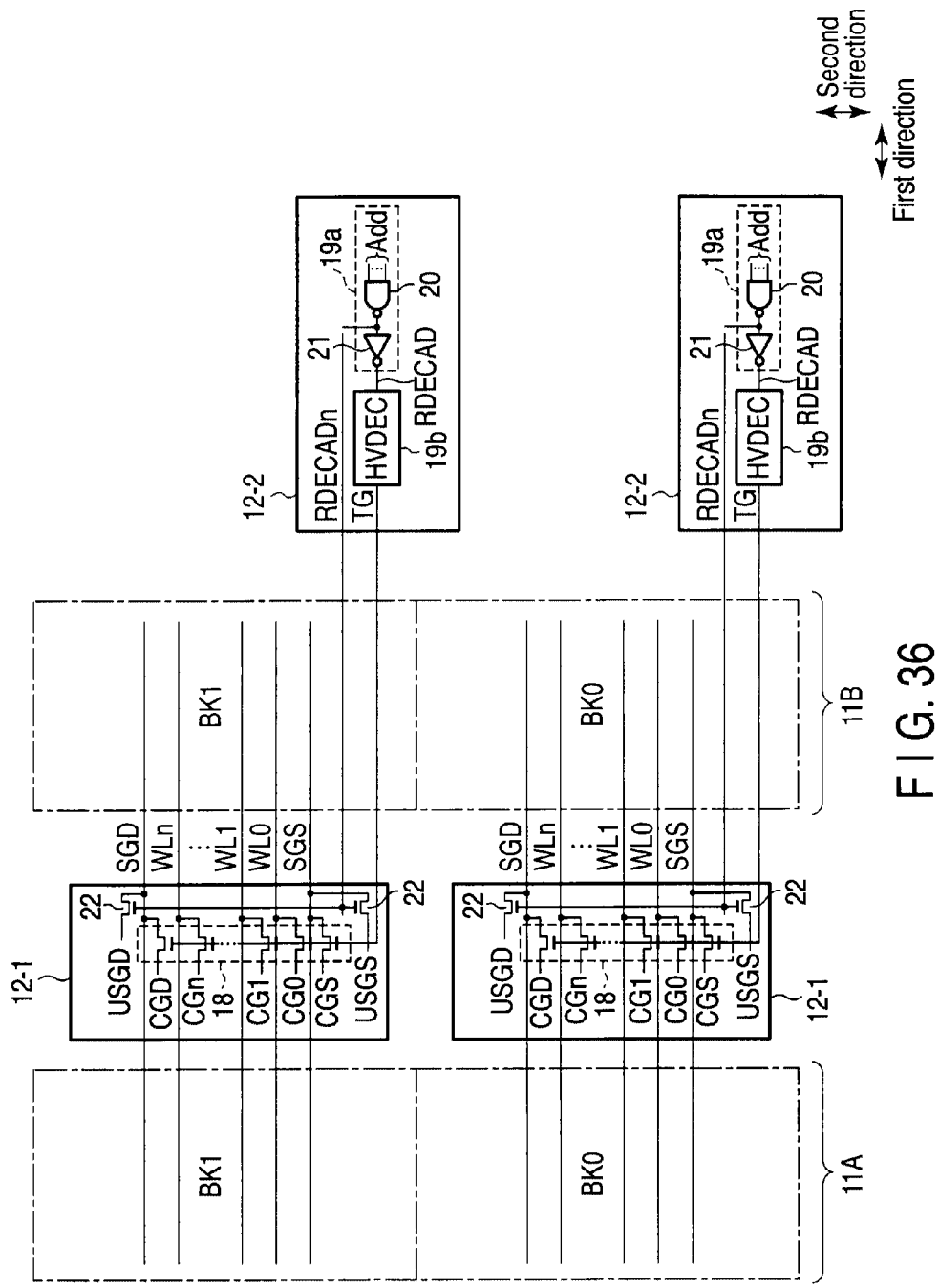
F I G. 36

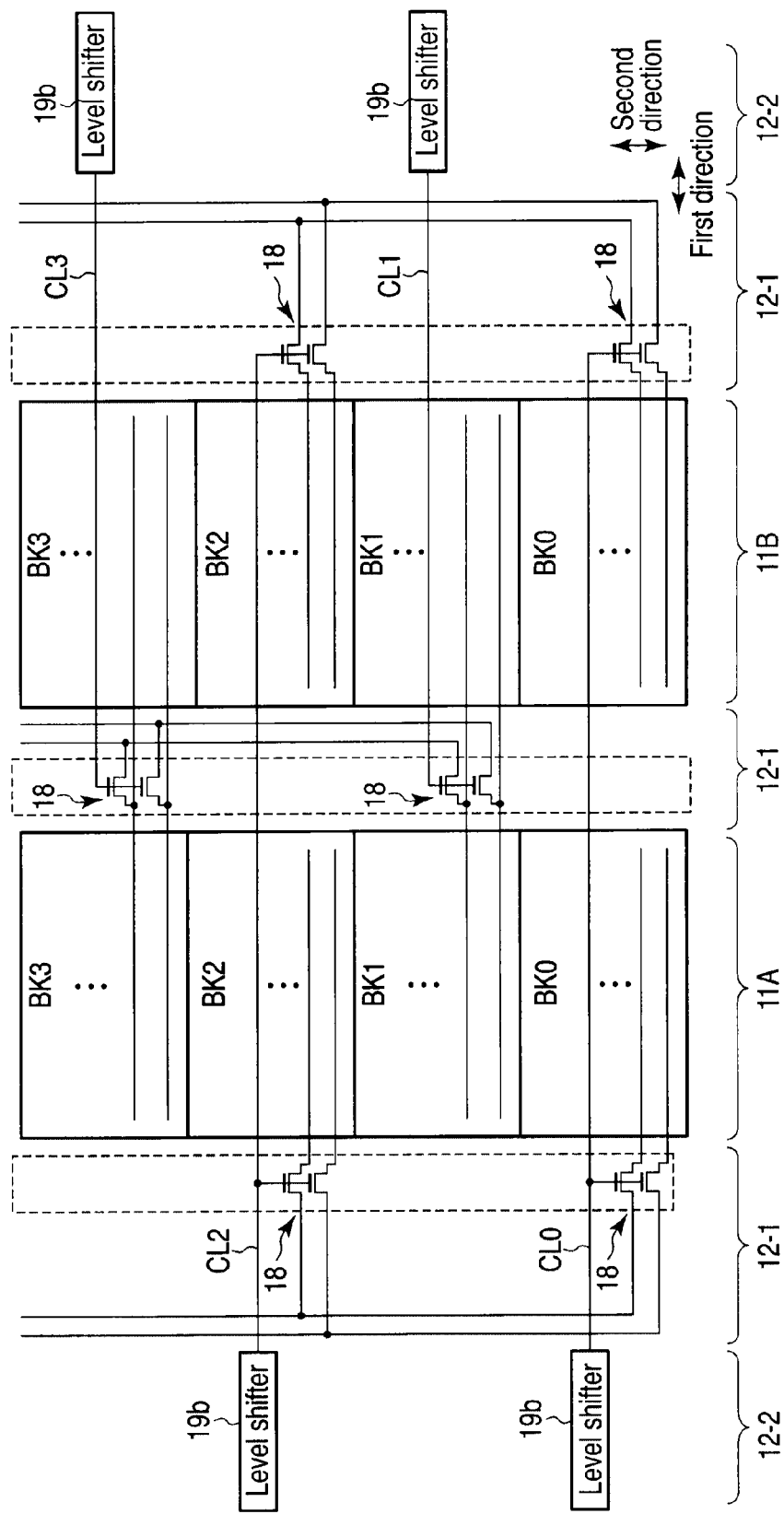
F I G. 37

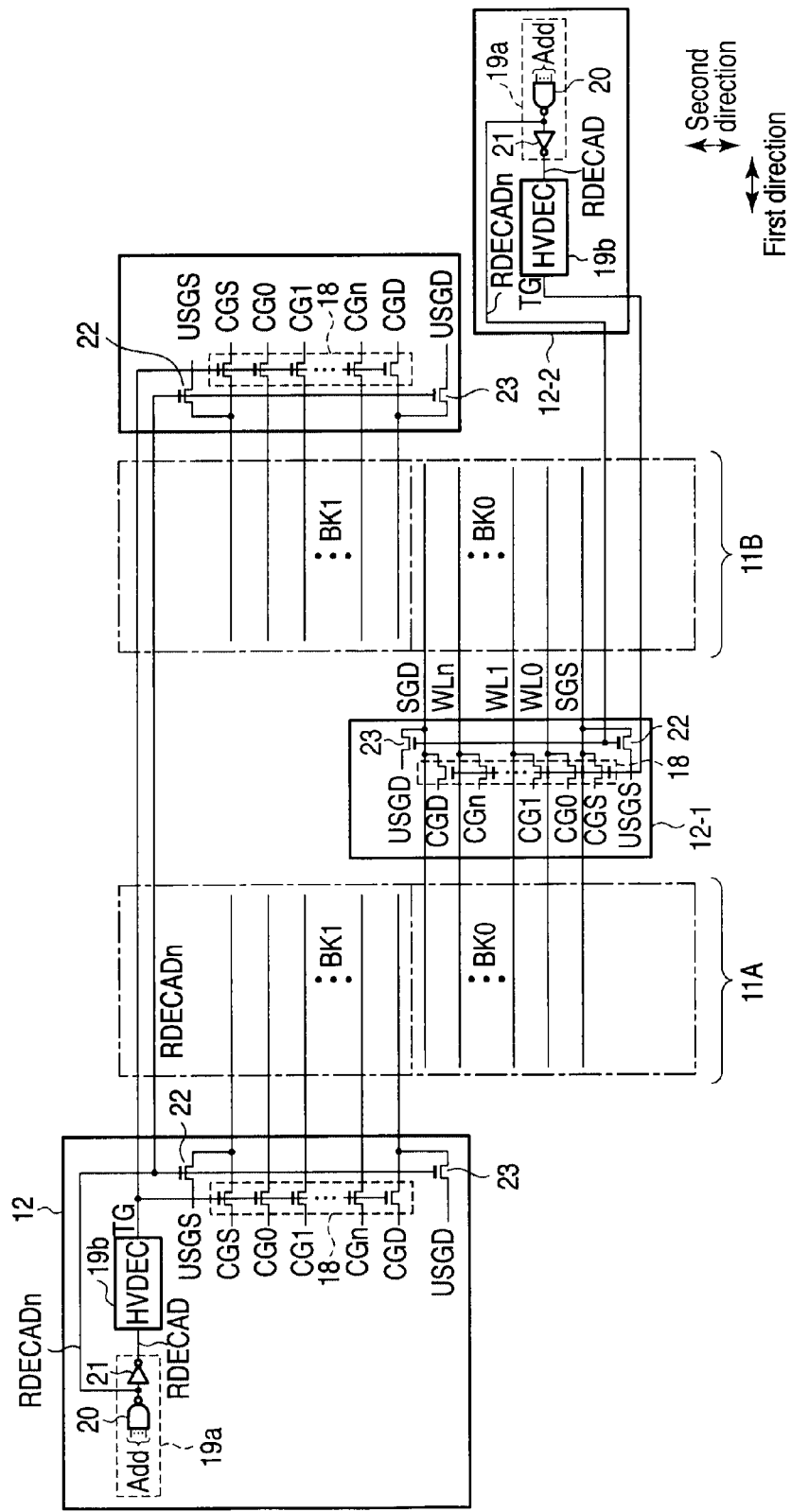
F I G. 38

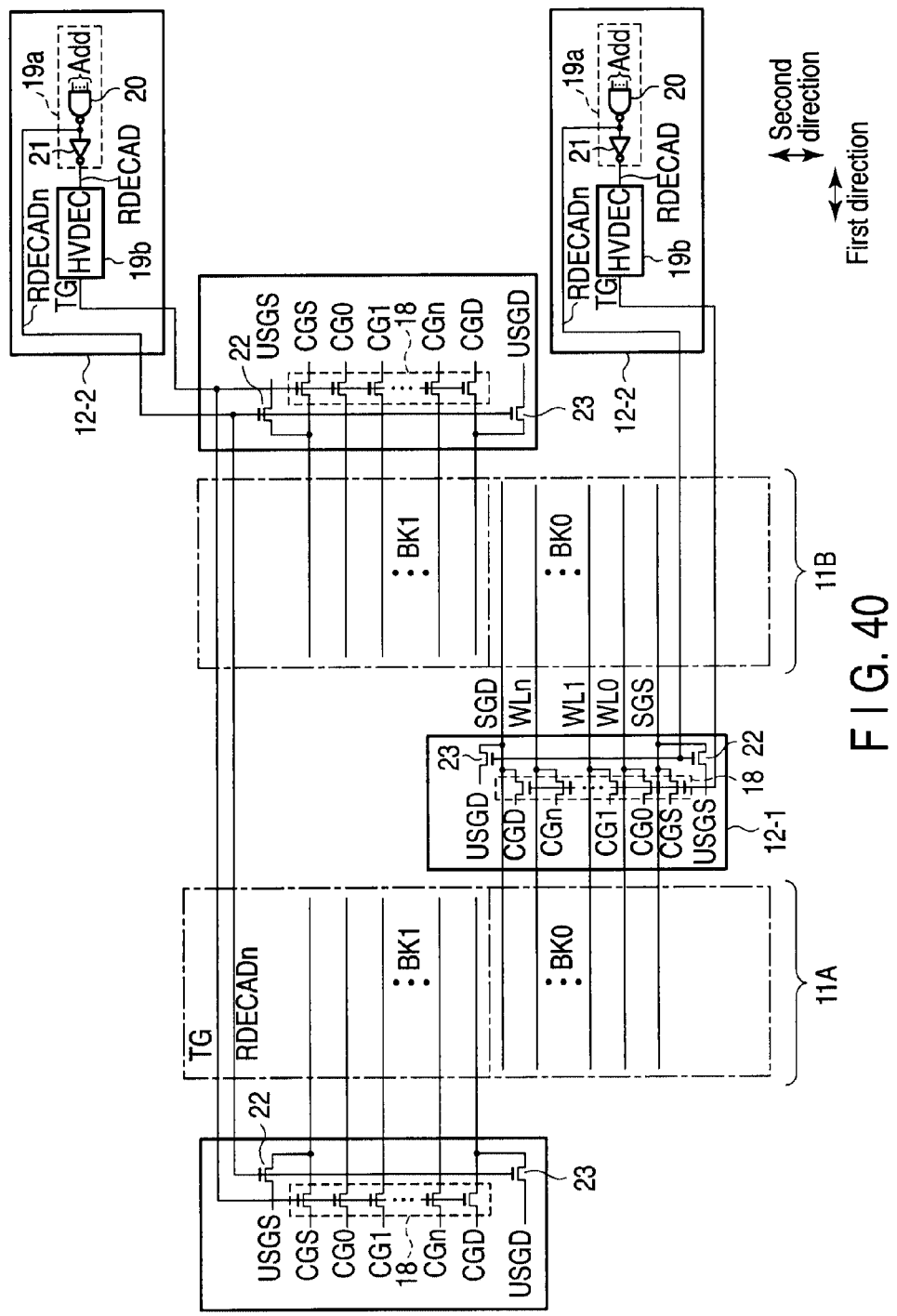
F I G. 40

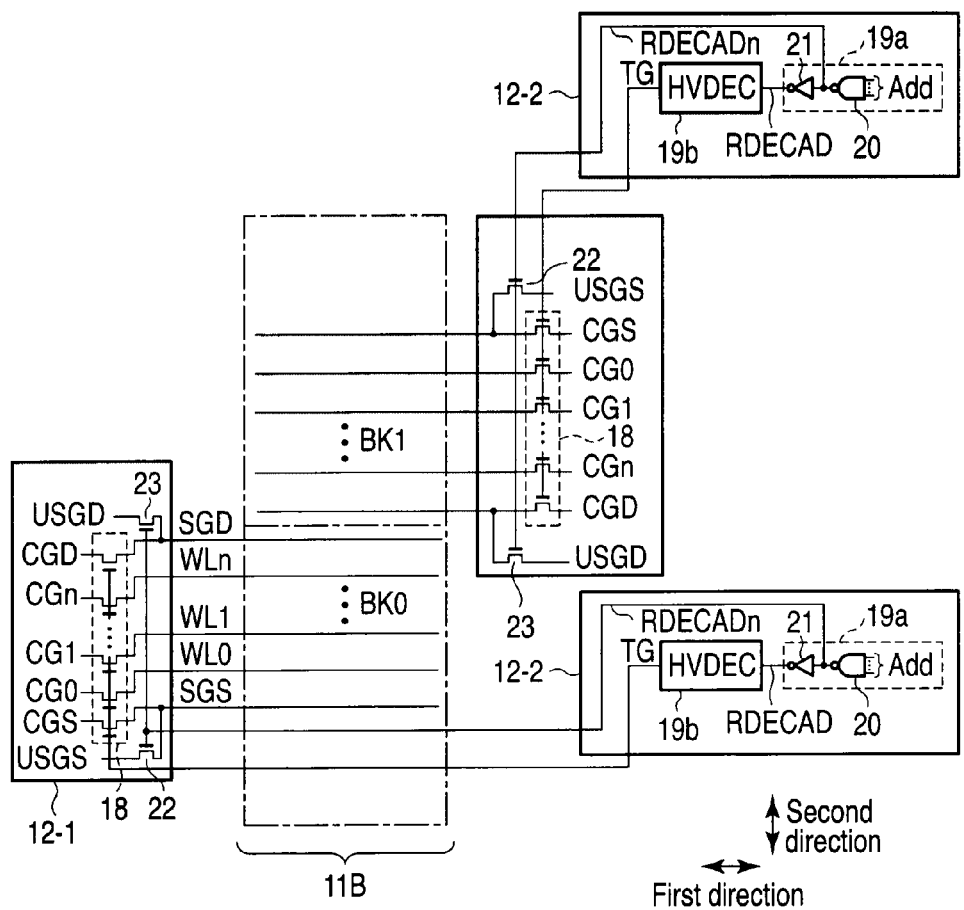
F I G. 42

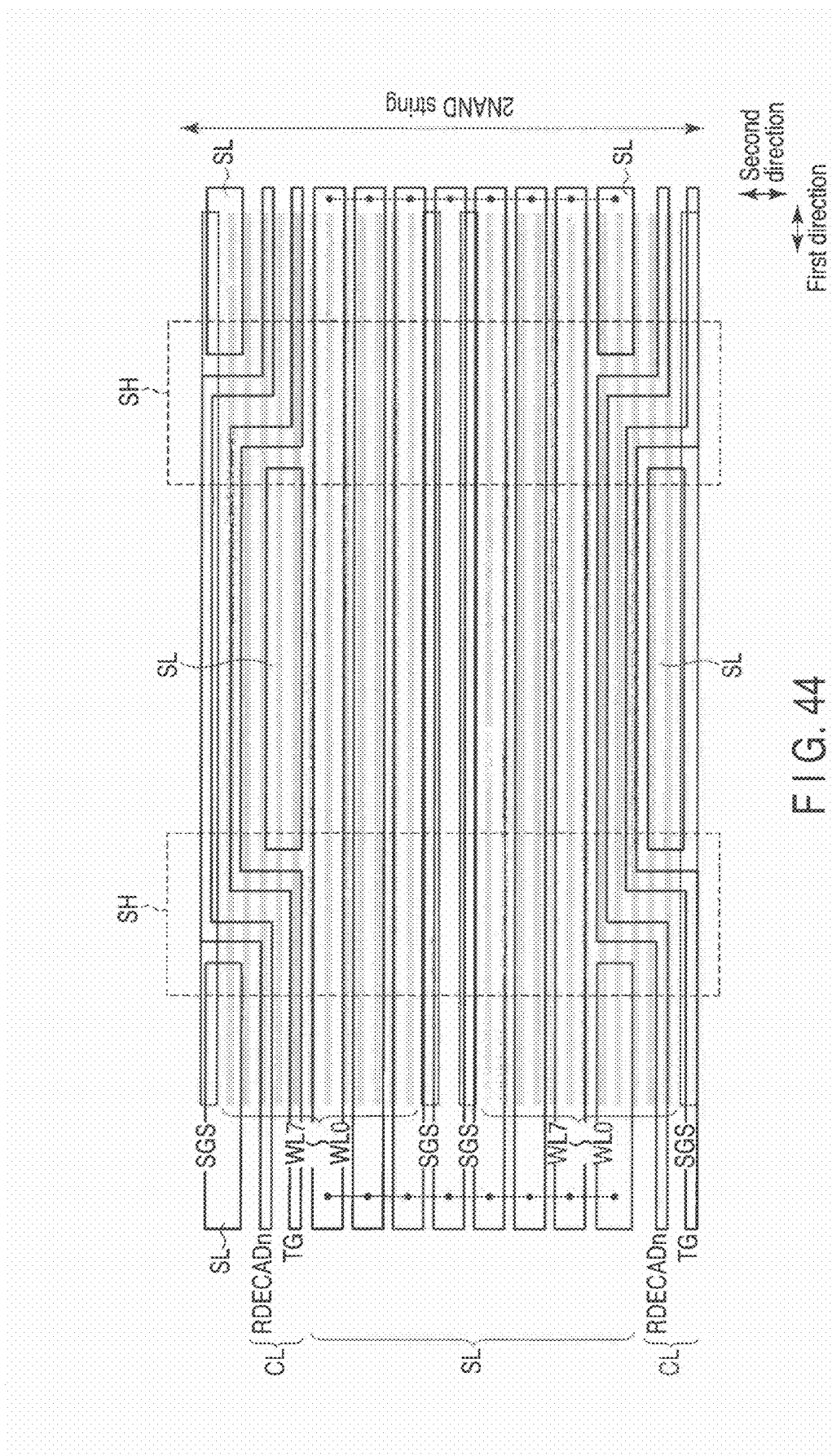
F I G. 44

NAND TYPE FLASH MEMORY

CROSS-REFERENCE TO RELATED APPLICATION

This application is based upon and claims the benefit of priority from the prior Japanese Patent Applications No. 2009-171372, filed Jul. 22, 2009; and No. 2010-123222, filed May 28, 2010, the entire contents all of which are incorporated herein by reference.

FIELD

Embodiments described herein relate generally to a NAND type flash memory.

BACKGROUND

The NAND type flash memory is applied to a file memory and a mobile memory, and recently the NAND type flash memory is just beginning to be applied as a replacement for an HDD of a notebook personal computer (as an SSD: solid state drive). As used herein, "file memory" means the NAND type flash memory that is solely incorporated in a memory card, a USB, a digital device, and the like, and "mobile memory" means the NAND type flash memory such as an MCP (multi chip package) incorporated in a cellular phone, which is used by combining plural kinds of memories (such as a NOR type flash memory).

Under these circumstances, there is a need to increase a memory capacity in the NAND type flash memory. Therefore, it is necessary to develop a product of 128 gigabits or more as the memory capacity of one chip.

However, when memory cells are fabricated more finely to increase the memory capacity, word lines disposed on a memory cell array become thinned and lengthened. As a result, chip performance (such as write/erase/read rate) degrades.

A floor plan in which a row decoder is disposed at one end or both ends of the memory cell array is adopted in the conventional NAND type flash memory.

In order to prevent the degradation of the chip performance in the floor plan, it is necessary that one memory cell array be divided into plural memory planes (memory plane) to shorten the word line.

However, the number of row decoders increases as the number of memory planes increases, which results in a problem in that a chip area enlarges.

BRIEF DESCRIPTION OF THE DRAWINGS

FIG. 1 illustrates a first basic structure.
FIG. 4 illustrates a NAND block.
FIG. 5 illustrates a first example of a layout of row decoder.
FIG. 9 illustrates a fifth example of a layout of row decoder.
FIG. 13 illustrates a ninth example of a layout of row decoder.
FIG. 14 illustrates a tenth example of a layout of row decoder.
FIG. 15 illustrates an eleventh example of a layout of row decoder.
FIG. 19 illustrates a NAND type flash memory.
FIG. 20 illustrates a first example of a circuit which controls a time constant.
FIG. 21 illustrates a second example of a circuit which controls a time constant.
FIG. 22 illustrates a third example of a circuit which controls a time constant.
FIG. 23 illustrates a timing of writing.
FIG. 24 illustrates a potential of a selected word line.
FIG. 29 illustrates a MONOS type memory cell.
FIG. 30 illustrates a product using a NAND type flash memory.
FIG. 31 illustrates a shared row decoder.
FIGS. 32A, 32B and 32C illustrate a first example of a hookup area.
FIGS. 33A, 33B and 33C illustrate a second example of a hookup area.
FIG. 34 illustrates a transfer transistor.
FIGS. 35 to 42 illustrate the other examples of a layout of row decoder.
FIG. 44 illustrates an area X.

DETAILED DESCRIPTION

1. Basic Structure

Figure 2:
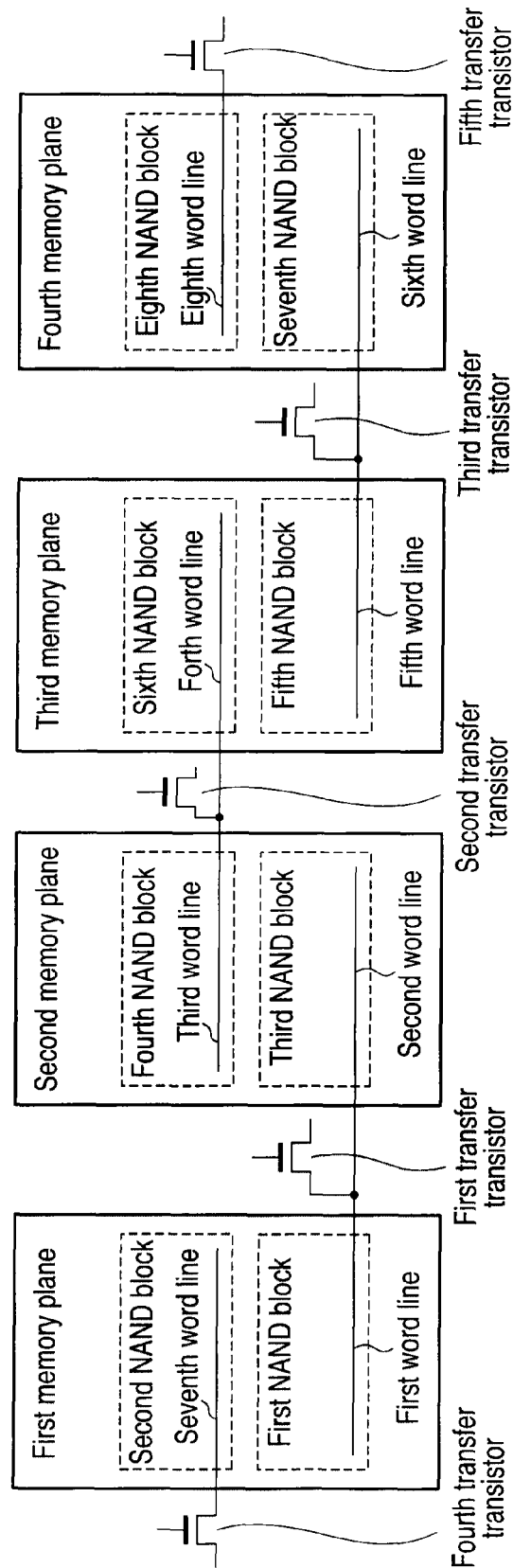
FIG. 2 illustrates a second basic structure.

In general, according to one embodiment, a NAND type flash memory comprises a first memory plane with first and second NAND blocks, a second memory plane with third and fourth NAND blocks, a first transfer transistor with a control terminal, a first potential transfer terminal, and a second potential transfer terminal, and disposed between the first and second memory planes, the first potential transfer terminal being commonly connected to a first word line in the first NAND block and a second word line in the third NAND block, a second transfer transistor with a control terminal, a first potential transfer terminal, and a second potential transfer terminal, and disposed at a first end on a side of the first memory plane that is opposite the second memory plane, the first potential transfer terminal being connected to a third word line in the second NAND block, and a third transfer transistor with a control terminal, a first potential transfer terminal, and a second potential transfer terminal, and disposed at a second end on a side of the second memory plane that is opposite the first memory plane, the first potential transfer terminal being connected to a fourth word line in the fourth NAND block.

An embodiment relates to a floor plan suitable for the large-capacity NAND type flash memory, specifically, to a layout of the row decoder when the number of memory planes increases in one chip.

FIG. 1 illustrates a first basic structure.

The first memory plane comprises the first and second NAND blocks and the second memory plane comprises the third and fourth NAND blocks.

The first transfer transistor is disposed between the first and second memory planes and commonly connected to the first word line in the first NAND block and the second word line in the third NAND block.

The second transfer transistor is disposed at the first end on the side opposite to the second memory plane side of the first memory plane and connected to the third word line in the second NAND block. The third transfer transistor is disposed at the second end on the side opposite to the first memory plane side of the second memory plane and connected to the fourth word line in the fourth NAND block.

In the first basic structure, the first transfer transistor is shared by the first word line in the first NAND block and the second word line in the third NAND block, so that the increase in the number of row decoders can be suppressed when the number of memory planes increases in one chip.

However, at this point, each of loads connected to the second and third transfer transistors is equivalent to one word line, while a load connected to the first transfer transistor is equivalent to two word lines.

The load difference is a difference in time constant when a potential is transferred to the word line, and the word lines differ from one another in a potential transfer rate.

For example, a first driver that controls the time constant in transferring the potential to the first and second word line is connected to the first transfer transistor, a second driver that controls the time constant in transferring the potential to the third word line is connected to the second transfer transistor, and a third driver that controls the time constant in transferring the potential to the fourth word line is connected to the third transfer transistor.

Therefore, the potential transfer rate is controlled in each word line, which allows the potential transfer rate to be equalized in all the word lines.

A second decode block that produces a control signal to control the second transfer transistor is disposed at the first end of the first memory plane that is located close to the second transfer transistor, and a third decode block that produces a control signal to control the third transfer transistor is disposed at the second end of the second memory plane that is located close to the third transfer transistor.

On the other hand, a first decode block that produces a control signal to control the first transfer transistor is disposed not between the first and second memory planes located close to the first transfer transistor, but at one of the first and second ends. This is because a space in which the first decode block is disposed cannot be secured between the first and second memory planes with increasing memory capacity.

In such cases, a control signal line that connects the first transfer transistor and the first decode block is disposed on one of the first, second, third, and fourth NAND blocks. Preferably, the control signal line is disposed on each of the second and fourth NAND blocks that are not correlated to the control signal line.

FIG. 2 illustrates a second basic structure.

The first memory plane comprises the first and second NAND blocks. The second memory plane comprises the third and fourth NAND blocks and is disposed in parallel with the first memory plane. A third memory plane comprises fifth and sixth NAND blocks and is disposed in parallel with the second memory plane. A fourth memory plane comprises seventh and eighth NAND blocks and is disposed in parallel with the third memory plane.

The first transfer transistor is disposed between the first and second memory planes and commonly connected to the first word line in the first NAND block and the second word line in the third NAND block.

The second transfer transistor is disposed between the second and third memory planes and commonly connected to the third word line in the fourth NAND block and the fourth word line in the sixth NAND block.

The third transfer transistor is disposed between the third and fourth memory planes and commonly connected to a fifth word line in the fifth NAND block and a sixth word line in the seventh NAND block.

A fourth transfer transistor is disposed at the first end opposite to the second memory plane side of the first memory plane and connected to a seventh word line in the second NAND block.

A fifth transfer transistor is disposed at the second end opposite to the third memory plane side of the fourth memory plane and connected to an eighth word line in the eighth NAND block.

In the second basic structure, the first transfer transistor is shared by the first word line in the first NAND block and the second word line in the third NAND block, the second transfer transistor is shared by the third word line in the fourth NAND block and the fourth word line in the sixth NAND block, and the third transfer transistor is shared by the fifth word line in the fifth NAND block and the sixth word line in the seventh NAND block.

Accordingly, the increase in the number of row decoders can be suppressed when the number of memory planes increases in one chip with increasing memory capacity.

2. Embodiment

A NAND type flash memory according to an embodiment will be described below.

(1) Entire Diagram

Figure 3:
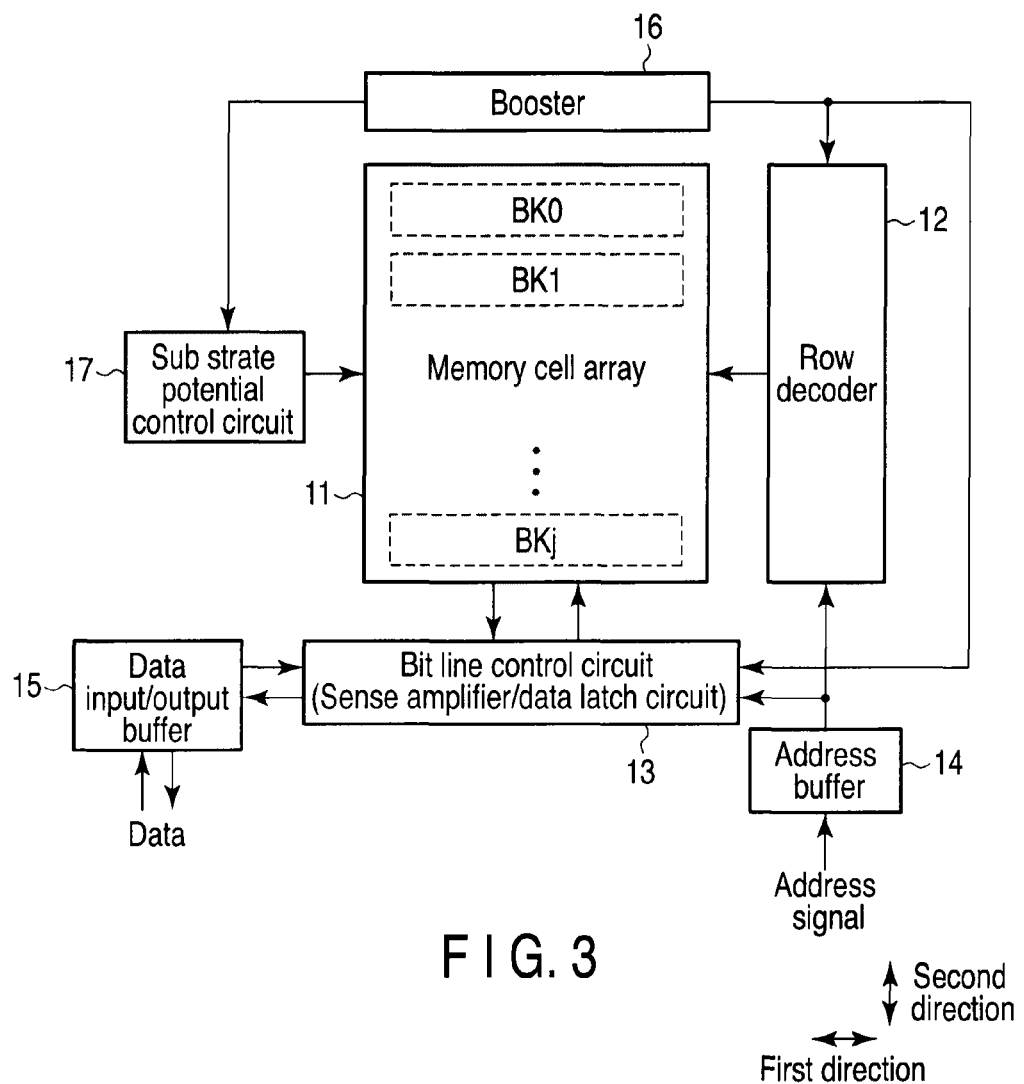
FIG. 3 illustrates a NAND type flash memory.

FIG. 3 illustrates a NAND type flash memory.

A memory cell array 11 comprises plural NAND blocks BK0, BK1, . . . , and BLj. Each of the plural NAND blocks BK0, BK1, . . . , and BLj comprises plural cell units, and each of the plural cell units comprises a NAND string that includes plural series-connected memory cells and two select gate transistors that are connected to both ends of the NAND string.

A row decoder 12 is disposed at one end in a first direction of the memory cell array 11, and a bit line control circuit 13 is disposed at one end in a second direction of the memory cell array 11.

An address signal is input to the row decoder 12 and the bit line control circuit 13 through an address buffer 14. The address signal includes a block address signal, a row address signal, and a column address signal. The data is input and output with a data input/output buffer 15.

The row decoder 12 selects one of the plural NAND blocks BK0, BK1, . . . , and BLj based on the block address signal, and selects one of the plural word lines in the selected block BKi based on the row address signal.

The bit line control circuit 13 selects one of the plural bit lines based on the column address signal. The bit line control circuit 13 comprises a sense amplifier and a data latch circuit. The data latch circuit has a function of temporarily latching data during read/write. For example, the data latch circuit is formed by a flipflop circuit.

A booster 16 produces a potential necessary to read/write/erase data and transfer the potential to the row decoder 12, the bit line control circuit 13, and a substrate potential control circuit 17.

The substrate potential control circuit 17 controls the potential at the semiconductor substrate.

For example, when a double well region comprising an n-type well region and a p-type well region is formed in a p-type semiconductor substrate while the memory cell is formed in the p-type well region, the potential at the p-type well region is controlled according to an operation mode.

(2) NAND Block

FIG. 4 illustrates a NAND block.

The NAND block BKi in the memory cell array 11 comprises plural cell units that are arrayed in the first direction. Each of the plural cell units comprises a NAND string that includes plural series-connected memory cells MC0, MC1, . . . , MCn−1, and MCn and two select gate transistors STS and STD that are connected to both ends of the NAND string.

The select gate transistor STS is connected to a source line CELSRC, and the select gate transistor STD is connected to bit lines BL0, BL1, . . . , and BLm.

Control gates of the memory cells MC0, MC1, . . . , MCn−1, and MCn are connected to word lines WL0, WL1, . . . , WLn−1, and WLn, and the gates of the select gate transistors STS and STD are connected to select gate lines SGS and SGD.

The word lines WL0, WL1, . . . , WLn−1, and WLn and the select gate lines SGS and SGD extend in the first direction, and ends of the word lines WL0, WL1, . . . , WLn−1, and WLn and the select gate lines SGS and SGD are connected to potential transfer lines CG0, CG1, . . . , CGn−1, and CGn and potential transfer lines CGS and CGD through the transfer transistor block 18 in the row decoder 12.

For example, the transfer transistor block 18 is formed by transfer transistors that are N-channel MOS transistors. The gates of the transfer transistors are controlled by a transfer control signal TG from a level shifter 19.

(3) Layout of Row Decoder

A. First Example

Comparative Example

FIG. 5 illustrates a first example of a layout of the row decoders.

One of the features of the layout of the first example is that the row decoders 12 are disposed at both ends in the first direction of the memory cell array 11.

The memory cell array 11 comprises two NAND blocks BKi and BK(i+1) that are disposed in parallel in the second direction.

The word lines WL0, WL1, . . . , and WLn and select gate lines SGS and SGD in the NAND block BKi are connected to the row decoder 12 that is disposed on the left of the memory cell array 11. The word lines WL0, WL1, . . . , and WLn and select gate lines SGS and SGD in the NAND block BK(i+1) are connected to the row decoder 12 that is disposed on the right of the memory cell array 11.

The row decoder 12 comprises a transfer transistor block 18 that is connected to the word lines WL0, WL1, . . . , and WLn and select gate lines SGS and SGD, a transfer transistor 22 that is connected to the select gate line SGS, and a transfer transistor 23 that is connected to the select gate line SGD.

The row decoder 12 also comprises a low-voltage decoder 19a and a high-voltage decoder 19b. The low-voltage decoder 19a comprises a NAND gate 20 and an inverter 21 and outputs control signals RDECAD and RDECADn based on a row address signal Add.

There is a complementary relationship between values of the control signals RDECAD and RDECADn.

The high-voltage decoder 19b acts as a level shifter and boosts a potential level of the control signal RDECAD to output the transfer control signal TG.

When the NAND block BKi is selected, all the row address signals Add that are input to the NAND gate 20 in the row decoder 12 connected to the NAND block BKi become "H", and the transfer control signal TG becomes "H", thereby turning on the transfer transistor block 18. The control signal RDECADn becomes "L", thereby turning off the transfer transistors 22 and 23.

At this point, in the row decoder 12 connected to the unselected NAND block BK(i+1), because all the row address signals Add input to the NAND gate 20 do not become "H", the transfer control signal TG becomes "L", and the transfer transistor block 18 is turned off. Because the control signal RDECADn becomes "H", the transfer transistors 22 and 23 are turned on.

The transfer transistors 22 and 23 are turned on, whereby the select gate lines SGS and SGD are electrically connected to the signal lines USGS and USGD, respectively.

In the layout of the first example, the row decoders 12 are disposed on both sides of the memory cell array 11, so that the complicated interconnection can be prevented compared with the case in which the row decoder 12 is disposed on one side of the memory cell array 11.

However, when the memory cells are fabricated more finely to increase the capacity of the memory cell array, the word lines WL0, WL1, . . . , and WLn and the select gate lines SGS and SGD become thinned, and lengths L of the word lines WL0, WL1, . . . , and WLn and select gate lines SGS and SGD increase. As a result, the chip performance degrades.

On the other hand, in order to prevent the degradation of the chip performance in the layout, it is necessary to divide the memory cell array 11 into plural memory planes to shorten the word lines WL0, WL1, . . . , and WLn and select gate lines SGS and SGD.

However, the number of row decoders 12 increases as the number of memory planes increases, which results in a new problem in that the chip area enlarges.

B. Second Example

Comparative Example

Figure 6:
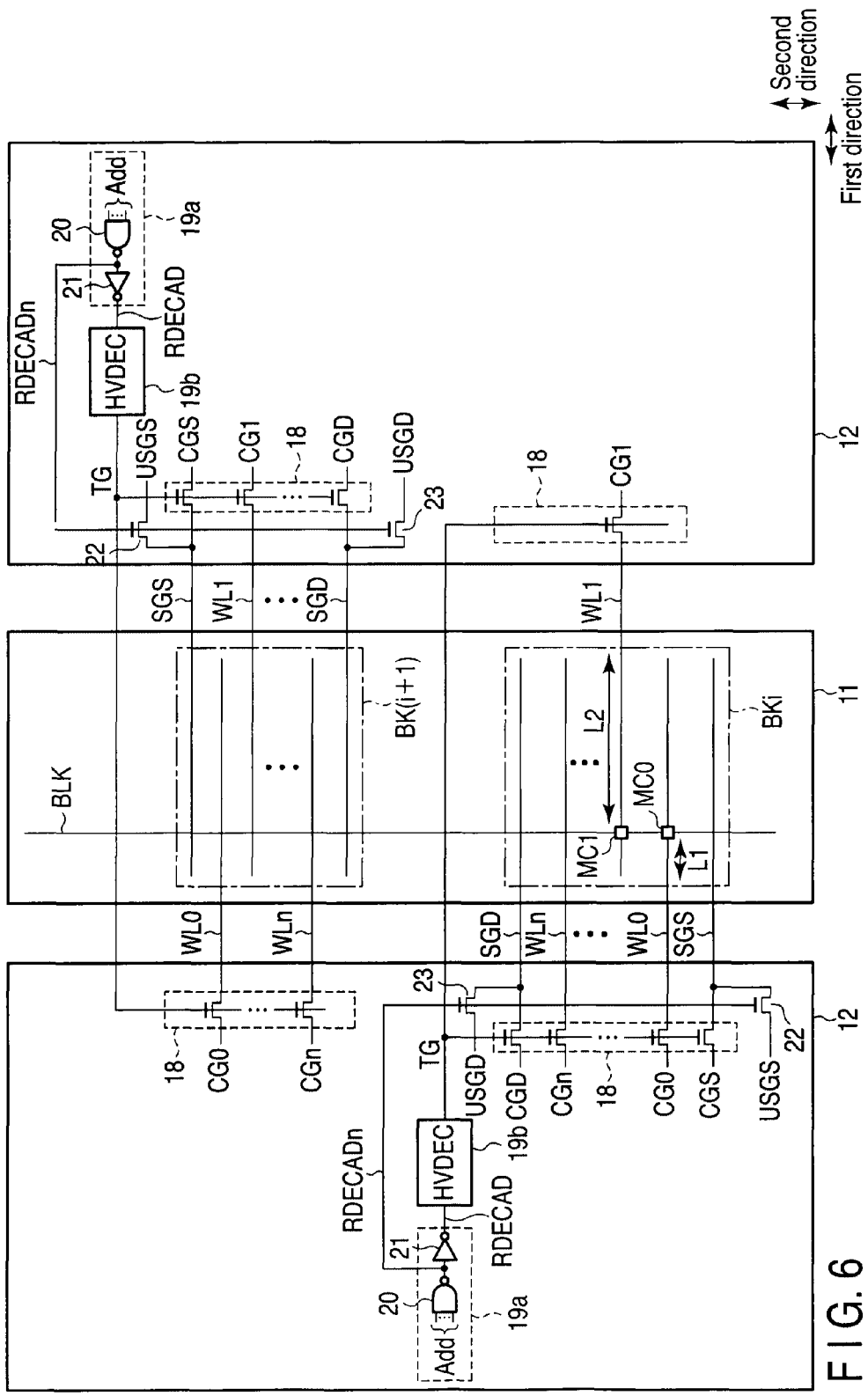
FIG. 6 illustrates a second example of a layout of row decoder.

FIG. 6 illustrates a second example of the layout of the row decoders.

The second example is a modification of the first example.

One of the features of the layout of the second example is that, similarly to the first example, the row decoders 12 are disposed at both ends in the first direction of the memory cell array 11.

The memory cell array 11 comprises the two NAND blocks BKi and BK(i+1) that are disposed in parallel in the second direction.

The even-numbered word lines WL0, ..., and WLn and select gate lines SGS and SGD in the NAND block BKi are connected to the row decoder 12 that is disposed on the left of the memory cell array 11. The odd-numbered word lines WL1, ..., in the NAND block BKi are connected to the row decoder 12 that is disposed on the right of the memory cell array 11.

The odd-numbered word lines WL1, ... and select gate lines SGS and SGD in the NAND block BK(i+1) are connected to the row decoder 12 that is disposed on the right of the memory cell array 11. The even-numbered word lines WL0, ..., and WLn in the NAND block BK(i+1) are connected to the row decoder 12 that is disposed on the left of the memory cell array 11.

The row decoder 12 comprises the transfer transistor block 18 that is connected to the word lines WL0, WL1, ..., and WLn and select gate lines SGS and SGD, the transfer transistor 22 that is connected to the select gate line SGS, and the transfer transistor 23 that is connected to the select gate line SGD.

The row decoder 12 comprises the low-voltage decoder 19a and the high-voltage decoder 19b. The low-voltage decoder 19a comprises the NAND gate 20 and the inverter 21 and outputs the control signals RDECAD and RDECADn based on the row address signal Add.

There is a complementary relationship between the values of the control signals RDECAD and RDECADn.

The high-voltage decoder 19b acts as the level shifter and boosts the potential level of the control signal RDECAD to output the transfer control signal TG.

When the NAND block BKi is selected, all the row address signals Add that are input to the NAND gate 20 in the row decoder 12 connected to the NAND block BKi become "H", and the transfer control signal TG becomes "H", thereby turning on the transfer transistor block 18. The control signal RDECADn becomes "L", thereby turning off the transfer transistors 22 and 23.

At this point, in the row decoder 12 connected to the unselected NAND block BK(i+1), because all the row address signals Add input to the NAND gate 20 do not become "H", the transfer control signal TG becomes "L", and the transfer transistor block 18 is turned off. Because the control signal RDECADn becomes "H", the transfer transistors 22 and 23 are turned on.

The transfer transistors 22 and 23 are turned on, whereby the select gate lines SGS and SGD are electrically connected to the signal lines USGS and USGD, respectively.

In the layout of the second example, part of the word lines WL0, WL1, ..., and WLn in the one NAND block BKi is driven by the row decoder 12 that is disposed on the left of the NAND block BKi, and other word lines WL0, WL1, ..., and WLn are driven by the row decoder 12 that is disposed on the right of the NAND block BKi.

In such cases, for example, because the memory cells MC0 and MC1 connected to the one bit line BLk have different distances L1 and L2 from the row decoders 12, a memory cell access characteristic varies in the one NAND block BKi. The variation is a factor of the degradation of the chip performance.

The layout of the second example also has the same problem as the first example.

C. Third Example

Embodiment

Figure 7:
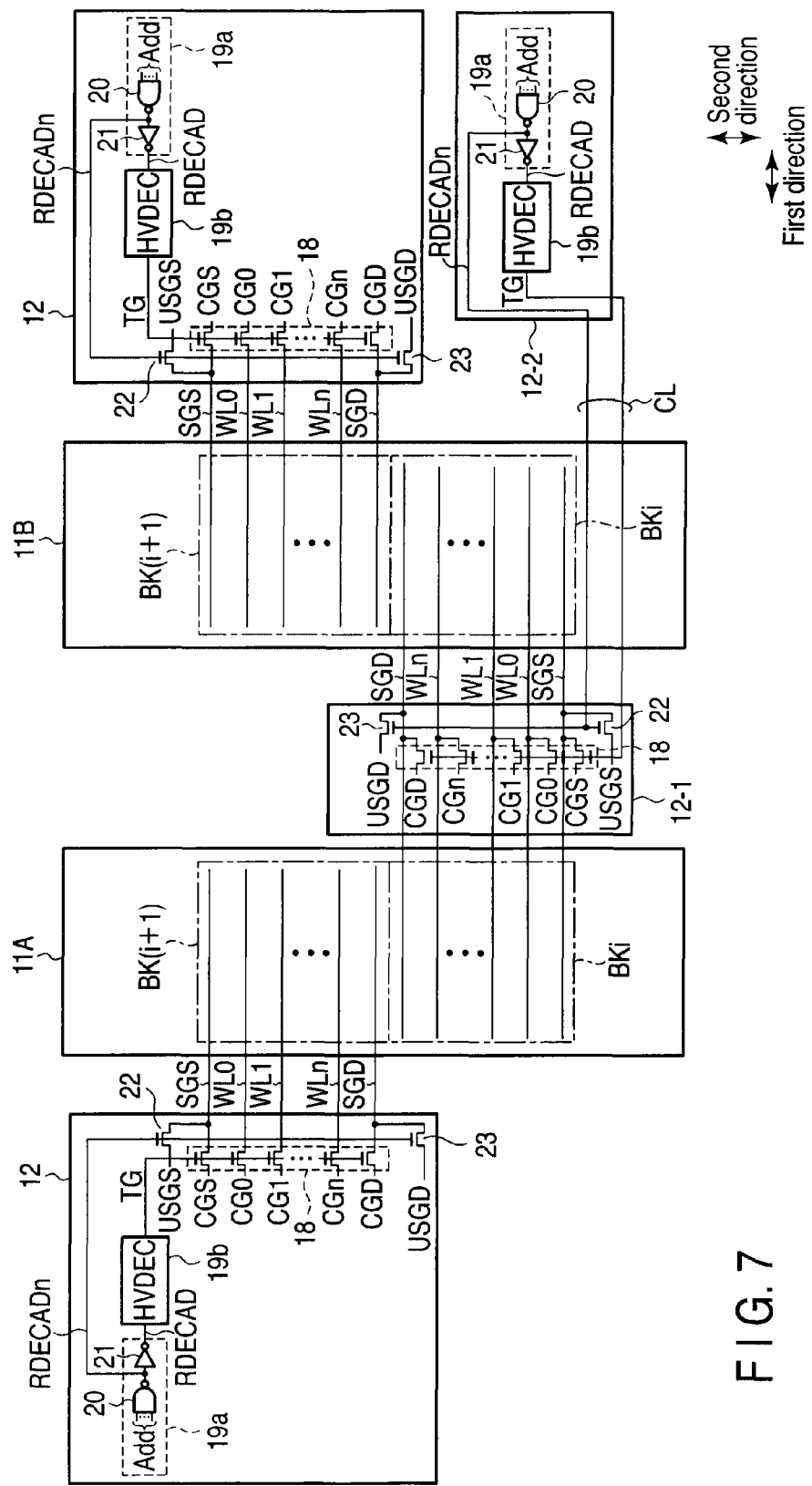
FIG. 7 illustrates a third example of a layout of row decoder.

FIG. 7 illustrates a third example of the layout of the row decoders.

One of the features of the layout of the third example is that a row decoder 12-1 is disposed between two memory planes 11A and 11B.

The memory planes 11A and 11B are disposed in parallel in the first direction, and each of the memory planes 11A and 11B comprises two NAND blocks BKi and BK(i+1) that are disposed in parallel in the second direction.

The word lines WL0, WL1, ..., and WLn and select gate lines SGS and SGD in the NAND block BKi of each of the memory planes 11A and 11B are connected to the row decoder 12-1 disposed between the memory planes 11A and 11B.

The word lines WL0, WL1, ..., and WLn and select gate lines SGS and SGD in the NAND block BK(i+1) of the memory plane 11A are connected to the row decoder 12 that is disposed on the left of the memory plane 11A.

The word lines WL0, WL1, ..., and WLn and select gate lines SGS and SGD in the NAND block BK(i+1) of the memory plane 11B are connected to the row decoder 12 that is disposed on the right of the memory plane 11B.

Each of the row decoders 12 and 12-1 comprises the transfer transistor block 18 that is connected to the word lines WL0, WL1, ..., and WLn and select gate lines SGS and SGD, the transfer transistor 22 that is connected to the select gate line SGS, and the transfer transistor 23 that is connected to the select gate line SGD.

Each of the row decoders 12 and 12-2 comprises the low-voltage decoder 19a and the high-voltage decoder 19b. The low-voltage decoder 19a comprises the NAND gate 20 and the inverter 21 and outputs the control signals RDECAD and RDECADn based on the row address signal Add.

There is a complementary relationship between the values of the control signals RDECAD and RDECADn.

The high-voltage decoder 19b acts as the level shifter and boosts the potential level of the control signal RDECAD to output the transfer control signal TG.

When the NAND block BKi is selected, all the row address signals Add that are input to the NAND gate 20 in the row decoder 12-2 connected to the NAND block BKi become "H", and the transfer control signal TG becomes "H", thereby turning on the transfer transistor block 18 in the row decoder 12-1. The control signal RDECADn becomes "L", thereby turning off the transfer transistors 22 and 23 in the row decoder 12-1.

At this point, in the row decoder 12 connected to the unselected NAND block BK(i+1), because all the row address signals Add input to the NAND gate 20 do not become "H", the transfer control signal TG becomes "L", and the transfer transistor block 18 is turned off. Because the control signal RDECADn becomes "H", the transfer transistors 22 and 23 are turned on.

The transfer transistors 22 and 23 are turned on, whereby the select gate lines SGS and SGD are electrically connected to the signal lines USGS and USGD, respectively.

In the layout of the third example, the row decoder 12-1 is shared by the two NAND blocks BKi in the memory planes 11A and 11B, so that the increase in the number of row decoders can be suppressed when the number of memory planes increases.

In the third example, the row decoder 12-2 is provided on the right of the memory plane 11B. Alternatively, the row decoder 12-2 may be provided on the left of the memory plane 11A.

The two row decoders 12-1 and 12-2 are connected through the control signal line CL. The control signal line CL may be disposed on the NAND block BKi or the NAND block BK(i+1).

Thus, in the third example, the row decoder 12-1 is shared by the two NAND blocks BKi in the memory planes 11A and 11B, so that the chip performance can be improved without the chip area enlargement caused by the increase in the number of row decoders.

D. Fourth Example

Embodiment

Figure 8:
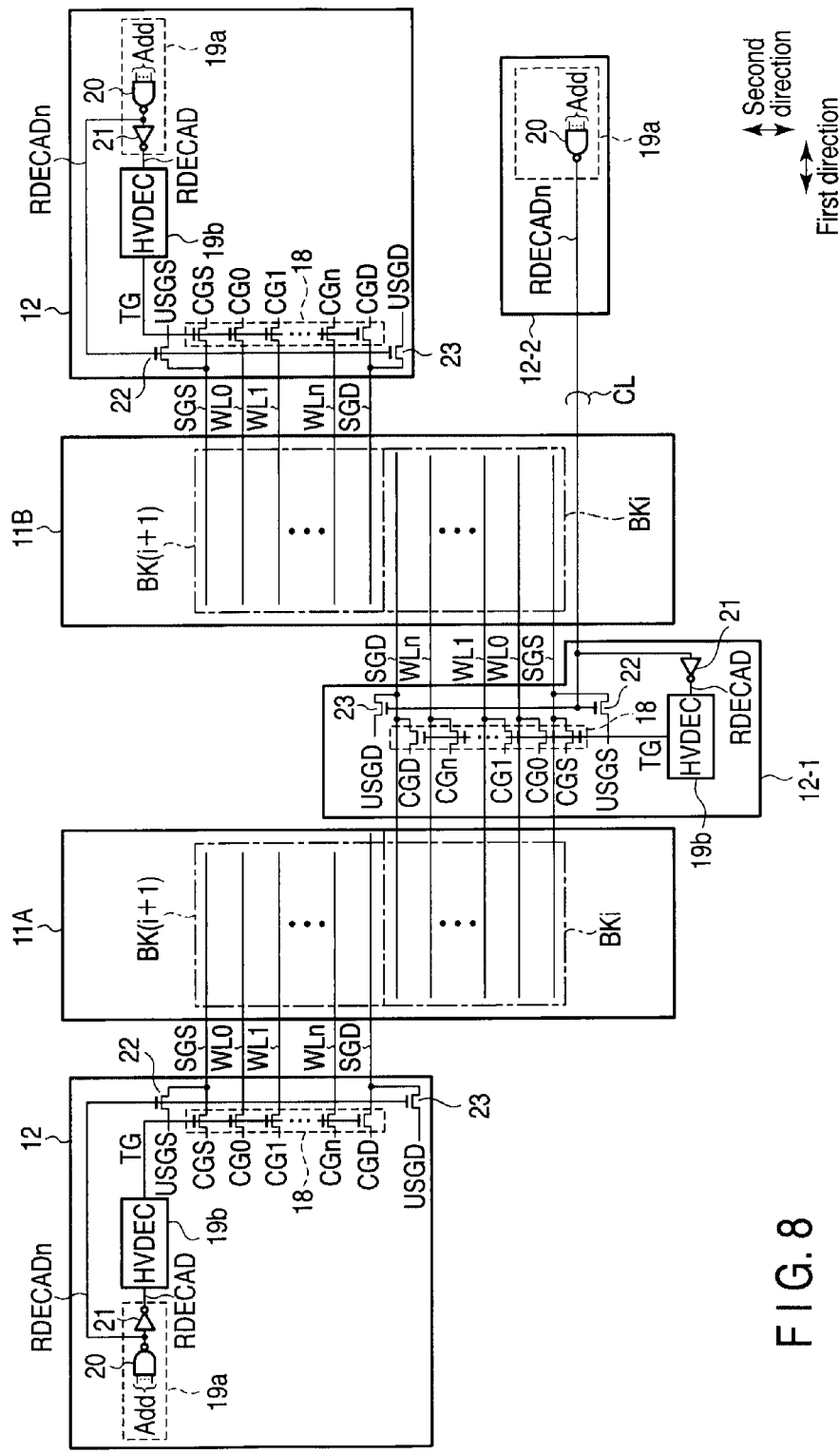
FIG. 8 illustrates a fourth example of a layout of row decoder.

FIG. 8 illustrates a fourth example of the layout of the row decoders.

The fourth example is a modification of the third example.

One of the features of the layout of the fourth example is that, similarly to the third example, the row decoder 12-1 is disposed between the two memory planes 11A and 11B.

The fourth example differs from the third example only in the structures of the row decoders 12-1 and 12-2. Because other structures of the fourth example are completely identical to those of the third example, the description thereof is omitted.

The row decoder 12-1 comprises the transfer transistor block 18 that is connected to the word lines WL0, WL1, ..., and WLn and select gate lines SGS and SGD, the transfer transistor 22 that is connected to the select gate line SGS, and the transfer transistor 23 that is connected to the select gate line SGD. The row decoder 12-1 comprises the high-voltage decoder 19b and the inverter 21.

The row decoder 12-2 comprises the low-voltage decoder 19a. The low-voltage decoder 19a comprises the NAND gate 20 and outputs the control signal RDECAD based on the row address signal Add.

The control signal RDECADn in which the control signal RDECAD is inverted by the inverter 21 is input to the high-voltage decoder 19b. The high-voltage decoder 19b outputs the transfer control signal TG.

In the layout of the fourth example, the high-voltage decoder 19b and the inverter 21 are disposed between the memory planes 11A and 11B, which allows the number of control signal lines CL to decrease to one from two necessary for the third example.

However, because the number of circuits disposed between the memory planes 11A and 11B increases, it is determined whether the layout of the third example or the layout of the fourth example is adopted in consideration of the chip performance or the whole area of the chip.

The control signal line CL may be disposed on the NAND block BKi or the NAND block BK(i+1).

E. Fifth Example

Embodiment

FIG. 9 illustrates a fifth example of the layout of the row decoders.

The fifth example relates to a position of the row decoder 12-2.

In FIG. 9, NAND blocks BKi and BK(i+1) correspond to the NAND blocks BKi and BK(i+1) of FIG. 7. The NAND blocks BKi and BK(i+1) are identical to NAND blocks BK(i+2) and BK(i+3) in the layout of the row decoders 12, 12-1, and 12-2.

The row decoder 12-1 shared by the NAND blocks BKi in the two memory planes 11A and 11B is disposed between the memory planes 11A and 11B, and the row decoder 12-2 is disposed on the right of the memory plane 11B.

Similarly, the row decoder 12-1 shared by the NAND blocks BK(i+2) in the two memory planes 11A and 11B is disposed between the memory planes 11A and 11B, and the row decoder 12-2 is disposed on the right of the memory plane 11B.

In the fifth example, all the row decoders 12-2 are collectively disposed on the right of the memory plane 11B. Alternatively, all the row decoders 12-2 may collectively be disposed on the left of the memory plane 11A.

The row decoders 12-2 are collected into one point, whereby the row decoders can efficiently be disposed, and therefore the reduction of the chip area can be achieved.

The fifth example can also be applied to the layout of FIG. 8. In this case, the number of control signal lines CL of FIG. 9 becomes one.

F. Sixth Example

Embodiment

Figure 10:
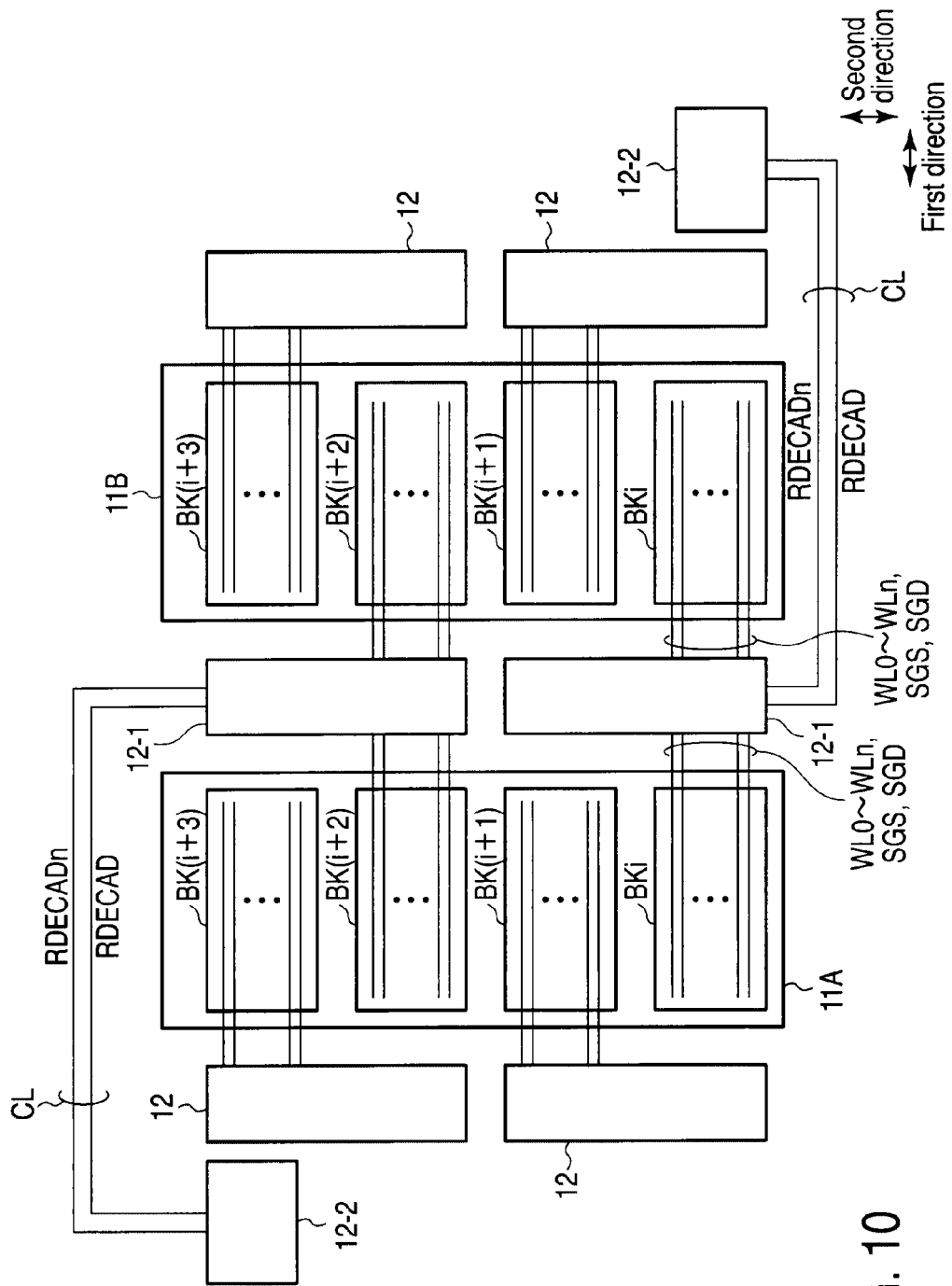
FIG. 10 illustrates a sixth example of a layout of row decoder.

FIG. 10 illustrates a sixth example of the layout of the row decoders.

The sixth example also relates to the position of the row decoder 12-2.

In FIG. 10, NAND blocks BKi and BK(i+1) correspond to the NAND blocks BKi and BK(i+1) of FIG. 7. The NAND blocks BKi and BK(i+1) are identical to the NAND blocks BK(i+2) and BK(i+3) in the layout of the row decoders 12, 12-1, and 12-2.

The row decoder 12-1 shared by the NAND blocks BKi in the two memory planes 11A and 11B is disposed between the memory planes 11A and 11B, and the row decoder 12-2 is disposed on the right of the memory plane 11B.

On the other hand, the row decoder 12-1 shared by the NAND blocks BK(i+2) in the two memory planes 11A and 11B is disposed between the memory planes 11A and 11B, and the row decoder 12-2 is disposed on the left of the memory plane 11A.

In the sixth example, one of the row decoders 12-2 is disposed on the right of the memory plane 11B, and the other row decoder 12-2 is disposed on the left of the memory plane 11A. That is, the row decoders 12-2 are disposed on both sides of the memory planes 11A and 11B.

The row decoders 12-2 are dispersed into the right and left, whereby the row decoders can efficiently be disposed, and therefore the reduction of the chip area can be achieved.

The sixth example can also be applied to the layout of FIG. 8. In this case, the number of control signal lines CL of FIG. 10 becomes one.

G. Seventh Example Embodiment

Figure 11:
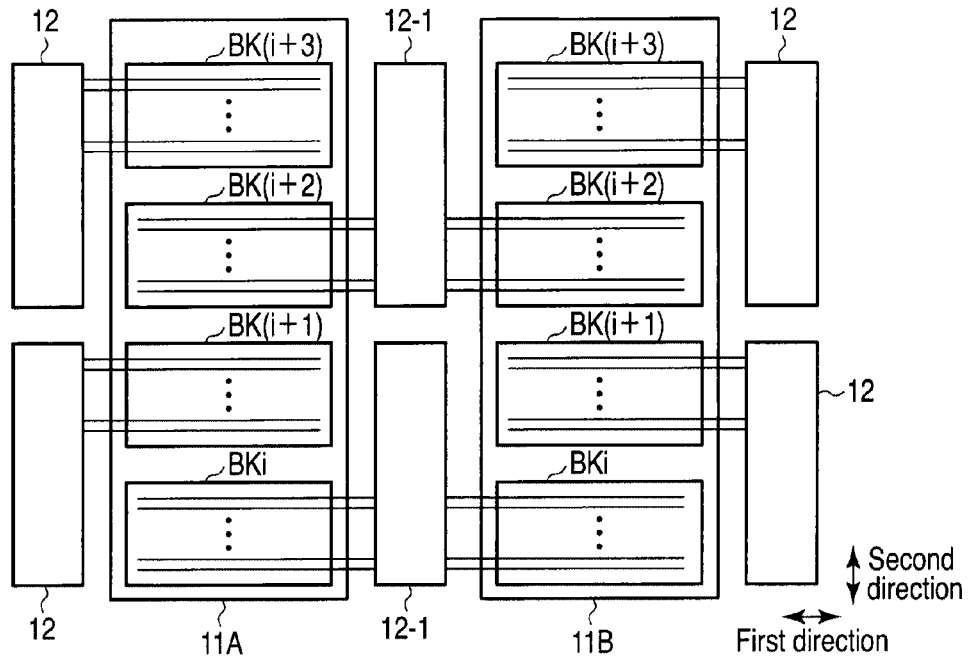
FIG. 11 illustrates a seventh example of a layout of row decoder.

FIG. 11 illustrates a seventh example of the layout of the row decoders.

The seventh example relates to the order of the NAND block that shares the row decoder and the NAND block that does not share the row decoder.

The word lines and select gate lines in the NAND blocks BKi of the two memory planes 11A and 11B are commonly connected to the row decoder 12-1 that is located between the memory planes 11A and 11B.

The word lines and select gate lines in the NAND block BK(i+1) of the memory plane 11A are connected to the row decoder 12 that is located on the left of the memory plane 11A.

The word lines and select gate lines in the NAND block BK(i+1) of the memory plane 11B are connected to the row decoder 12 that is located on the right of the memory plane 11B.

The word lines and select gate lines in the NAND blocks BK(i+2) of the two memory planes 11A and 11B are commonly connected to the row decoder 12-1 that is located between the memory planes 11A and 11B.

The word lines and select gate lines in the NAND block BK(i+3) of the memory plane 11A are connected to the row decoder 12 that is located on the left of the memory plane 11A.

The word lines and select gate lines in the NAND block BK(i+3) of the memory plane 11B are connected to the row decoder 12 that is located on the right of the memory plane 11B.

In the seventh example, the layout is repeated in the second direction.

That is, the NAND block that shares the row decoder and the NAND block that does not share the row decoder are alternately disposed in the seventh example.

The complicated interconnection can be prevented by regularizing the order of the NAND blocks. Therefore, the reduction of the chip area can be achieved.

The row decoder 12-2 in the fifth example and sixth example is eliminated in the seventh example. However, the row decoder 12-2 in the fifth example and sixth example can be applied to the seventh example.

H. Eighth Example Embodiment

Figure 12:
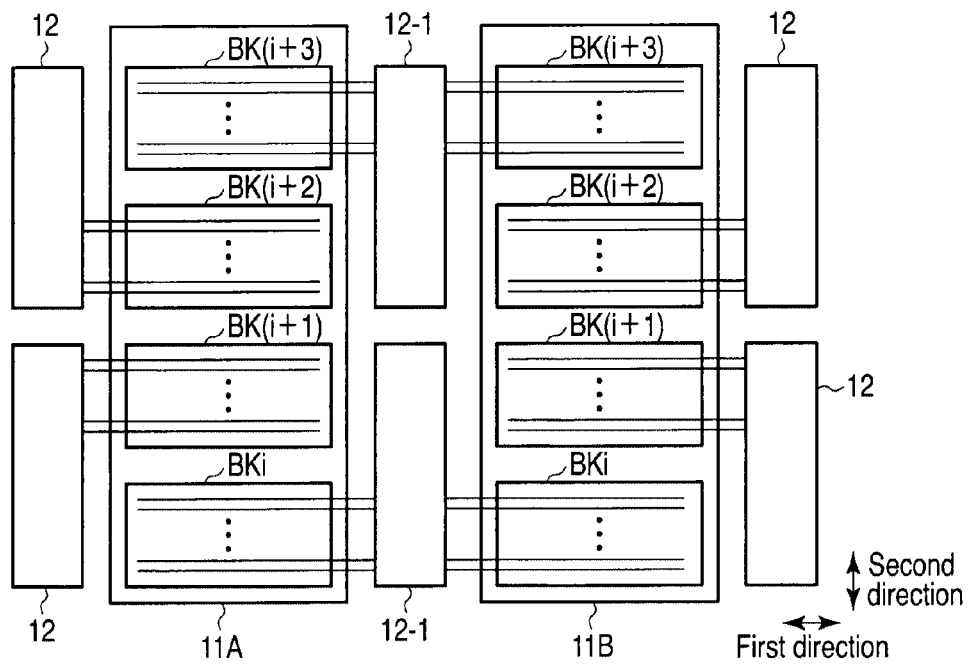
FIG. 12 illustrates an eighth example of a layout of row decoder.

FIG. 12 illustrates an eighth example of the layout of the row decoders.

The eighth example also relates to the order of the NAND block that shares the row decoder and the NAND block that does not share the row decoder.

The word lines and select gate lines in the NAND blocks BKi of the two memory planes 11A and 11B are commonly connected to the row decoder 12-1 that is located between the memory planes 11A and 11B.

The word lines and select gate lines in the NAND block BK(i+1) of the memory plane 11A are connected to the row decoder 12 that is located on the left of the memory plane 11A.

The word lines and select gate lines in the NAND block BK(i+1) of the memory plane 11B are connected to the row decoder 12 that is located on the right of the memory plane 11B.

The word lines and select gate lines in the NAND block BK(i+2) of the memory plane 11A are connected to the row decoder 12 that is located on the left of the memory plane 11A.

The word lines and select gate lines in the NAND block BK(i+2) of the memory plane 11B are connected to the row decoder 12 that is located on the right of the memory plane 11B.

The word lines and select gate lines in the NAND blocks BK(i+3) of the two memory planes 11A and 11B are commonly connected to the row decoder 12-1 that is located between the memory planes 11A and 11B.

In the eighth example, the layout is repeated in the second direction.

That is, the NAND blocks that share the row decoder and the NAND blocks that do not share the row decoder are disposed at intervals of two NAND blocks in the eighth example.

The complicated interconnection can be prevented by regularizing the order of the NAND blocks. Therefore, the reduction of the chip area can be achieved.

The row decoder 12-2 in the fifth example and sixth example is eliminated in the eighth example. However, the row decoder 12-2 in the fifth example and sixth example can be applied to the eighth example.

I. Ninth Example Embodiment

FIG. 13 illustrates a ninth example of the layout of the row decoders.

The ninth example also relates to the order of the NAND block that shares the row decoder and the NAND block that does not share the row decoder.

The word lines and select gate lines in the NAND block BKi of the memory plane 11A are connected to the row decoder 12 that is located on the left of the memory plane 11A.

The word lines and select gate lines in the NAND block BKi of the memory plane 11B are connected to the row decoder 12 that is located on the right of the memory plane 11B.

The word lines and select gate lines in the NAND blocks BK(i+1) of the two memory planes 11A and 11B are commonly connected to the row decoder 12-1 that is located between the memory planes 11A and 11B.

The word lines and select gate lines in the NAND blocks BK(i+2) of the two memory planes 11A and 11B are commonly connected to the row decoder 12-1 that is located between the memory planes 11A and 11B.

The word lines and select gate lines in the NAND block BK(i+3) of the memory plane 11A are connected to the row decoder 12 that is located on the left of the memory plane 11A.

The word lines and select gate lines in the NAND block BK(i+3) of the memory plane 11B are connected to the row decoder 12 that is located on the right of the memory plane 11B.

In the ninth example, the layout is repeated in the second direction.

That is, the NAND blocks that share the row decoder and the NAND blocks that do not share the row decoder are disposed at intervals of two NAND blocks in the ninth example.

The complicated interconnection can be prevented by regularizing the order of the NAND blocks. Therefore, the reduction of the chip area can be achieved.

The row decoder 12-2 in the fifth example and sixth example is eliminated in the ninth example. However, the row decoder 12-2 in the fifth example and sixth example can be applied to the ninth example.

J. Tenth Example

Embodiment

FIG. 14 illustrates a tenth example of the layout of the row decoders.

The tenth example also relates to the order of the NAND block that shares the row decoder and the NAND block that does not share the row decoder.

The word lines and select gate lines in the NAND blocks BKi of the two memory planes 11A and 11B are commonly connected to the row decoder 12-1 that is located between the memory planes 11A and 11B.

The word lines and select gate lines in the NAND blocks BK(i+1) of the two memory planes 11A and 11B are commonly connected to the row decoder 12-1 that is located between the memory planes 11A and 11B.

The word lines and select gate lines in the NAND block BK(i+2) of the memory plane 11A are connected to the row decoder 12 that is located on the left of the memory plane 11A.

The word lines and select gate lines in the NAND block BK(i+2) of the memory plane 11B are connected to the row decoder 12 that is located on the right of the memory plane 11B.

The word lines and select gate lines in the NAND block BK(i+3) of the memory plane 11A are connected to the row decoder 12 that is located on the left of the memory plane 11A.

The word lines and select gate lines in the NAND block BK(i+3) of the memory plane 11B are connected to the row decoder 12 that is located on the right of the memory plane 11B.

In the tenth example, the layout is repeated in the second direction.

That is, the NAND blocks that share the row decoder and the NAND blocks that do not share the row decoder are disposed at intervals of two NAND blocks in the tenth example.

The complicated interconnection can be prevented by regularizing the order of the NAND blocks. Therefore, the reduction of the chip area can be achieved.

The row decoder 12-2 in the fifth example and sixth example is eliminated in the tenth example.

However, the row decoder 12-2 in the fifth example and sixth example can be applied to the tenth example.

K. Eleventh Example

Embodiment

FIG. 15 illustrates an eleventh example of the layout of the row decoders.

The eleventh example relates to the layout in which four memory planes 11A, 11B, 11C, and 11D are provided.

Each of the two memory planes 11A and 11B comprises the four NAND blocks BKi, BK(i+1), BK(i+2), and BK(i+3). The layout of the NAND blocks BKi, BK(i+1), BK(i+2), and BK(i+3) is identical to that of the seventh example.

However, the layout of the NAND blocks BKi, BK(i+1), BK(i+2), and BK(i+3) may be identical to one of those of the eighth to tenth examples.

Each of the two memory planes 11C and 11D comprises four NAND blocks BKi, BK(i+1), BK(i+2), and BK(i+3). The layout of the NAND blocks BKi, BK(i+1), BK(i+2), and BK(i+3) is identical to that of the seventh example.

However, the layout of the NAND blocks BKi, BK(i+1), BK(i+2), and BK(i+3) may be identical to one of those of the eighth to tenth examples.

In the eleventh example, for example, the same layout as that of the seventh example may be adopted as well as the layout of the seventh example.

The chip performance degradation caused by the lengthened word lines and select gate lines can be prevented by increasing the number of memory planes to four.

L. Twelfth Example

Embodiment

Figure 16:
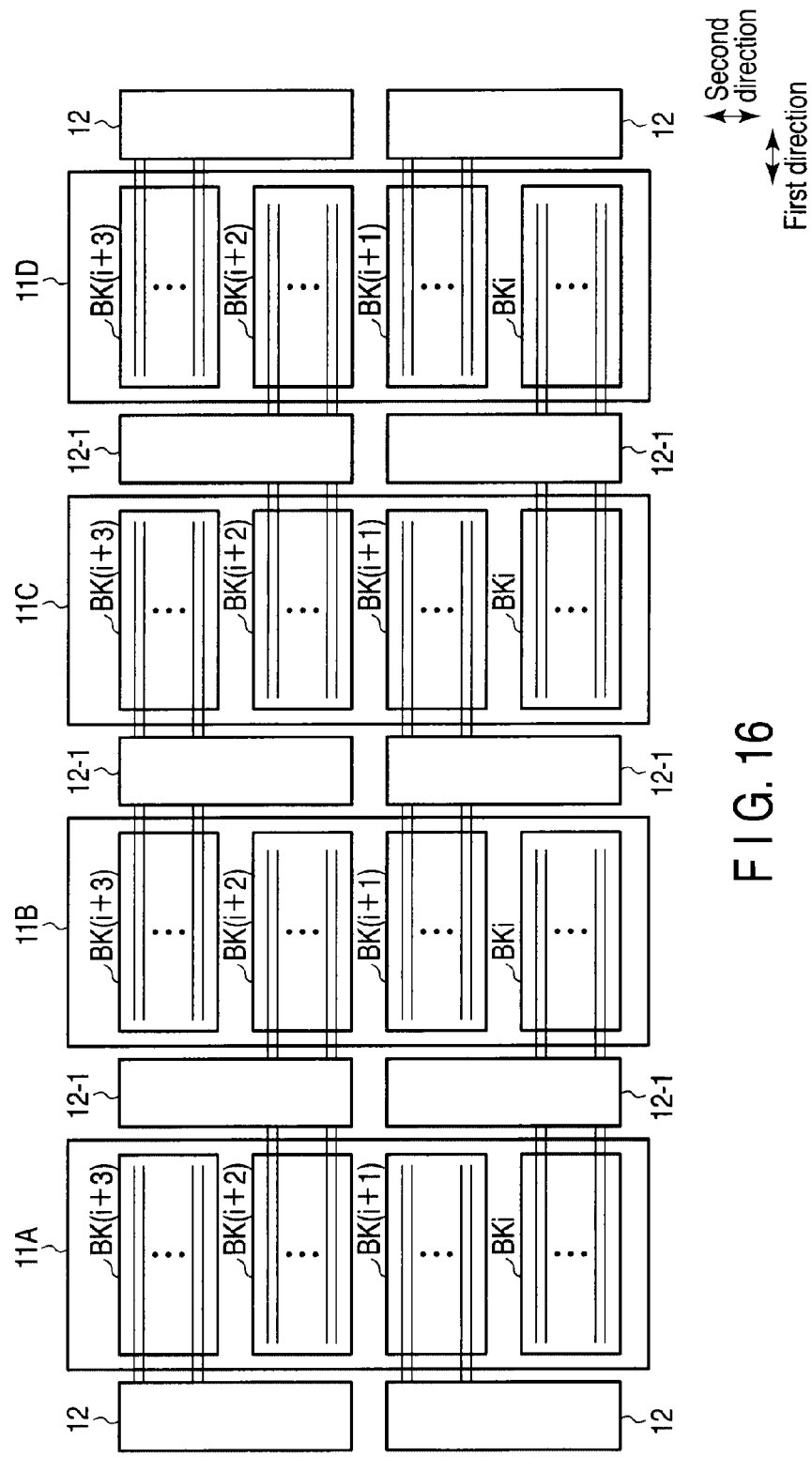
FIG. 16 illustrates a twelfth example of a layout of row decoder.

FIG. 16 illustrates a twelfth example of the layout of the row decoders.

The twelfth example is a modification of the eleventh example.

One of the features of the layout of the twelfth example is that the row decoder 12-1 located between the two memory planes 11B and 11C is shared by the NAND blocks of the memory planes 11B and 11C.

The word lines and select gate lines in the NAND blocks BK(i+1) of the two memory planes 11B and 11C are commonly connected to the row decoder 12-1 that is located between the memory planes 11B and 11C.

The word lines and select gate lines in the NAND blocks BK(i+3) of the two memory planes 11B and 11C are commonly connected to the row decoder 12-1 that is located between the memory planes 11B and 11C.

Because other structures of the twelfth example are identical to those of the eleventh example, the description thereof is omitted.

The four memory planes are formed, and the row decoder 12-1 located between the memory planes 11B and 11C is shared by the NAND blocks of the memory planes 11B and 11C. Therefore, the improvement of the chip performance and the reduction of the chip area can simultaneously be realized.

M. Thirteenth Example

Embodiment

Figure 17:
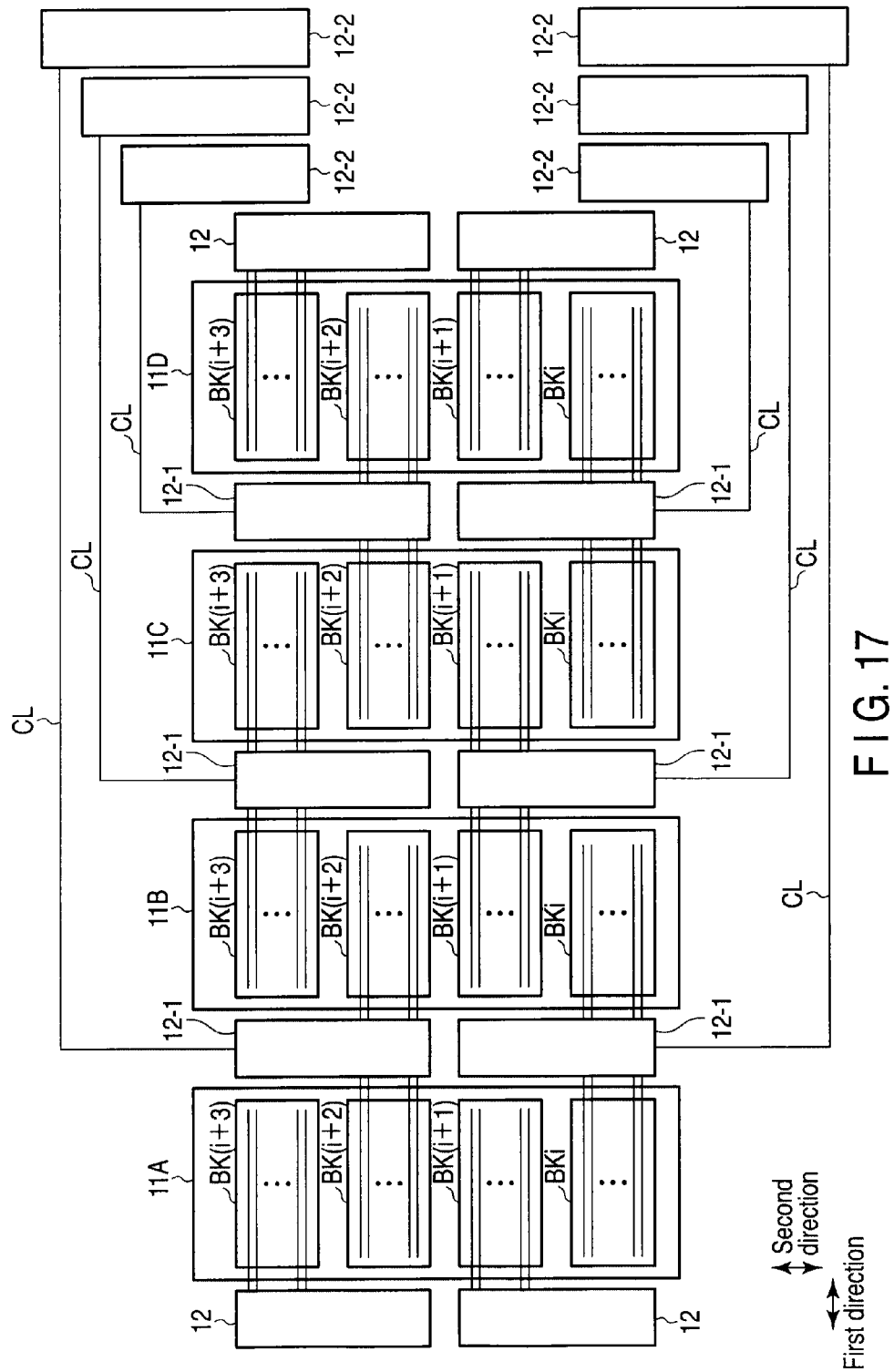
FIG. 17 illustrates a thirteenth example of a layout of row decoder.

FIG. 17 illustrates a thirteenth example of the layout of the row decoders.

One of the features of the thirteenth example is that the row decoder 12-2 is further added to the layout of the twelfth example.

The row decoder 12-1 shared by the NAND blocks BKi in the two memory planes 11A and 11B is disposed between the memory planes 11A and 11B, and the row decoder 12-2 is disposed on the right of the memory plane 11D.

Similarly, the row decoder 12-1 shared by the NAND blocks BK(i+2) in the two memory planes 11A and 11B is disposed between the memory planes 11A and 11B, and the row decoder 12-2 is disposed on the right of the memory plane 11D.

The row decoder 12-1 shared by the NAND blocks BK(i+1) in the two memory planes 11B and 11C is disposed between the memory planes 11B and 11C, and the row decoder 12-2 is disposed on the right of the memory plane 11D.

Similarly, the row decoder 12-1 shared by the NAND blocks BK(i+3) in the two memory planes 11B and 11C is disposed between the memory planes 11B and 11C, and the row decoder 12-2 is disposed on the right of the memory plane 11D.

The row decoder 12-1 shared by the NAND blocks BKi in the two memory planes 11C and 11D is disposed between the memory planes 11C and 11D, and the row decoder 12-2 is disposed on the right of the memory plane 11D.

Similarly, the row decoder 12-1 shared by the NAND blocks BK(i+2) in the two memory planes 11C and 11D is disposed between the memory planes 11C and 11D, and the row decoder 12-2 is disposed on the right of the memory plane 11D.

In the thirteenth example, all the row decoders 12-2 are collectively disposed on the right of the memory plane 11D. Alternatively, all the row decoders 12-2 may collectively be disposed on the left of the memory plane 11A.

The row decoders 12-2 are collected into one point, whereby the row decoders can efficiently be disposed, and therefore the reduction of the chip area can be achieved.

The thirteenth example can also be applied to the layouts of FIGS. 7 and 8. That is, the thirteenth example corresponds to the layout of FIG. 7 for the two control signal lines CL, and corresponds to the layout of FIG. 8 for the one control signal line CL.

N. Fourteenth Example

Embodiment

Figure 18:
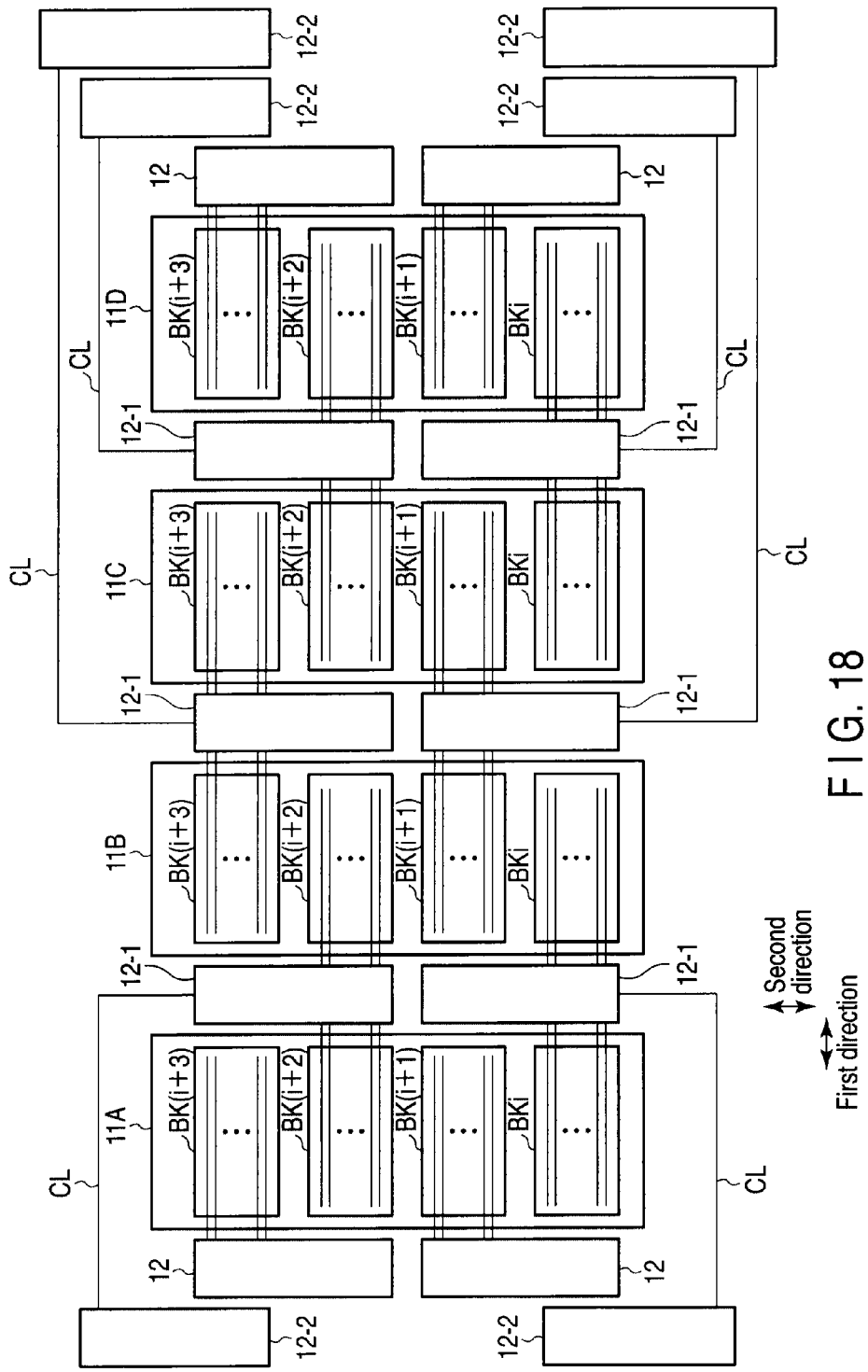
FIG. 18 illustrates a fourteenth example of a layout of row decoder.

FIG. 18 illustrates a fourteenth example of the layout of the row decoders.

Another feature of the fourteenth example is that the row decoder 12-2 is further added to the layout of the twelfth example.

The row decoder 12-1 shared by the NAND blocks BKi in the two memory planes 11A and 11B is disposed between the memory planes 11A and 11B, and the row decoder 12-2 is disposed on the left of the memory plane 11A.

Similarly, the row decoder 12-1 shared by the NAND blocks BK(i+2) in the two memory planes 11A and 11B is disposed between the memory planes 11A and 11B, and the row decoder 12-2 is disposed on the left of the memory plane 11A.

The row decoder 12-1 shared by the NAND blocks BK(i+1) in the two memory planes 11B and 11C is disposed between the memory planes 11B and 11C, and the row decoder 12-2 is disposed on the right of the memory plane 11D.

Similarly, the row decoder 12-1 shared by the NAND blocks BK(i+3) in the two memory planes 11B and 11C is disposed between the memory planes 11B and 11C, and the row decoder 12-2 is disposed on the right of the memory plane 11D.

The row decoder 12-1 shared by the NAND blocks BKi in the two memory planes 11C and 11D is disposed between the memory planes 11C and 11D, and the row decoder 12-2 is disposed on the right of the memory plane 11D.

Similarly, the row decoder 12-1 shared by the NAND blocks BK(i+2) in the two memory planes 11C and 11D is disposed between the memory planes 11C and 11D, and the row decoder 12-2 is disposed on the right of the memory plane 11D.

In the fourteenth example, part of the row decoders 12-2 is disposed on the right of the memory plane 11D, and the remaining row decoders 12-2 are disposed on the left of the memory plane 11A. That is, the row decoders 12-2 are disposed on both sides of the memory planes 11A, 11B, 11C, and 11D.

The row decoders 12-2 are dispersed into the right and left, whereby the row decoders can efficiently be disposed, and therefore the reduction of the chip area can be achieved.

The fourteenth example can also be applied to the layouts of FIGS. 7 and 8. That is, the fourteenth example corresponds to the layout of FIG. 7 for the two control signal lines CL, and corresponds to the layout of FIG. 8 for the one control signal line CL.

O. Summary

As described above, the layouts of the third to fourteenth examples can solve the problem in that the increase in the number of row decoders is suppressed even if the number of memory planes increases in one chip due to the increase in the memory capacity.

(4) Circuit Controlling Time Constant

In the layout of the row decoders of the embodiment, there are two kinds of the row decoders, that is, the row decoder that drives the (one) word line in the one NAND block and the row decoder that drives the (two) word lines in the two NAND blocks.

The load difference serves as the difference in time constant when the potential is transferred to the word line, and the word lines differ from one another in the potential transfer rate.

For example, a driver that controls the time constant in transferring the potential to the word line is newly provided, the potential transfer rate is controlled in each word line, and the equalization of the potential transfer rate is achieved in all the word lines.

FIG. 19 illustrates an example of the NAND type flash memory.

The structures of the memory planes 11A and 11B and row decoder 12 are identical to those of FIG. 7. Because the structures have been already described in FIG. 7, the same numerals as those of FIG. 7 are used in FIG. 19, and the description thereof is omitted.

The potential transfer lines CG0, CG1, . . . , and CGn are connected to the word lines WL0, WL1, . . . , and WLn through the transfer transistor block 18. The potential transfer lines CG0, CG1, . . . , and CGn extend in the second direction, and ends of the potential transfer lines CG0, CG1, . . . , and CGn are connected to drivers 24a, 24b, and 24c.

The drivers 24a, 24b, and 24c control the time constant when the potential produced by the booster 16 is transferred to the word lines WL0, WL1, . . . , and WLn.

Specifically, the load used to drive the word lines WL0, WL1, . . . , and WLn in the NAND block BKi becomes approximately double the load used to drive the word lines WL0, WL1, . . . , and WLn in the NAND block BK(i+1).

For example, the drivers 24a and 24c increase the load used to drive the word lines WL0, WL1, . . . , and WLn in the NAND block BKi, and the driver 24b decreases the load used to drive the word lines WL0, WL1, . . . , and WLn in the NAND block BK(i+1).

Therefore, the loads are equalized for all the NAND blocks BKi and BK(i+1) when the potential is transferred to the word lines WL0, WL1, . . . , and WLn, and the potential transfer rate is equalized when the potential is transferred to the word lines WL0, WL1, . . . , and WLn in all the NAND blocks BKi and BK(i+1).

FIGS. 20 to 22 illustrate examples of a circuit that controls the time constant.

In the example of FIG. 20, each of the drivers 24a, 24b, and 24c comprises a switch element (MOS transistor) T and a resistive element R1.

When the time constant is increased in transferring the potential to the word line, a control signal φ is set to "L", and the resistive element R1 is connected in series between the booster 16 and the row decoder 12. When the time constant is decreased in transferring the potential to the word line, the control signal φ is set to "H", and the booster 16 and the row decoder 12 are connected directly.

In the example of FIG. 21, each of the drivers 24a, 24b, and 24c comprises the switch element (MOS transistor) T and resistive elements R1 and R2.

Resistance values of the resistive elements R1 and R2 may be identical to or different from each other.

When the time constant is increased in transferring the potential to the word line, the control signal φ is set to "L", and the resistive element R1 is connected in series between the booster 16 and the row decoder 12. When the time constant is decreased in transferring the potential to the word line, the control signal φ is set to "H", and the resistive elements R1 and R2 are connected in parallel between the booster 16 and the row decoder 12.

In the example of FIG. 22, each of the drivers 24a, 24b, and 24c comprises the switch element (MOS transistor) T and the resistive elements R1 and R2.

The resistance values of the resistive elements R1 and R2 may be identical to or different from each other.

When the time constant is increased in transferring the potential to the word line, the control signal φ is set to "L", and the resistive elements R1 and R2 are connected in series between the booster 16 and the row decoder 12. When the time constant is decreased in transferring the potential to the word line, the control signal φ is set to "H", and the resistive element R2 is connected in series between the booster 16 and the row decoder 12.

FIG. 23 illustrates a timing chart during the write.

In the unselected block that does not include the memory cell of the write target, the potentials at the transfer control signal TG and select gate line SGS and SGD and the potentials at all the word lines are 0 V. On the other hand, in the selected block that includes the memory cell of the write target, it is necessary to boost the potentials at the transfer control signal TG and select gate line SGS and SGD and the potentials at all the word lines from 0 V.

Particularly, the potential at the selected word line to which the memory cell of the write target is connected is set to 20 V in two steps, that is, 0 V to 10 V and 10 V to 20 V.

As illustrated in FIG. 24, when the NAND block BK(i+1) is selected as the unselected block, it is only necessary for one row decoder to drive the word line in one NAND block BK(i+1). Therefore, the control signal φ is set to "L".

The control signal φ of FIG. 24 corresponds to the control signals φ of FIGS. 20 to 22.

At this point, for example, the drivers 24a and 24c of FIG. 19 control the time constant when the potential is transferred to the word line in the NAND block BK(i+1).

Accordingly, the time required for the potential at the selected word line to reach 20 V from 10 V is T1.

On the other hand, when the NAND block BKi is selected as the selected block, it is necessary for the one row decoder to drive the word lines in the NAND blocks BKi of the two memory planes.

Therefore, as illustrated in FIG. 24, when the control signal φ is kept in the "L" state, the time required for the potential at the selected word line to reach 20 V from 10 V is T2, which is longer than T1 (T1<T2).

Accordingly, when the NAND block BKi is selected as the selected block, the control signal φ is set to "H".

At this point, for example, the driver 24b of FIG. 19 controls the time constant when the potential is transferred to the word line in the NAND block BKi.

Accordingly, the time required for the potential at the selected word line to reach 20 V from 10 V is T1.

Thus, the time constant is controlled in each word line when the potential is transferred to the word line, which allows the potential transfer rate to be equalized in all the word lines.

As described above, the effect is particularly effectively exerted in the selected word line to which the high potential is applied during the write. That is, after the time constant of the selected word line is set smaller than those of other word lines, the potential necessary for the write is transferred to all the word lines.

(5) Application Example of Circuit Controlling Time Constant

Recently, in the NAND type flash memory, a double patterning technique (sidewall patterning technique) is frequently used for the purpose of microfabrication.

For example, the double patterning technique is applied to a line and space pattern of the word line.

However, it is well known that a shape of the word line formed by the double patterning technique has a periodic variation. Specifically, the even-numbered word line differs from the odd-numbered word line in the sectional shape, and this is referred to as odd-even variation.

This odd-even variation causes a variation in resistance value of the word line.

Further, the resistance value and the capacitance value vary in each word line due to the process.

Because such variations cause the variation in time constant when the potential is transferred to the word line, the circuit of the embodiment that controls the time constant is effectively applied to achieve the equalization of the potential transfer rate in all the word lines.

For example, a step of examining the variations is provided in producing the chip.

After what variation is generated is recognized in each chip, the time constant is controlled in each word line with the circuit of the embodiment that controls the time constant when the potential is transferred to the word line.

For example, a technique of changing an initial potential during the write with respect to the selected word line according to the position of the selected word line and a technique of setting the potential at the word line to an appropriate potential in each word line during the erasing are well known as conventional techniques for solving the variations in resistance value and capacitance value of the word line.

However, in the conventional techniques, it is necessary to trim the appropriate potential in each word line according to the operation mode (such as write/erasing). Therefore, unfortunately a control program becomes complicated.

On the other hand, when the circuit of the embodiment that controls the time constant is used, the time constant is controlled in each word line, the need to trim the appropriate potential in each word line can be eliminated to easily solve the problem of the variations in resistance values and capacitance value of the word line.

(6) Floor Plan

A chip floor plan that is effectively applied to the layouts of the embodiment will be described.

Figure 25:
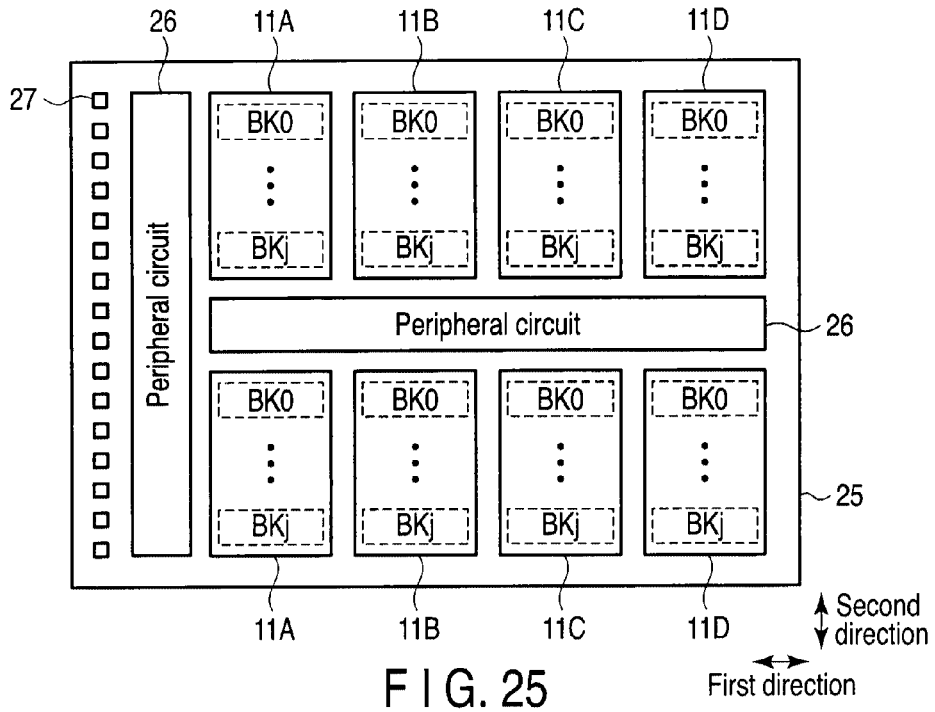
FIG. 25 illustrates a first example of a floor plan.

FIG. 25 illustrates a first example of the floor plan.

The eight memory planes 11A, 11B, 11C, and 11D are disposed on a chip 25. For example, the four memory planes 11A, 11B, 11C, and 11D on the upper side have the layout of FIG. 16. For example, the four memory planes 11A, 11B, 11C, and 11D on the lower side also have the layout of FIG. 16.

A peripheral circuit 26 is disposed between the four memory planes 11A, 11B, 11C, and 11D on the upper side and the four memory planes 11A, 11B, 11C, and 11D on the lower side.

A peripheral circuit 26 and pads 27 are disposed at a left end of the chip 25.

Figure 26:
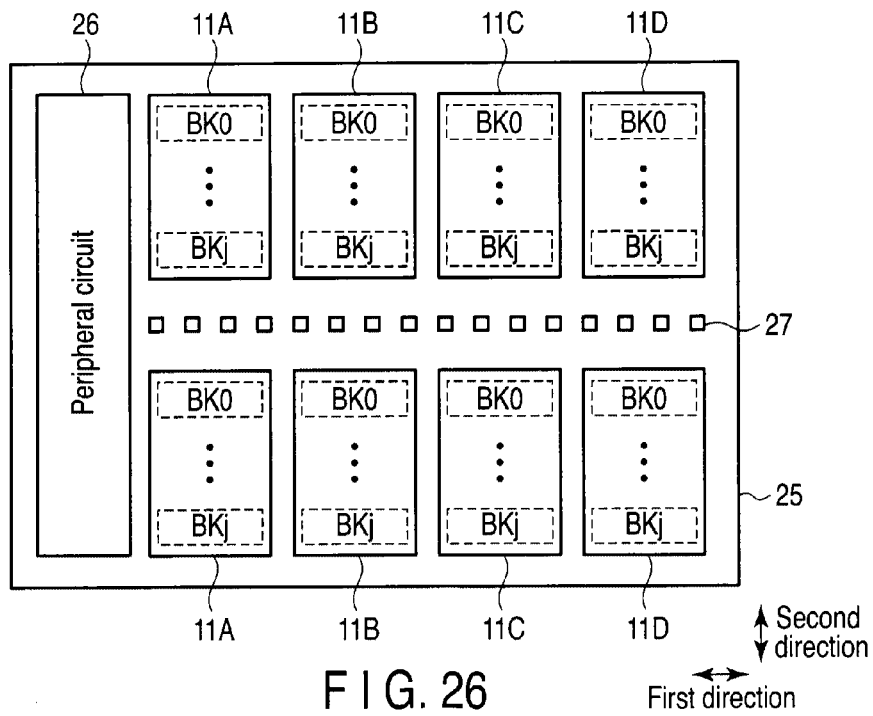
FIG. 26 illustrates a second example of a floor plan.

FIG. 26 illustrates a second example of the floor plan.

The eight memory planes 11A, 11B, 11C, and 11D are disposed on the chip 25. For example, the four memory planes 11A, 11B, 11C, and 11D on the upper side have the layout of FIG. 16. For example, the four memory planes 11A, 11B, 11C, and 11D on the lower side also have the layout of FIG. 16.

The pads 27 are disposed between the four memory planes 11A, 11B, 11C, and 11D on the upper side and the four memory planes 11A, 11B, 11C, and 11D on the lower side.

The peripheral circuit 26 is disposed at the left end of the chip 25.

Figure 27:
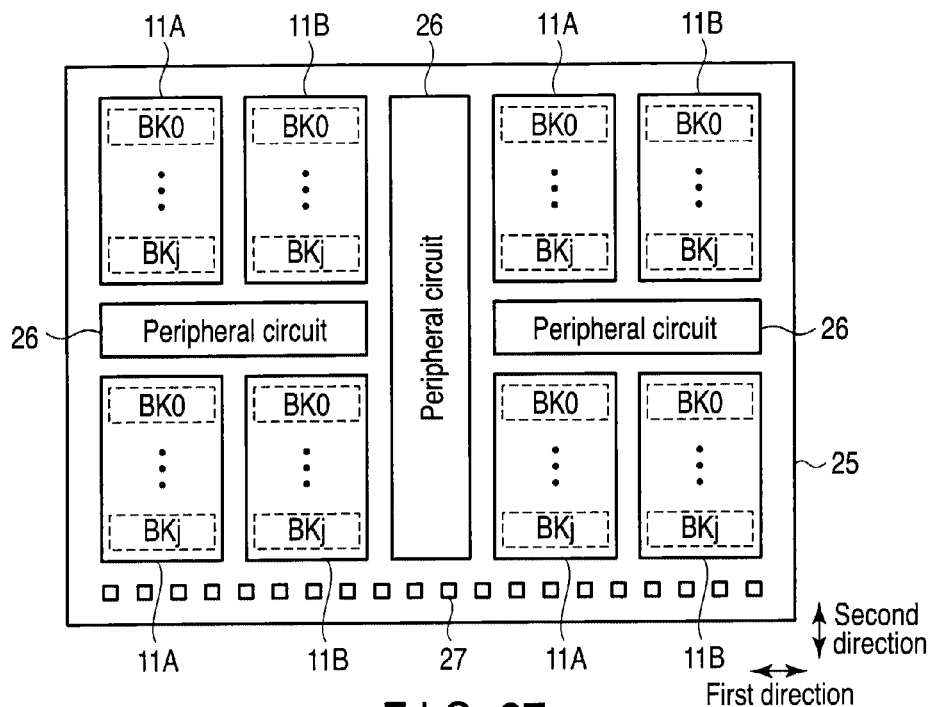
FIG. 27 illustrates a third example of a floor plan.

FIG. 27 illustrates a third example of the floor plan.

The eight memory planes 11A and 11B are disposed on the chip 25. For example, the two memory planes 11A and 11B that are located in the upper right, upper left, lower right, and lower left, respectively have the layout of FIG. 11.

The peripheral circuits 26 are disposed between the two memory planes 11A and 11B that are located in the upper right, upper left, lower right, and lower left, respectively.

The pads 27 are disposed at the lower end of the chip 25.

Figure 28:
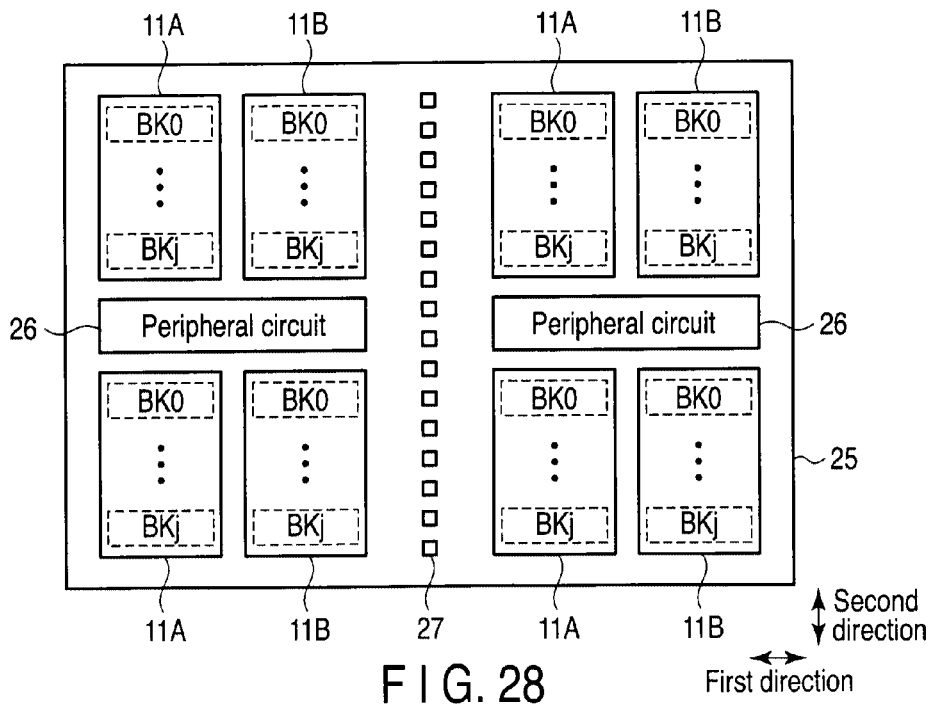
FIG. 28 illustrates a fourth example of a floor plan.

FIG. 28 illustrates a fourth example of the floor plan.

The eight memory planes 11A and 11B are disposed on the chip 25. For example, the two memory planes 11A and 11B that are located in the upper right, upper left, lower right, and lower left, respectively have the layout of FIG. 11.

The peripheral circuit 26 is disposed between the two memory planes 11A and 11B located in the upper left and the two memory planes 11A and 11B in the lower left. Similarly, the peripheral circuit 26 is disposed between the two memory planes 11A and 11B located in the upper right and the two memory planes 11A and 11B in the lower right.

The pads 27 are disposed between the four memory planes 11A and 11B located in the upper left and lower left and the four memory planes 11A and 11B located in the upper right and lower right.

The floor plans of the first to fourth examples are suitable for the implementation of a large-capacity memory. For example, when one memory plane has a memory capacity of 16 gigabits, a 128-gigabit memory capacity can be realized in one chip.

3. Application Examples

The embodiment proposes the layout of the row decoders, and the embodiment is not limited to the memory cell array structure or memory cell structure of the NAND type flash memory, and can be applied to various NAND type flash memories.

For example, as to the memory cell array structure, the embodiment can be applied to both a two-dimensional structure and a three-dimensional structure (such as BiCS-NAND (Bit Cost Scalability-NAND)).

As to the memory cell structure, the embodiment can be applied to a floating gate type, a MONOS (Metal/oxide/nitride/oxide/silicon) type, and a SONOS (silicon/oxide/nitride/oxide/silicon) type.

The MONOS type or SONOS type means a nonvolatile memory cell in which a charge accumulation layer is made of an insulating material having a charge trapping function.

FIG. 29 illustrates a MONOS type memory cell.

A source/drain diffusion layer 32 is disposed in a semiconductor substrate (active area) 31. A gate insulating film (tunnel insulating film) 33, a charge accumulation layer 34, a block insulating film 35, and a control gate electrode (word line WL) 36 are disposed on a channel region between the source/drain diffusion layers 32.

For example, the block insulating film 35 is formed by an ONO (oxide/nitride/oxide) film or a high-dielectric-constant (high-k) material.

The NAND type flash memory of the embodiment can be applied to both a two-level type and a multi-level type.

An example of a system to which the NAND type flash memory of the embodiment is applied will be described.

FIG. 30 illustrates an example of a product in which the NAND type flash memory is used.

A circuit board 42 and plural semiconductor chips 43, 44, and 45 are disposed in a package 41. The circuit board 42 and the semiconductor chips 43, 44, and 45 are electrically connected through a bonding wire 46. Alternatively, a through silicon via that penetrates the semiconductor substrate may be used instead of the bonding wire 46 or along with the bonding wire 46.

At least one of the semiconductor chips 43, 44, and 45 is the NAND type flash memory of the embodiment. One of the semiconductor chips 43, 44, and 45 is a controller that controls the NAND type flash memory of the embodiment.

In the example of FIG. 30, the three semiconductor chips 43, 44 and 45 are disposed in the package 41. Alternatively, four or more semiconductor chips may be disposed in the package 41.

4. Hookup Area

(1) Hookup Area

One of the features of the NAND type flash memory of the embodiment is that, as illustrated in FIG. 31, the transfer transistor block 18 of the row decoder 12-1 is disposed between the two memory planes 11A and 11B.

At this point, the connection in a hookup area of the plural word lines WL0, WL1, . . . , WL(n−1), and WLn in the two memory planes 11A and 11B and the transfer transistor block 18 becomes problematic. Specifically, when one transfer transistor is connected to one word line in one memory plane, a transfer transistor size is much larger than a word line pitch. Therefore, for example, only one or two transfer transistors are disposed in a width Q in the second direction of one NAND block BKi (i=0, 1, 2, and 3).

Accordingly, when the transfer transistor block 18 of FIG. 31 is actually disposed on the semiconductor chip, the transfer transistor block 18 has a layout in which plural transfer transistors are arrayed in the first direction.

When the plural word lines WL0, WL1, ..., WL(n−1), and WLn and the transfer transistor block 18 are connected based on the layout of the transfer transistor block, first, it is necessary to connect the plural word lines WL0, WL1, ..., WL(n−1), and WLn to the plural conductive lines LL0, LL1, ..., LL(n−1), and LLn in the same metallic layer M0; second, it is necessary to lead the plural conductive lines LL0, LL1, ..., LL(n−1), and LLn in the first and second directions; and third, it is necessary to connect the plural conductive lines LL0, LL1, ..., LL(n−1), and LLn to the plural transfer transistors arrayed in the first direction, respectively.

However, because the one row decoder 12-1 is shared by the two memory planes 11A and 11B, it is necessary that the two word lines WLk (k=0, 1, ..., n−1, and n) that have the same number in the two memory planes 11A and 11B be connected to the one transfer transistor through the conductive line LLk common to the two word lines WLk. As a result, the plural word lines WL0, WL1, ..., WL(n−1), and WLn in the two memory planes 11A and 11B and the transfer transistor block 18 are hardly connected.

A hookup area structure, that is, a technique of connecting the plural word lines WL0, WL1, ..., WL(n−1), and WLn in the two memory planes 11A and 11B and the transfer transistor block 18 is proposed in order to solve the problem.

(2) First Example

Figure 32B:
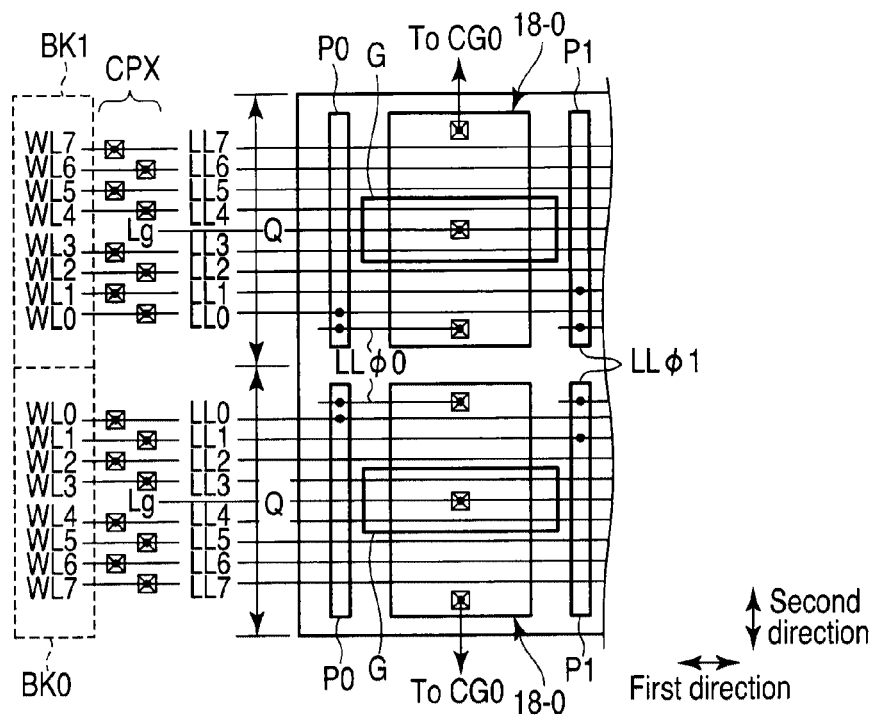
Figure 32C:
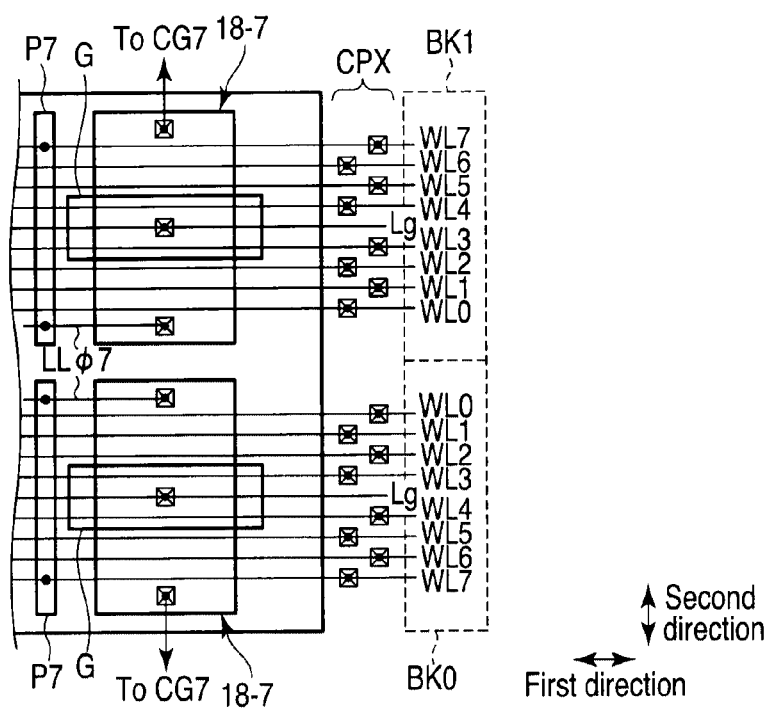

FIGS. 32A to 32C illustrate a first example of the hookup area structure.

In the first example, one transfer transistor is disposed within the width Q in the second direction of the NAND block BKi (i=0 and 1). The number of word lines WL0, ..., and WL7 in the NAND block BKi is set to eight, and the transfer transistor block corresponding to the NAND block BKi comprises eight transfer transistors 18-0, ..., and 18-7 arrayed in the first direction.

In the first example, in an orientation of each transfer transistor, a direction (channel-length direction) in which the two diffusion layers are connected is, but not limited to, the second direction. For example, the direction in which the two diffusion layers are connected may be the first direction.

In the transfer transistor array, each of auxiliary connection lines (Sub-interconnect line) P0, ..., and P7 extending in the second direction is disposed at one end (left end portion in the first example) in the first direction of each of the transfer transistors.

For example, the auxiliary connection lines P0, ..., and P7 are formed in the same conductive layer as the gate electrodes G of the transfer transistors 18-0, ..., and 18-7. That is, the gate electrodes G of the transfer transistors 18-0, ..., and 18-7 and the auxiliary connection lines P0, ..., and P7 have the same structure. For example, when the gate electrodes G of the transfer transistors 18-0, ..., and 18-7 contain conductive polysilicon, the auxiliary connection lines P0, ..., and P7 also contain the conductive polysilicon.

The eight word lines WL0, ..., and WL7 in the two NAND blocks BKi (i=0 and 1) in the two memory planes are connected to the eight conductive lines LL0, ..., and LL7 in the same metallic layer M0 through contact plugs CPX.

A key point to note is that the eight conductive lines LL0, ..., and LL7 extend straight in the first direction on the transfer transistors 18-0, ..., and 18-7.

That is, one end of each of the conductive lines LL0, ..., and LL7 is easily connected to each of the word lines WL0, ..., and WL7 in the memory plane on one end side of the transfer transistor block while the other end of each of the conductive lines LL0, ..., and LL7 is easily connected to each of the word lines WL0, ..., and WL7 in the memory plane on the other end side of the transfer transistor block.

The conductive lines LL0, ..., and LL7 and the transfer transistors 18-0, ..., and 18-7 are connected through the auxiliary connection lines P0, ..., and P7, respectively.

First, the conductive line LLk (k=0, ... 7) is connected to the auxiliary connection line Pk extending in the second direction; second, the auxiliary connection line Pk is connected to a conductive line LLφk extending in the first direction; and third, the conductive line LLφk is connected to the diffusion layer of the transfer transistor 18-k. At this point, the conductive line LLφk is formed in the same conductive layer of each of the conductive lines LL0, ..., and LL7.

In the hookup area structure of the first example, the one auxiliary conductive line Pk is provided in the one transfer transistor 18-k, which allows the eight conductive lines LL0, ..., and LL7 to extend straight in the first direction to easily connect the word lines WL0, ..., and WL7 in the two memory planes and the transfer transistors 18-0, ..., and 18-7.

(3) Second Example

FIGS. 33A to 33C illustrate a second example of the hookup area structure.

The second example is a modification of the first example.

The second example features the positions of the auxiliary conductive lines P0, ..., and P7, and other structures are identical to those of the first example. Only points that differ from the first example will be described below. The same parts as in the first example are designated by the same numerals as FIGS. 32A to 32C, and the description thereof is omitted.

In the second example, for example, an auxiliary connection line Pk(even) extending in the second direction is disposed in the right end portion of the transfer transistor 18-k(even) (k(even)=0, 2, 4, and 6) that is even-numbered from the left. An auxiliary connection line Pk(odd) extending in the second direction is disposed in the left end portion of the transfer transistor 18-k(odd) (k(odd)=1, 3, 5, and 7) that is odd-numbered from the left.

Accordingly, the two auxiliary conductive lines Pk(even) and Pk(even)+1 (k(even)=0, 2, 4, and 6) are adjacent to each other between the two transfer transistors 18-k(even) and 18-k(even)+1.

Even in the structure of the second example, the eight word lines WL0, ..., and WL7 in the two NAND blocks BKi (i=0 and 1) in the two memory planes are connected to the eight conductive lines LL0, ..., and LL7 in the same metallic layer M0 through the contact plugs CPX.

The conductive lines LL0, ..., and LL7 and the transfer transistors 18-0, ..., and 18-7 are connected through the auxiliary connection lines P0, ..., and P7.

First, the conductive line LLk (k=0, ... 7) is connected to the auxiliary connection line Pk extending in the second direction; second, the auxiliary connection line Pk is connected to the conductive line LLφk extending in the first direction; and third, the conductive line LLφk is connected to the diffusion layer of the transfer transistor 18-k.

In the hookup area structure of the second example, similarly to the first example, the one auxiliary conductive line Pk is provided in the one transfer transistor 18-k, which allows the eight conductive lines LL0, ..., and LL7 to extend straight in the first direction to easily connect the word lines WL0, ..., and WL7 in the two memory planes and the transfer transistors 18-0, ..., and 18-7.

(4) Structure Example of Transfer Transistor

FIG. 34 illustrates a structure example of the transfer transistor.

For example, an isolation insulating layer 52 having an STI (Shallow Trench Isolation) structure is formed in a semiconductor substrate 51.

The transfer transistor 18-*k* is formed in an active area AA surrounded by the isolation insulating layer 52. The transfer transistor 18-*k* is an FET (Field Effect Transistor). Two source/drain diffusion layers are formed in the semiconductor substrate 51 in the active area AA. The gate electrode G is formed on the channel between the two source/drain diffusion layers with a gate insulating layer interposed between the gate electrode G and the channel.

The conductive line LLk is connected to the auxiliary connection line Pk. The auxiliary connection line Pk is connected to one of the two source/drain diffusion layers of the transfer transistor 18-*k* through the conductive line LLφk.

(5) Conclusion

The transfer transistor block is disposed between the two memory planes, and is shared by the two memory planes. At this point, when the hookup area structure is adopted, the plural word lines can easily be connected to the plural transfer transistors.

The hookup area structure in which the auxiliary connection line is used is extremely effectively applied to the NAND type flash memory of the embodiment in which the one transfer transistor block is shared by the two memory planes.

5. Layout of Control Signal Line on Memory Plane (1) Control Signal Line

In the NAND type flash memory of the embodiment, for example, as illustrated in FIG. 7, the row decoder 12-1 is disposed between the two memory planes 11A and 11B, and the row decoder 12-2 is disposed in the right end portion of the memory plane 11B.

Because the row decoder 12-2 produces the control signals RDECADn and TG to perform on/off control of the transfer transistors 18, 22, and 23 in the row decoder 12-1, it is necessary to disperse the control signal line CL, through which the control signals RDECADn and TG are transferred, on the memory plane 11B.

However, depending on the layout of the control signal line CL, there is a risk of interrupting the memory operation (for example, erasing operation).

That is, the source line is disposed on the memory plane, the potential at the floating gate of the unselected memory cell is boosted by coupling of the well and the source line (it is assumed that the well and the source line are boosted to the high potential) during the erasing operation, thereby preventing the erroneous erasing. However, when only a specific word line (page) is covered with the control signal line CL, the potential at the floating gate of the memory cell in the page is insufficiently boosted during the erasing operation, and a possibility of causing the erroneous erasing increases.

In view of the foregoing, the layout of the control signal line on the memory plane is proposed below.

(2) Other Examples in which Control Signal Line is Disposed on Memory Plane

In the NAND type flash memory of the embodiment, the control signal line is disposed on the memory plane. However, besides the embodiment, occasionally the control signal line is disposed on the memory plane. Such cases will be described below.

A. First Example

FIG. 35 illustrates another example in which the control signal line is disposed on the memory plane.

The memory planes 11A and 11B are disposed in parallel in the first direction, and each of the memory planes 11A and 11B comprises four NAND blocks BKi (i=0, 1, 2, and 3) that are arrayed in the second direction.

The word lines WL0, WL1, . . . , WL(n−1), and WLn in the NAND blocks BKi of the memory planes 11A and 11B are connected to the transfer transistor block 18 in the row decoder 12-1 that is disposed between the memory planes 11A and 11B.

For example, the row decoder (portion corresponding to one NAND block) 12-1 may have the same structure as the row decoder 12-1 of FIG. 7.

The gate electrode of the transfer transistor in the transfer transistor block 18 is connected to a level shifter 19*b* in the row decoder 12-2 through the control signal line CLi. The control signal line CLi is disposed on the memory plane 11B.

For example, the row decoder (portion corresponding to one NAND block) 12-2 may have the same structure as the row decoder 12-2 of FIG. 7.

When the row decoders (portion corresponding to one NAND block) 12-1 and 12-2 have the same structure as the row decoders 12-1 and 12-2 of FIG. 7, for example, the two control signal lines CLi are disposed on the memory plane 11B as illustrated in FIG. 36.

In the layout of the first example, the row decoder 12-1 is shared by the two NAND blocks BKi of the memory planes 11A and 11B, so that the increase in the number of row decoders can be suppressed when the number of memory planes increases.

Although the row decoder 12-2 is provided on the right of the memory plane 11B, the row decoder 12-2 may be provided on the left of the memory plane 11A.

The control signal line CLi may be provided either on the NAND block BKi or on a NAND block different from the NAND block BKi.

The row decoder 12-1 is shared by the two NAND blocks BKi in the memory planes 11A and 11B, so that the chip performance can be improved without the chip area enlargement caused by the increase in the number of row decoders.

B. Second Example

FIG. 37 illustrates another example in which the control signal line is disposed on the memory plane.

The memory planes 11A and 11B are disposed in parallel in the first direction, and each of the memory planes 11A and 11B comprises four NAND blocks BKi (i=0, 1, 2, and 3) that are arrayed in the second direction.

The word lines WL0, WL1, . . . , WL(n−1), and WLn in the odd-numbered NAND blocks BK1 and BK3 of the memory planes 11A and 11B are connected to the transfer transistor block 18 in the row decoder 12-1 that is disposed between the memory planes 11A and 11B.

The word lines WL0, WL1, . . . , WL(n−1), and WLn in the even-numbered NAND blocks BK0 and BK2 of the memory plane 11A are connected to the transfer transistor block 18 in the row decoder 12-1 that is disposed on the left of the memory plane 11A, and the word lines WL0, WL1, . . . , WL(n−1), and WLn in the even-numbered NAND blocks BK0 and BK2 of the memory plane 11B are connected to the transfer transistor block 18 in the row decoder 12-1 that is disposed on the right of the memory plane 11B.

For example, the row decoder (portion corresponding to one NAND block) 12-1 may have the same structure as the row decoder 12-1 of FIG. 7.

The gate electrode of the transfer transistor in the transfer transistor block 18 is connected to the level shifter 19b in the row decoder 12-2 through the control signal line CLi.

The gate electrode of the transfer transistor in the row decoder 12-1 between the memory planes 11A and 11B is connected to the level shifter 19b in the row decoder 12-2 on the right of the memory plane 11B through the control signal lines CL1 and CL3 on the memory plane 11B.

The gate electrode of the transfer transistor in the row decoder 12-1 on the left of the memory plane 11A is connected to the level shifter 19b in the row decoder 12-2 on the left of the memory plane 11A through the control signal lines CL0 and CL2. The gate electrode of the transfer transistor in the row decoder 12-1 on the right of the memory plane 11B is connected to the level shifter 19b in the row decoder 12-2 on the left of the memory plane 11A through the control signal lines CL0 and CL2 on the memory planes 11A and 11B.

For example, the row decoder (portion corresponding to one NAND block) 12-2 may have the same structure as the row decoder 12-2 of FIG. 7.

When the row decoders (portion corresponding to one NAND block) 12-1 and 12-2 have the same structure as the row decoders 12-1 and 12-2 of FIG. 7, for example, the two control signal lines CL are disposed on the memory plane 11B as illustrated in FIG. 38.

In the layout of the second example, the row decoder 12-1 between the memory planes 11A and 11B is shared by the two NAND blocks BKi (i=1, 3) of the memory planes 11A and 11B, so that the increase in the number of row decoders can be suppressed when the number of memory planes increases.

Although the row decoder 12-1 between the memory planes 11A and 11B is connected to the row decoder 12-2 on the right of the memory plane 11B, the row decoder 12-1 may be connected to the row decoder 12-2 on the left of the memory plane 11A. At this point, the row decoder 12-1 on the left of the memory plane 11A and the row decoder 12-1 on the right of the memory plane 11B are connected to the row decoder 12-2 on the right of the memory plane 11B.

The control signal line CLi may be disposed either on the NAND block BKi or on a NAND block different from the NAND block BKi.

The row decoder 12-1 between the memory planes 11A and 11B is shared by the two NAND blocks BKi (i=1, 3) in the memory planes 11A and 11B, so that the chip performance can be improved without the chip area enlargement caused by the increase in the number of row decoders.

C. Third Example

Figure 39:
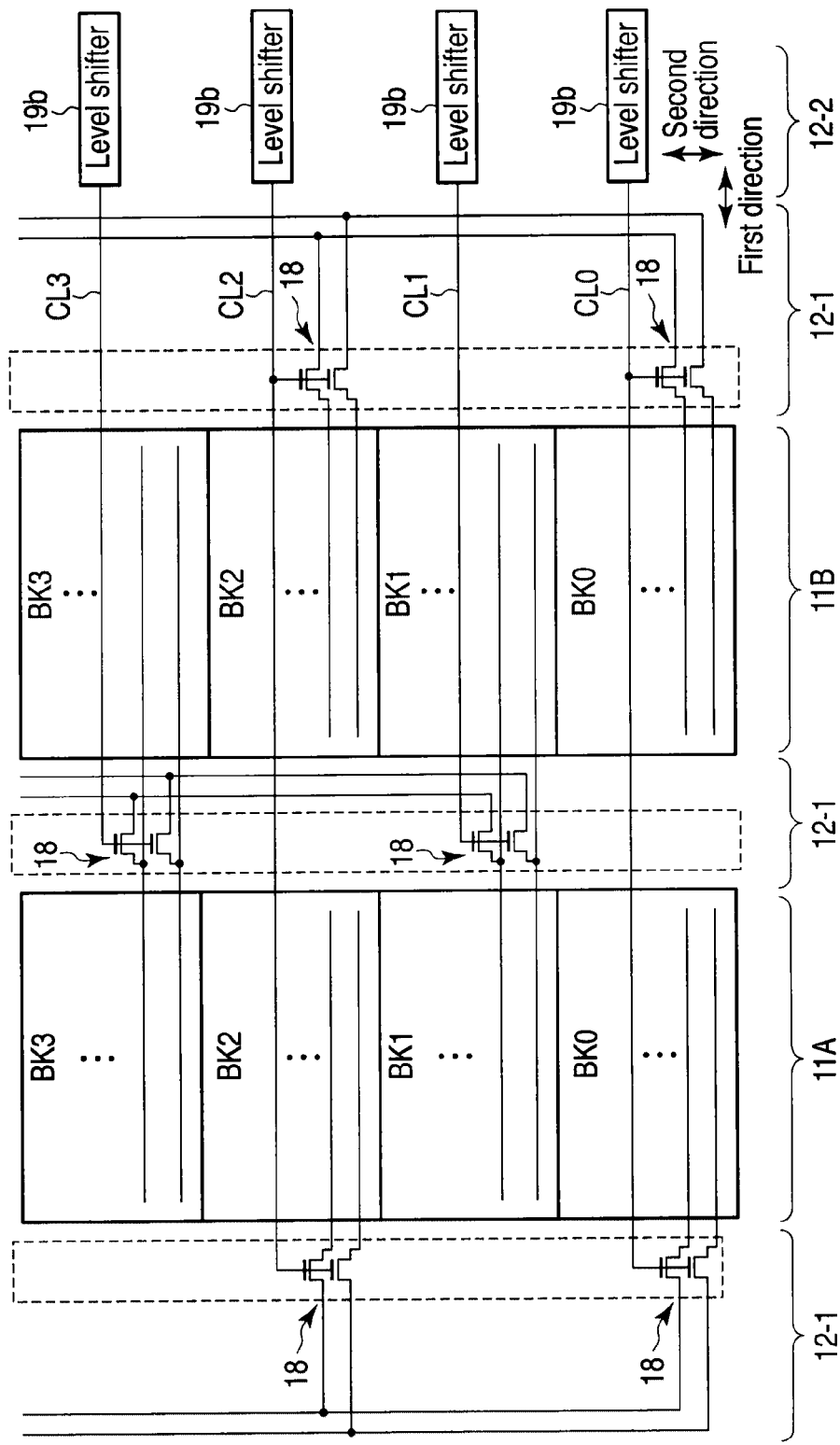

FIG. 39 illustrates another example in which the control signal line is disposed on the memory plane.

The third example is a modification of the second example of FIG. 37.

The third example differs from the second example of FIG. 37 in the position of the level shifter 19b. Specifically, the level shifter 19b is disposed only in the row decoder 12-2 on the right of the memory plane 11B. Since other structures of the third example are identical to those of the second example of FIG. 37, the description thereof is omitted.

For example, the row decoder (portion corresponding to one NAND block) 12-2 may have the same structure as the row decoder 12-2 of FIG. 7.

When the row decoders (portion corresponding to one NAND block) 12-1 and 12-2 have the same structure as the row decoders 12-1 and 12-2 of FIG. 7, for example, the two control signal lines CL are disposed on the memory plane 11B as illustrated in FIG. 40.

In the third example, the same effect as the second example can be obtained.

D. Fourth Example

Figure 41:
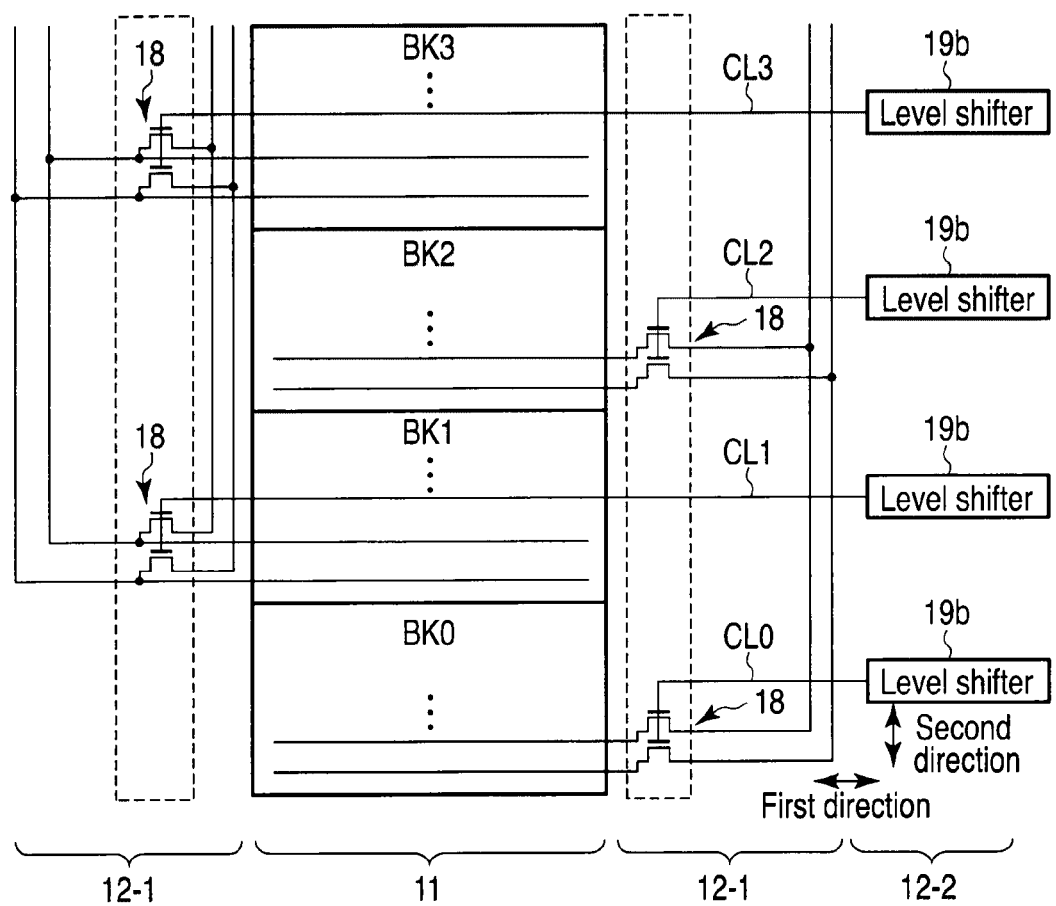

FIG. 41 illustrates another example in which the control signal line is disposed on the memory plane.

The fourth example is a modification of the third example of FIG. 39.

The fourth example differs from the third example of FIG. 39 in a number of the memory planes. Specifically, the memory plane is one, word lines in a NAND blocks BK0, BK2 is connected to a transfer transistor block 18 which is disposed at a first end of the memory plane 11, word lines in a NAND blocks BK1, BK3 is connected to a transfer transistor block 18 which is disposed at a second end of the memory plane 11.

All level shifters (all decode blocks) 19b corresponding to the memory plane 11 are disposed at the first end of the memory plane 11. A control signal line which is connected between a control terminal of the transfer transistor block 18 at the second end of the memory plane 11 and the level sifters 19b is disposed on the memory plane 11.

Since other structures of the fourth example are identical to those of the third example of FIG. 39, the description thereof is omitted.

For example, the row decoder (portion corresponding to one NAND block) 12-2 may have the same structure as the row decoder 12-2 of FIG. 7.

When the row decoders (portion corresponding to one NAND block) 12-1 and 12-2 have the same structure as the row decoders 12-1 and 12-2 of FIG. 7, for example, the two control signal lines CL are disposed on the memory plane 11 as illustrated in FIG. 42.

In the fourth example, the same effect as the third example can be obtained.

(3) Layout of Control Signal Line on Memory Plane

A. First Example

Figure 43:
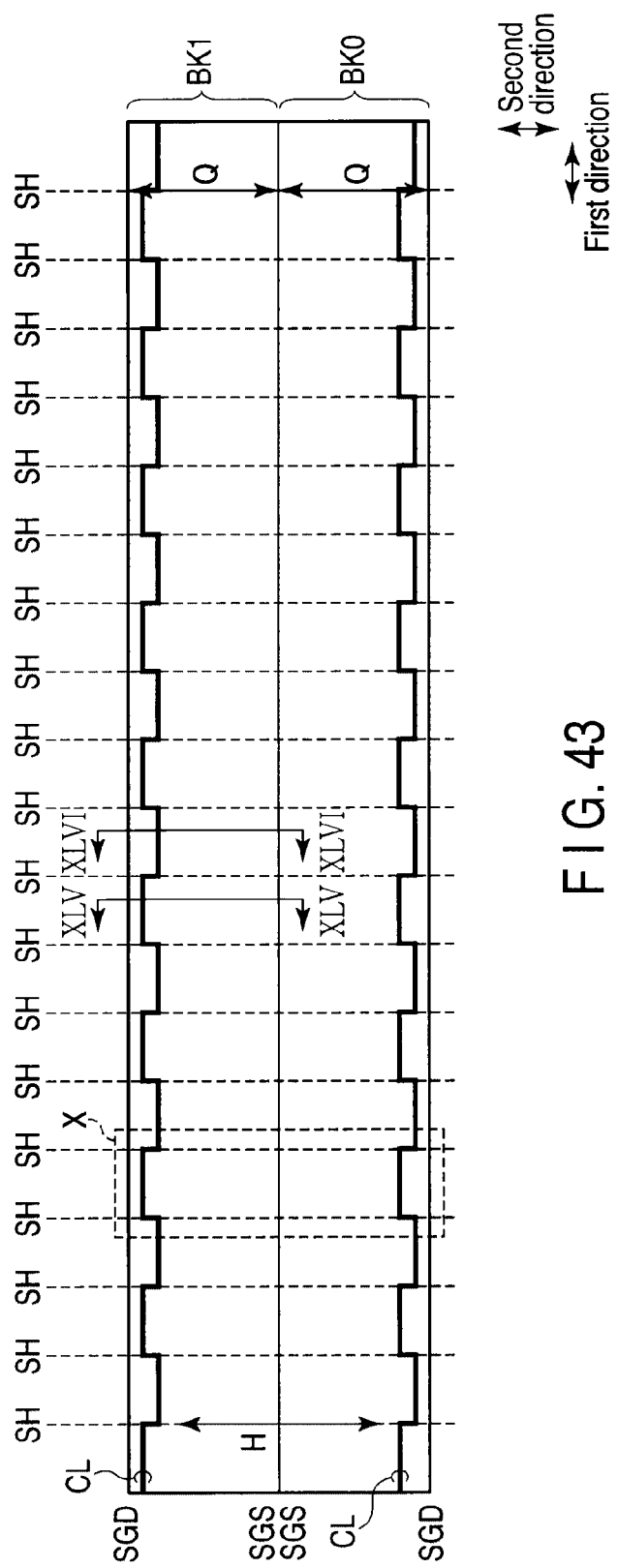
FIG. 43 illustrates a first example a layout of control signal line.

FIG. 43 illustrates a first example of the layout of the control signal line on the memory plane. FIG. 44 is a view illustrating the detailed area X of FIG. 43.

In the first example, the control signal line CL extends in the first direction (direction in which the word lines WL0 to WL7 extend) in a meandering manner. Specifically, the control signal line CL extends in the first direction and shifts in the second direction (direction intersecting the direction in which the word lines WL0 to WL7 extend) in a shunt area SH. A shift amount of the control signal line CL is not lower than the pitch of the word lines WL0 to WL, and is for example, three to five times the pitch of the word lines WL0 to WL7.

For example, after shifting downward in the shunt area SH that is odd-numbered from the left of the NAND blocks BK0 and BK1b, the control signal lines CL shift upward to return to the original positions in the shunt areas SH that are located even-numbered from the left of the NAND blocks BK0 and BK1b.

As a result, the amplitude of the control signal line CL is smaller than the width Q in the second direction of the NAND blocks BK0 and BK1b.

As used herein, the shunt area SH means an area that establishes contact between the semiconductor substrate (including the P-type well region and the N-type well region) or the word line and the metallic interconnection located thereabove.

For example, the two control signal lines CL are disposed on the one NAND block according to the layouts of FIGS. 35 to 42. The control signal RDECADn is transferred through one of the control signal lines CL, and the control signal TG is transferred through the other control signal line CL. The control signals RDECADn and TG are identical to those of FIGS. 36, 38, 40, and 42.

Plural source lines SL are disposed between the control signal lines CL on the NAND block BK0 and the control signal line CL on the NAND block BK1. The plural source lines SL extend in the first direction and are connected to the source diffusion layers of the plural NAND strings in the NAND blocks BK0 and BK1.

Because the plural source lines SL are connected to one another, the substantial width (width in the second direction) of the source lines SL becomes H (at least one NAND string), thereby contributing to source potential stabilization because of the reduced resistance of the plural source lines SL.

A source diffusion layer of the NAND string exists between the two source-side select gate lines SGS. A drain diffusion layer of the NAND string exists between the two drain-side select gate lines SGD.

Figure 45:
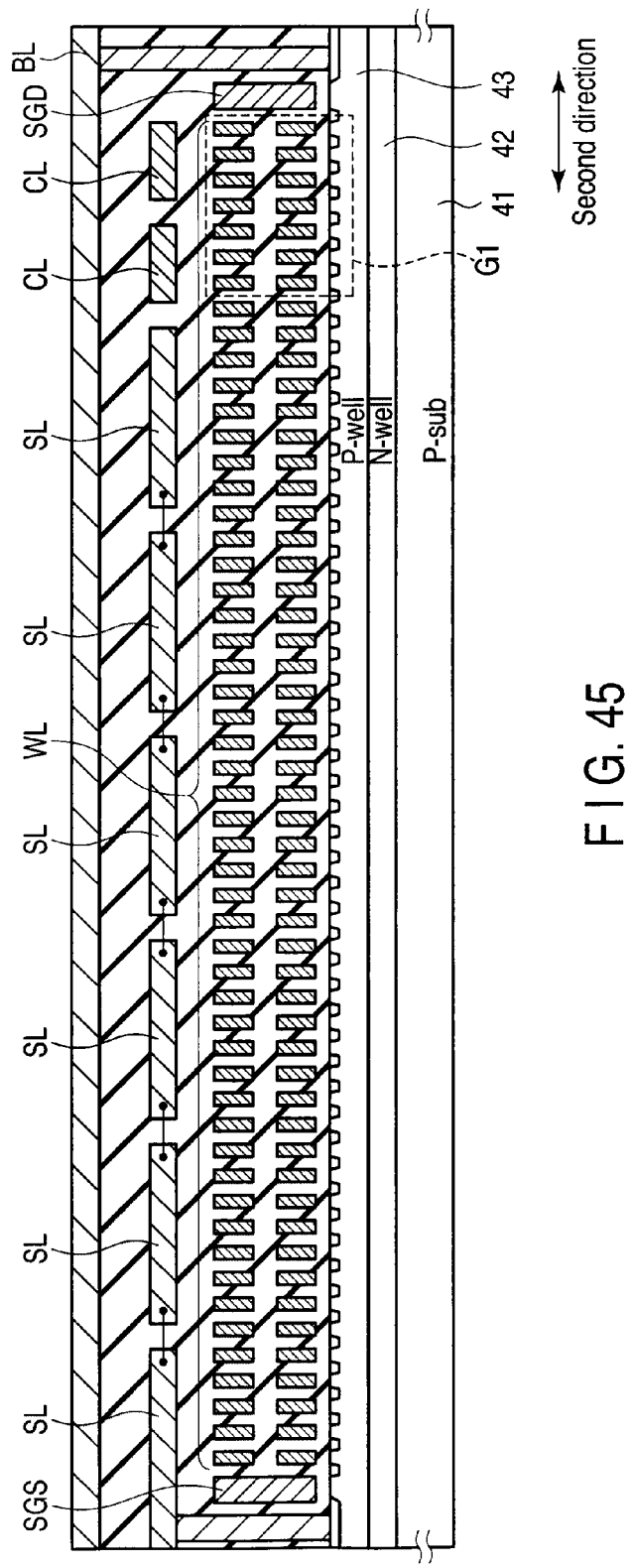
FIG. 45 illustrates a cross sectional view along with XLV-XLV line in FIG. 43.
Figure 46:
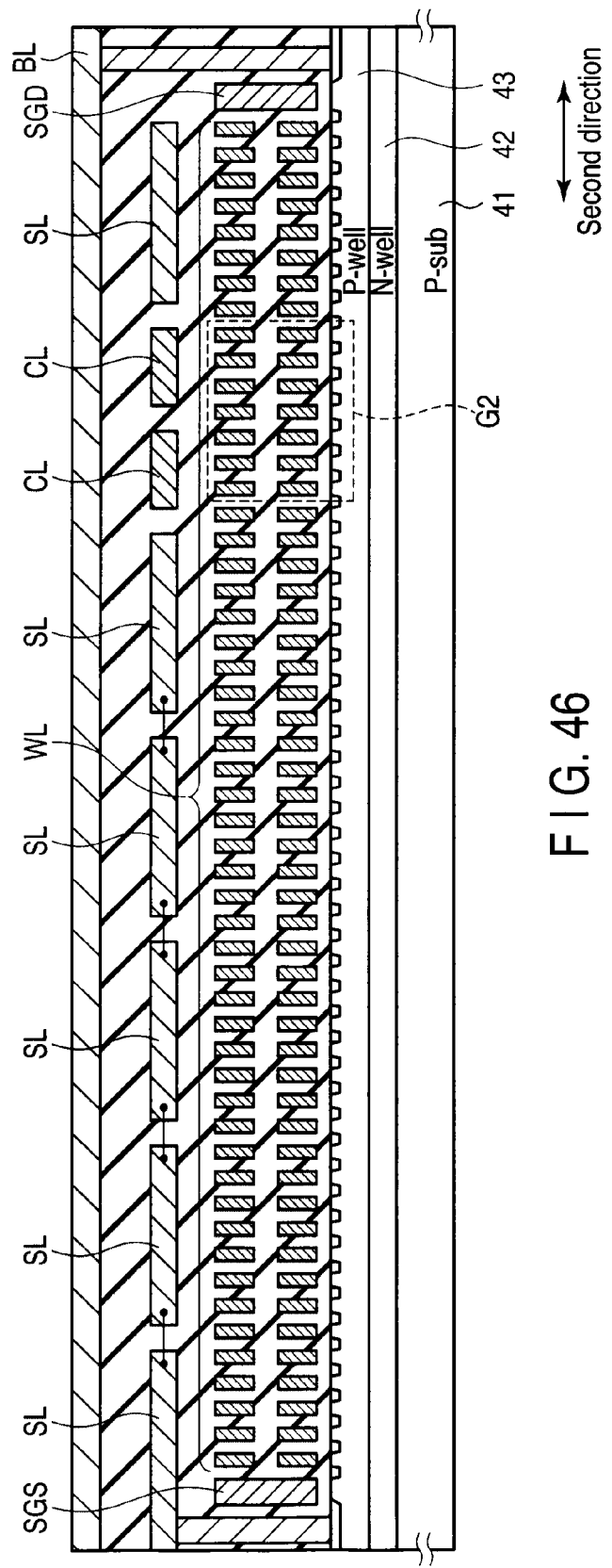
FIG. 46 illustrates a cross sectional view along with XLVI-XLVI line in FIG. 43.

FIG. 45 is a sectional view taken along a line XLV-XLV of FIG. 43, and FIG. 46 is a sectional view taken along a line XLVI-XLVI of FIG. 43.

The N-type well region 42 and the P-type well region 43 are formed in the P-type semiconductor substrate 41. The NAND string that comprises plural memory cells connected in series in the second direction is formed in the P-type well region 43. The source-side select transistor is disposed at one end of the NAND string, and the drain-side select transistor is disposed at the other end.

Each of the plural memory cells has a stacked gate structure of the floating gate and the control gate. The control gates of the plural memory cells are the plural word lines WL. The gate of the source-side select transistor is the source-side select gate line SGS. The gate of the drain-side select transistor is the drain-side select gate line SGD.

The source diffusion layer of the NAND string is connected to the source line SL, and the drain diffusion layer of the NAND string is connected to the bit line BL.

In the first example, the control signal line CL exists on a memory cell group G1 in the sectional view of FIG. 45 while existing on a memory cell group G2 in the sectional view of FIG. 46.

Accordingly, for example, during the erasing operation, the erroneous erasing of the unselected memory cell can be prevented when the potential at the floating gate of the unselected memory cell is boosted by the coupling of the P-type well region 43 and the source line SL (it is assumed that the P-type well region 43 and the source line SL are boosted to the high potential).

That is, only the specific word line (page) WL is not covered with the control signal line CL, but, for example, about 50% of the memory cell groups G1 and G2 of FIGS. 45 and 46 is covered with the control signal line CL. In other words, the control signal line CL is covered with the source line SL in the remaining about 50%, so that the potential at the floating gate of the unselected memory cell in the page can sufficiently be boosted during the erasing operation.

B. Second Example

Figure 47:
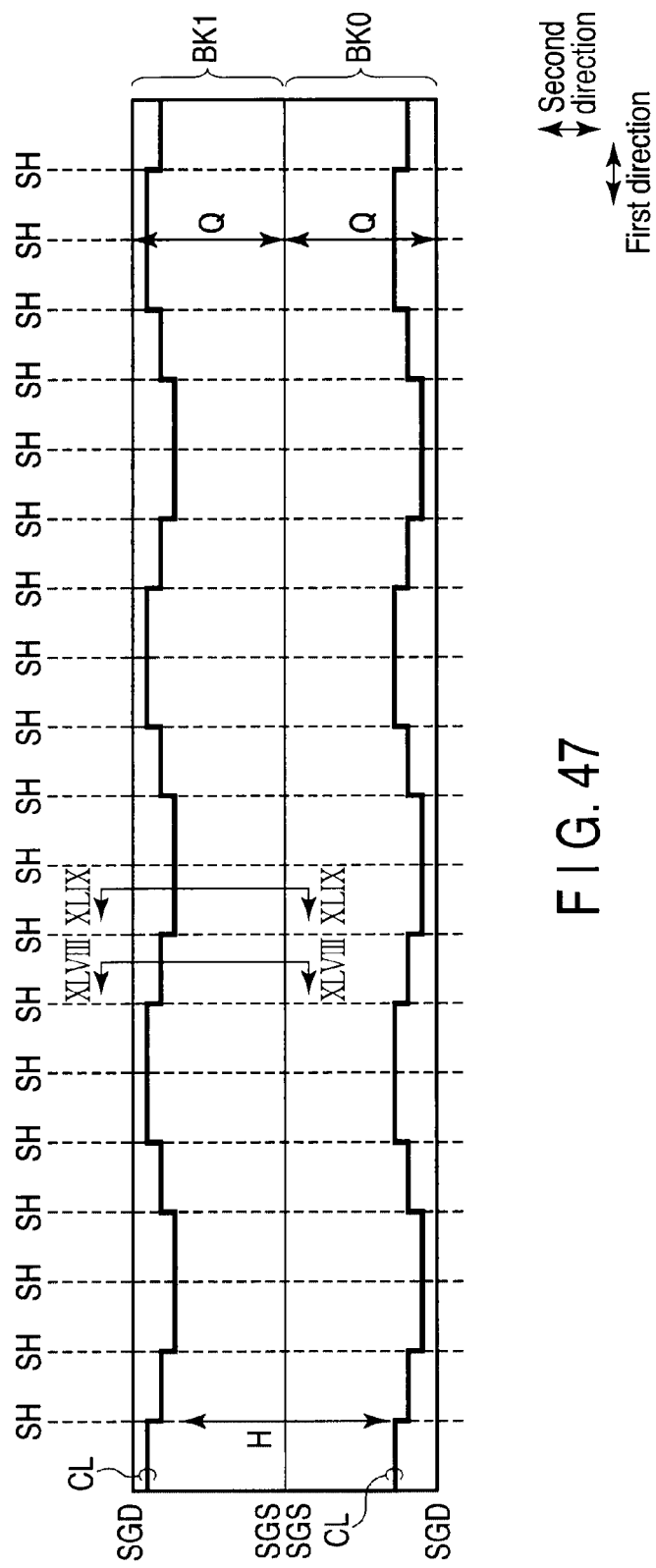
FIG. 47 illustrates a second example a layout of control signal line.

FIG. 47 illustrates a second example of the layout of the control signal line on the memory plane.

In the second example, similarly to the first example, the control signal line CL extends in the first direction (direction in which the word lines WL0 to WL7 extend) in a meandering manner. That is, the control signal line CL extends in the first direction and shifts in the second direction (direction intersecting the direction in which the word lines WL0 to WL7 extend) in the shunt area SH. However, the second example differs from the first example in the shift method.

For example, after shifting downward in the shunt areas SH that are located first and second from the left of the NAND blocks BK0 and BK1b, the control signal lines CL shift upward to return to the original positions in the shunt areas SH that are located fourth and fifth from the left of the NAND blocks BK0 and BK1b.

As a result, the amplitude of the control signal line CL is smaller than the width Q in the second direction of the NAND blocks BK0 and BK1b.

The meandering structure (shift method) of the control signal line CL is not limited to the first example and second example, and various modifications can be made. An important point to note is that the control signal line CL shifts in the shunt area SH.

Because the detailed layout of the second example is identical to that of the first example (FIG. 44) except the shift method, the description thereof is omitted.

Figure 48:
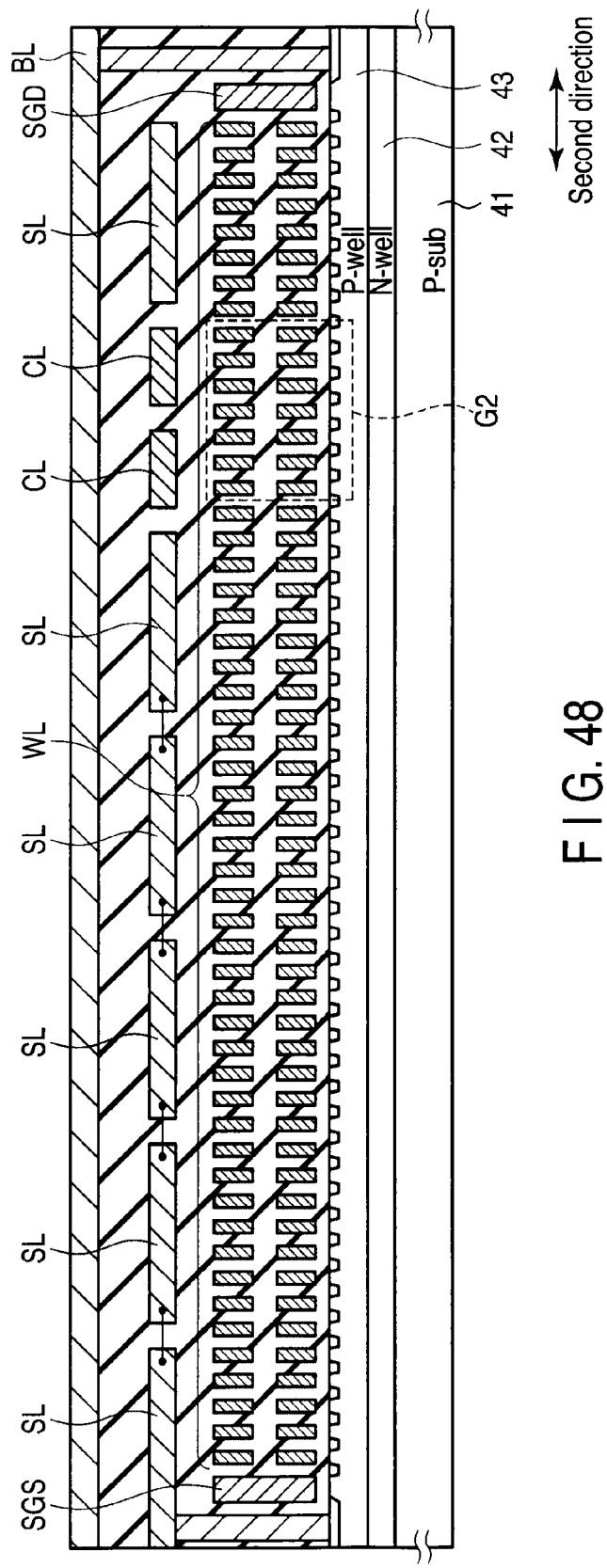
FIG. 48 illustrates a cross sectional view along with XLVIII-XLVIII line in FIG. 47.
Figure 49:
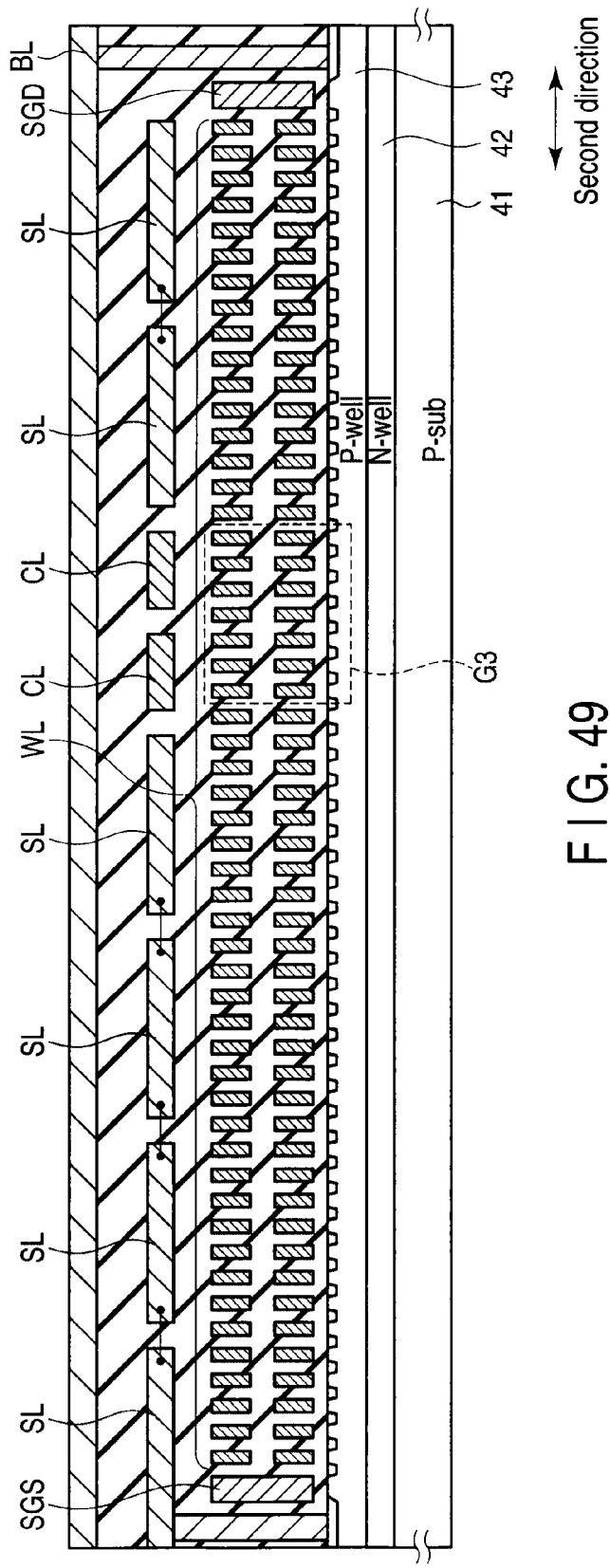
FIG. 49 illustrates a cross sectional view along with XLIX-XLIX line in FIG. 47.

FIG. 48 is a sectional view taken along a line XLVIII-XLVIII of FIG. 47, and FIG. 49 is a sectional view taken along a line XLIX-XLIX of FIG. 47.

The N-type well region 42 and the P-type well region 43 are formed in the P-type semiconductor substrate 41. The NAND string that comprises plural memory cells connected in series in the second direction is formed in the P-type well region 43. The source-side select transistor is disposed at one end of the NAND string, and the drain-side select transistor is disposed at the other end.

Each of the plural memory cells has the stacked gate structure of the floating gate and the control gate. The control gates of the plural memory cells are the plural word lines WL. The gate of the source-side select transistor is the source-side select gate line SGS. The gate of the drain-side select transistor is the drain-side select gate line SGD.

The source diffusion layer of the NAND string is connected to the source line SL, and the drain diffusion layer of the NAND string is connected to the bit line BL.

In the second example, the control signal line CL exists on the memory cell group G2 in the sectional view of FIG. 48 while existing on a memory cell group G3 in the sectional view of FIG. 49.

Accordingly, for example, during the erasing operation, the erroneous erasing of the unselected memory cell can be prevented when the potential at the floating gate of the unselected memory cell is boosted by the coupling of the P-type well region 43 and the source line SL (it is assumed that the P-type well region 43 and the source line SL are boosted to the high potential).

That is, only the specific word line (page) WL is not covered with the control signal line CL, but, for example, 30 to 35% of the memory cell groups G2 and G3 of FIGS. 48 and 49 is covered with the control signal line CL. In other words, the control signal line CL is covered with the source line SL in the remaining 65 to 70%, so that the potential at the floating gate of the unselected memory cell in the page can sufficiently be boosted during the erasing operation.

For example, the two control signal lines CL are disposed on the one NAND block according to the layouts of FIGS. 35 to 42.

C. Third Example

Figure 50:
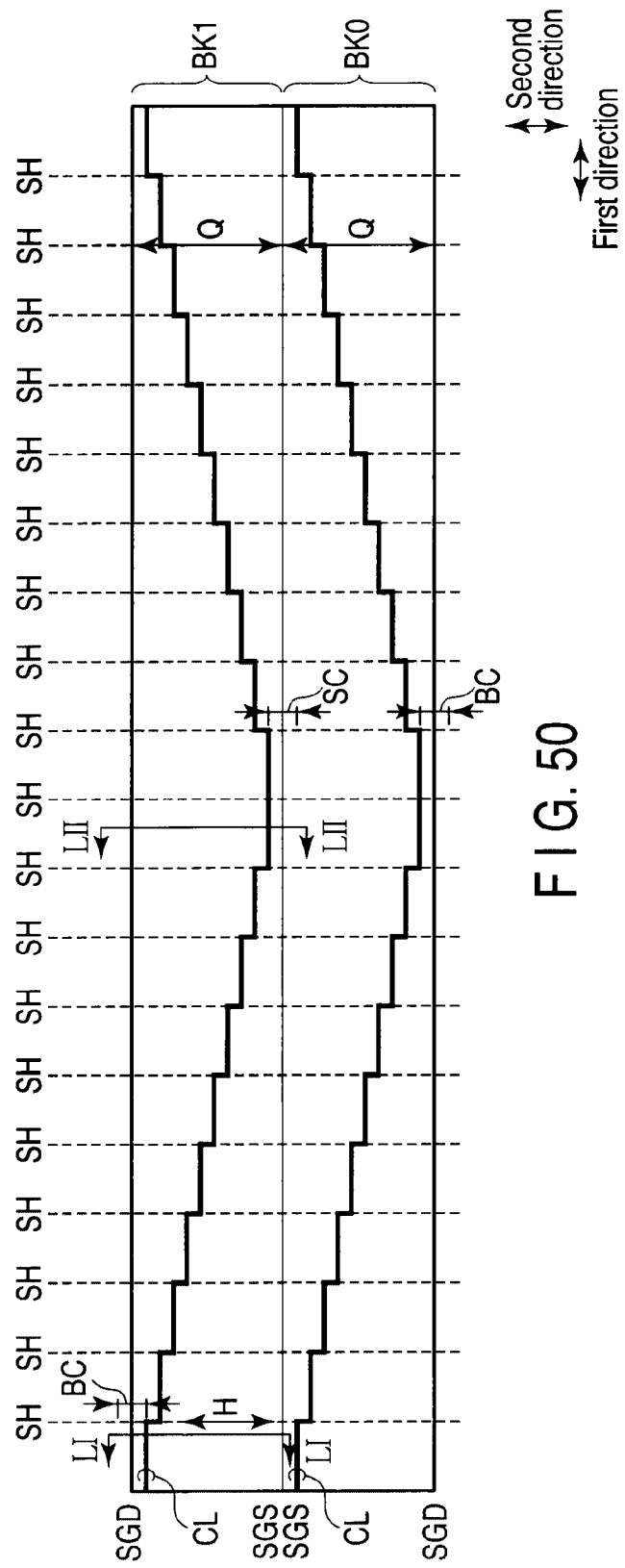
FIG. 50 illustrates a third example a layout of control signal line.

FIG. 50 illustrates a third example of the layout of the control signal line on the memory plane.

In the third example, similarly to the first example, the control signal line CL extends in the first direction (direction in which the word lines WL0 to WL7 extend) in the meandering manner. That is, the control signal line CL extends in the first direction and shifts in the second direction (direction intersecting the direction in which the word lines WL0 to WL7 extend) in the shunt area SH.

However, the third example differs from the first example in that the amplitude of the controls signal line CL is maximized.

For example, after shifting downward in the shunt areas SH that are located first to ninth from the left of the NAND blocks BK0 and BK1b, the control signal lines CL shift upward to return to the original positions in the shunt areas SH that are located eleventh to nineteenth from the left of the NAND blocks BK0 and BK1b.

As a result, the amplitude of the control signal line CL is maximized.

However, in consideration of a source line contact area SC and a bit line contact area BC, it is necessary that the maximum amplitude of the control signal line CL be smaller than the width Q in the second direction of the NAND blocks BK0 and BK1b.

Because the detailed layout of the third example is identical to that of the first example (FIG. 44) except the shift method, the description thereof is omitted.

Figure 51:
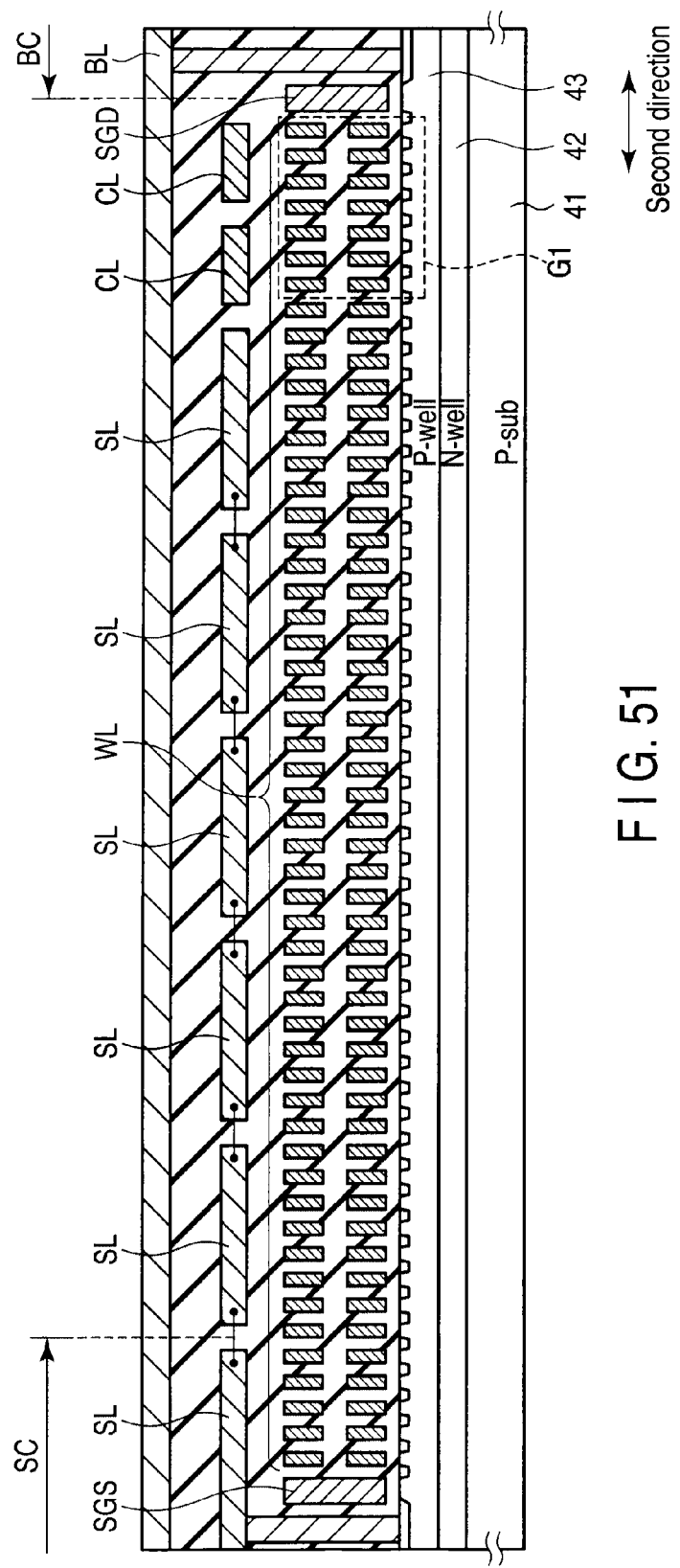
FIG. 51 illustrates a cross sectional view along with LI-LI line in FIG. 50.
Figure 52:
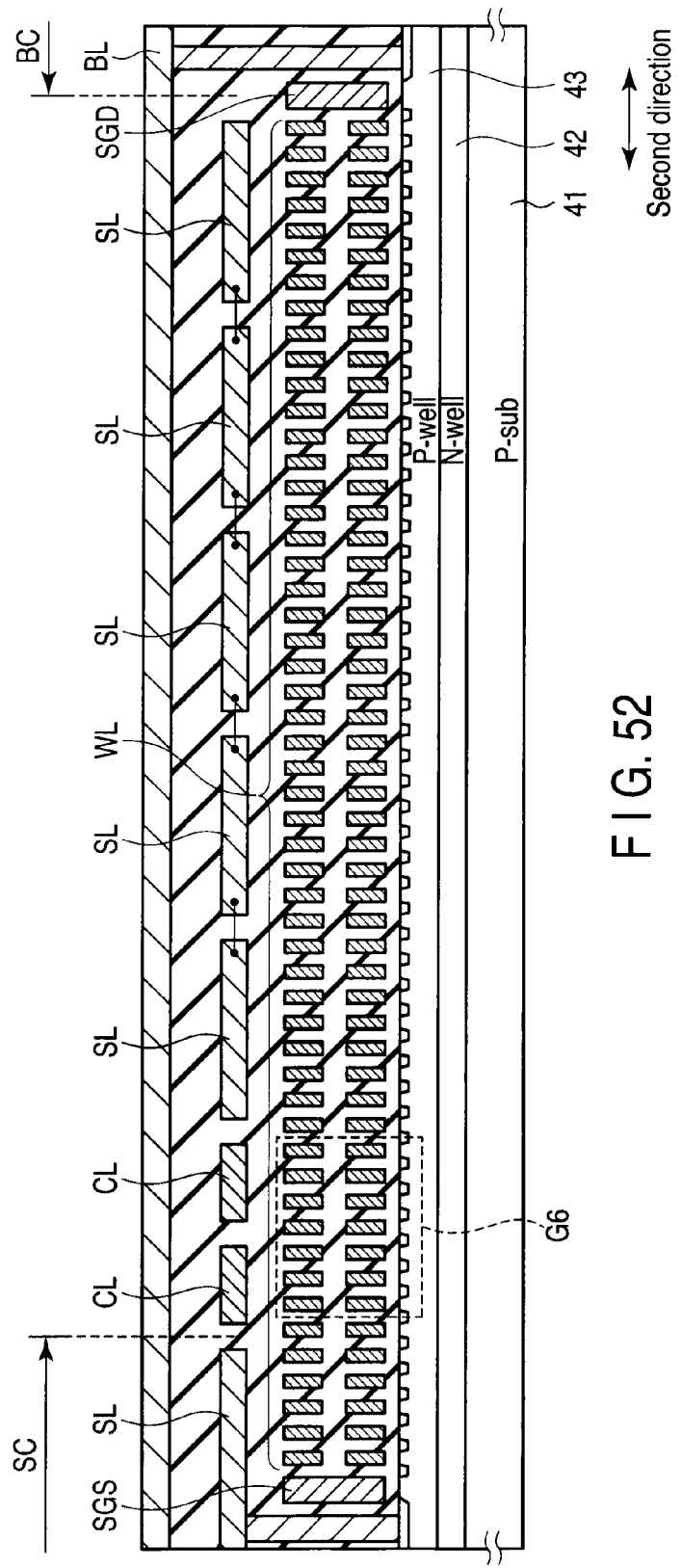
FIG. 52 illustrates a cross sectional view along with LII-LII line in FIG. 50.

FIG. 51 is a sectional view taken along a line LI-LI of FIG. 50, and FIG. 52 is a sectional view taken along a line LII-LII of FIG. 50.

The N-type well region 42 and the P-type well region 43 are formed in the P-type semiconductor substrate 41. The NAND string that comprises plural memory cells connected in series in the second direction is formed in the P-type well region 43. The source-side select transistor is disposed at one end of the NAND string, and the drain-side select transistor is disposed at the other end.

Each of the plural memory cells has the stacked gate structure of the floating gate and the control gate. The control gates of the plural memory cells are the plural word lines WL. The gate of the source-side select transistor is the source-side select gate line SGS. The gate of the drain-side select transistor is the drain-side select gate line SGD.

The source diffusion layer of the NAND string is connected to the source line SL, and the drain diffusion layer of the NAND string is connected to the bit line BL.

In the third example, the control signal line CL exists on a memory cell group G1 in the sectional view of FIG. 51 while existing on a memory cell group G6 in the sectional view of FIG. 52.

Accordingly, for example, during the erasing operation, the erroneous erasing of the unselected memory cell can be prevented when the potential at the floating gate of the unselected memory cell is boosted by the coupling of the P-type well region 43 and the source line SL (it is assumed that the P-type well region 43 and the source line SL are boosted to the high potential).

That is, only the specific word line (page) WL is not covered with the control signal line CL, but, for example, about 10% of the memory cell groups G1 and G6 of FIGS. 51 and 52 is covered with the control signal line CL. In other words, the control signal line CL is covered with the source line SL in the remaining about 90%, so that the potential at the floating gate of the unselected memory cell in the page can sufficiently be boosted during the erasing operation.

For example, the two control signal lines CL are disposed on the one NAND block according to the layouts of FIGS. 35 to 42.

(4) Advantage

As described above, in the layout of the control signal lines of the embodiment, only the specific word line (page) is not covered with the control signal line CL, so that the memory operation can be stabilized. However, a trade-off relationship holds between a degree (amplitude) of the meandering of the control signal line and the substantial width (resistance value) of the source line. Accordingly, as to the amplitude of the control signal line, the optimum value is selected from the viewpoints of the resistance value of the source line and the stabilization of the memory operation.

6. Conclusion

According to the embodiment, the increase in the number of row decoders can be suppressed even if the number of memory planes increases in one chip due to the increase in the memory capacity.

The embodiment can advantageously be applied to a file memory in which data is randomly recordable at high speed, a mobile terminal to which data is downloadable at high speed, a portable player to which data is downloadable at high speed, a semiconductor memory for broadcast equipment, a drive recorder, a home video device, a large-capacity buffer memory for communication, a semiconductor memory for a security camera, and the like.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A NAND type flash memory comprising:
a first memory plane with first and second NAND blocks;
a second memory plane with third and fourth NAND blocks;
a first transfer transistor with a control terminal, a first potential transfer terminal, and a second potential transfer terminal, and disposed between the first and second memory planes, the first potential transfer terminal being commonly connected to a first word line in the first NAND block and a second word line in the third NAND block;
a second transfer transistor with a control terminal, a first potential transfer terminal, and a second potential transfer terminal, and disposed at a first end on a side of the first memory plane that is opposite the second memory plane, the first potential transfer terminal being connected to a third word line in the second NAND block; and
a third transfer transistor with a control terminal, a first potential transfer terminal, and a second potential transfer terminal, and disposed at a second end on a side of the second memory plane that is opposite the first memory plane, the first potential transfer terminal being connected to a fourth word line in the fourth NAND block.

2. The memory according to claim 1, further comprising:
a first driver that is connected to the second potential transfer terminal of the first transfer transistor to control a time constant in transferring potentials to the first and second word lines;
a second driver that is connected to the second potential transfer terminal of the second transfer transistor to control a time constant in transferring a potential to the third word line; and
a third driver that is connected to the second potential transfer terminal of the third transfer transistor to control a time constant in transferring a potential to the fourth word line.

3. The memory according to claim 1, further comprising a first decode block that is disposed at one of the first and second ends to generate a control signal to be applied to the control terminal of the first transfer transistor.

4. The memory according to claim 3, further comprising:
a second decode block that is disposed at the first end to generate a control signal to be applied to the control terminal of the second transfer transistor; and
a third decode block that is disposed at the second end to generate a control signal to be applied to the control terminal of the third transfer transistor.

5. The memory according to claim 3, further comprising a second decode block that is disposed at the first end to generate a control signal to be applied to the control terminals of the second and third transfer transistors,
wherein the first decode block is disposed at the second end.

6. The memory according to claim 1, further comprising:
a first conductive line that extends in a direction in which the first and second word lines extend, one end of the first conductive line being connected to the first word line, the other end being connected to the second word line, the first conductive line being disposed in a layer different from a layer in which the first and second word lines are disposed;
a second conductive line that extends in the direction in which the first and second word lines extend, the second conductive line being connected to the first potential transfer terminal of the first transfer transistor and disposed in the identical layer in which the first conductive line is disposed; and
an auxiliary connection line that extends in a direction intersecting the direction in which the first and second word lines extend, the auxiliary connection line connecting the first and second conductive lines to each other and disposed in the identical layer in which the first and second word lines are disposed.

7. The memory according to claim 6, wherein the first and second conductive lines extend straight in the direction in which the first and second word lines extend.

8. The memory according to claim 6, wherein the first transfer transistor is one of a plurality of transfer transistors that are arrayed in the direction in which the first and second word lines extend between the first and second memory planes.

9. The memory according to claim 6, wherein a channel-length direction of the first transfer transistor is the direction intersecting the direction in which the first and second word lines extend.

10. The memory according to claim 3, wherein a control signal line that connects the control terminal of the first transfer transistor and the first decode block is laid out on one of the first, second, third, and fourth NAND blocks.

11. The memory according to claim 4, wherein each of the first, second, and third decode blocks comprises a level shifter.

12. The memory according to claim 10, wherein the control signal line extends in a meandering manner in a direction in which the first and second word lines extend.

13. The memory according to claim 12, wherein the control signal line extends in the direction in which the first and second word lines extend, and shifts in a direction intersecting the direction in which the first and second word lines extend in a shunt area.

14. The memory according to claim 12, wherein amplitude of the control signal line is smaller than a width in a direction intersecting a direction in which the first and second word lines of each of the first to fourth NAND blocks extend.

15. The memory according to claim 4, wherein each of a control signal line that connects the control terminal of the second transfer transistor and the second decode block and a control signal line that connects the control terminal of the third transfer transistor and the third decode block is laid out on one of the first, second, third, and fourth NAND blocks.

16. The memory according to claim 5, wherein a control signal line that connects the control terminals of the second and third transfer transistors and the second decode block is laid out on one of the first, second, third, and fourth NAND blocks.

17. The memory according to claim 12, further comprising a fourth transfer transistor comprising a control terminal, a first potential transfer terminal, and a second potential transfer terminal, and disposed between the first and second memory planes, the first potential transfer terminal being commonly connected to a first select gate line in the first NAND block and a second select gate line in the third NAND block,
wherein the first decode block produces a control signal to be applied to the control terminal of the fourth transfer transistor.

18. The memory according to claim 17, wherein a control signal line that connects the control terminal of the fourth transfer transistor and the first decode block is laid out on one of the first, second, third, and fourth NAND blocks.

19. The memory according to claim 18, wherein a pair of a control signal line that connects the control terminal of the fourth transfer transistor and the first decode block and a control signal line that connects the control terminal of the first transfer transistor and the first decode block extends in a meandering manner in the direction in which the first and second word lines extend.

20. A NAND type flash memory comprising:
a first memory plane with first and second NAND blocks;
a second memory plane with third and fourth NAND blocks, and disposed in parallel with the first memory plane;
a third memory plane with fifth and sixth NAND blocks, and disposed in parallel with the second memory plane;
a fourth memory plane with seventh and eighth NAND blocks, and disposed in parallel with the third memory plane;
a first transfer transistor with a control terminal, a first potential transfer terminal, and a second potential transfer terminal, and disposed between the first and second memory planes, the first potential transfer terminal being commonly connected to a first word line in the first NAND block and a second word line in the third NAND block;

a second transfer transistor with a control terminal, a first potential transfer terminal, and a second potential transfer terminal, and disposed between the second and third memory planes, the first potential transfer terminal being commonly connected to a third word line in the fourth NAND block and a fourth word line in the sixth NAND block;

a third transfer transistor with a control terminal, a first potential transfer terminal, and a second potential transfer terminal, and disposed between the third and fourth memory planes, the first potential transfer terminal being commonly connected to a fifth word line in the fifth NAND block and a sixth word line in the seventh NAND block;

a fourth transfer transistor with a control terminal, a first potential transfer terminal, and a second potential transfer terminal, and disposed at a first end on a side of the first memory plane that is opposite the second memory plane, the first potential transfer terminal being connected to a seventh word line in the second NAND block; and a fifth transfer transistor with a control terminal, a first potential transfer terminal, and a second potential transfer terminal, and disposed at a second end on a side of the fourth memory plane that is opposite the third memory plane, the first potential transfer terminal being connected to an eighth word line in the eighth NAND block.

21. A NAND type flash memory comprising:

a memory plane with first and second NAND blocks, the first NAND block with a first word line extending to a first direction, the second NAND block with a second word line extending to the first direction, and the first and second blocks being arrayed in a second direction intersecting the first direction;

a first transfer transistor with a control terminal, a first potential transfer terminal, and a second potential transfer terminal, disposed at a first end on a side of the memory plane in the first direction, and the first potential transfer terminal being connected to the first word line;

a second transfer transistor with a control terminal, a first potential transfer terminal, and a second potential transfer terminal, disposed at a second end on a side of the memory plane in the first direction, and the first potential transfer terminal being connected to the second word line;

a first decode block that is disposed at the first end to generate a control signal to be applied to the control terminal of the first transfer transistor; and a second decode block that is disposed at the first end to generate a control signal to be applied to the control terminal of the second transfer transistor.

22. The memory according to claim 21, wherein all decode blocks including the first and second decode blocks corresponding to the memory plane are disposed at the first end.

23. The memory according to claim 22, wherein a control signal line which is connected between the control terminal of the second transfer transistor and the second decode block is disposed on the memory plane.

24. The memory according to claim 23, wherein the control signal line is disposed on a plurality of memory planes including the memory plane which are arrayed in the first direction.

25. The memory according to claim 21, wherein each of the first and second decode blocks includes a level sifter.

* * * * *